(12) United States Patent
Sakayori et al.

(10) Patent No.: US 7,226,806 B2
(45) Date of Patent: Jun. 5, 2007

(54) WET ETCHED INSULATOR AND ELECTRONIC CIRCUIT COMPONENT

(75) Inventors: Katsuya Sakayori, Shinjuku-ku (JP);
Terutoshi Momose, Shinjuku-ku (JP);
Shigeki Kawano, Shinjuku-ku (JP);
Tomoko Togashi, Shinjuku-ku (JP);
Hiroko Amasaki, Shinjuku-ku (JP);
Nobuhiro Sakihama, Shinjuku-ku (JP);
Tsuyoshi Yamazaki, Shinjuku-ku (JP);
Michiaki Uchiyama, Shinjuku-ku (JP);
Hiroshi Yagi, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 395 days.

(21) Appl. No.: 10/074,224

(22) Filed: Feb. 14, 2002

(65) Prior Publication Data

US 2003/0085451 A1    May 8, 2003

(30) Foreign Application Priority Data

| Feb. 16, 2001 | (JP) | ............................. 2001-040891 |
| Feb. 16, 2001 | (JP) | ............................. 2001-040892 |
| Feb. 16, 2001 | (JP) | ............................. 2001-040893 |
| Mar. 29, 2001 | (JP) | ............................. 2001-097436 |
| Aug. 28, 2001 | (JP) | ............................. 2001-258815 |

(51) Int. Cl.
    *H01L 21/00*    (2006.01)

(52) U.S. Cl. ................................. 438/106; 257/E21.53
(58) Field of Classification Search ................. 438/106
    See application file for complete search history.

(56) References Cited

U.S. PATENT DOCUMENTS 6,596,184 B1 * 7/2003 Shum et al. ................... 216/13
6,709,988 B2 * 3/2004 Sakayori et al. ............ 438/745

FOREIGN PATENT DOCUMENTS

JP    2000-183523    *    6/2000

\* cited by examiner

*Primary Examiner*—W. David Coleman
(74) *Attorney, Agent, or Firm*—Oliff & Berridge, PLC

(57) ABSTRACT

The present invention relates to an insulator as an insulating layer in a laminate which can inhibit dusting at the time of use, more particularly an electronic circuit component to which the insulator has been applied, particularly a wireless suspension. The insulator comprises a laminate of one or more insulation unit layers etchable by a wet process, the insulator having been subjected to plasma treatment after wet etching. The insulator exists mainly as an insulating layer in a laminate having a layer construction of first inorganic material layer—insulating layer—second inorganic material layer or a layer construction of inorganic material layer—insulating layer, and at least a part of the inorganic material layer has been removed to expose the insulating layer.

45 Claims, 2 Drawing Sheets

US 7,226,806 B2

WET ETCHED INSULATOR AND ELECTRONIC CIRCUIT COMPONENT

TECHNICAL FIELD

The present invention relates to a laminate (a multilayered structure) comprising an inorganic material layer (mainly a metal layer) and an insulating layer, which laminate is suitable for etching the insulating layer, and further relates to an electronic circuit component, particularly a suspension for a hard disk drive, produced by etching the laminate.

BACKGROUND OF THE INVENTION

In recent years, rapid development of semiconductor technology has led to rapid progress of a reduction in size of semiconductor packages, the adoption of multipin, the adoption of fine pitch, minimization of electronic components and the like. That is, the semiconductor field has entered the so-called "age of high density packaging." Regarding printed wiring boards, this has also led to a change from single side wiring to double side wiring and, in addition, the adoption of a multilayer structure and a thickness reduction (Iwata and Harazono, "Denshi Zairyo (Electronic Material)," 35 (10), 53 (1996)).

Pattern formation methods used in the formation of such wiring and circuits include: a method which comprises etching a metal layer, provided on a substrate in a layer construction of metal layer—insulating layer—metal layer, with an acidic solution, such as a ferric chloride solution, to form wirings, then subjecting the insulating layer, for example, to dry etching such as plasma etching or laser etching, or wet etching such as etching with hydrazine, to remove the insulating layer to form a desired shape for layer-to-layer continuity purposes (Japanese Patent Laid-Open No. 164084/1994), and connecting the wirings to each other, for example, through plating or electrically conductive paste; and a method (Proceedings of the 7th Symposium of Japan Institute of Electronics Packaging, issued in 1999) which comprises providing an insulating layer in a desired form using a photosensitive polyimide (Japanese Patent Laid-Open No. 168441/1992) or the like and then plating gaps to form wiring.

A tendency toward downsizing of electric products in recent years has led to a reduction in thickness of each layer constituting metal layer-polymeric insulating layer, and these layers each are in many cases used in a thickness of not more than 100 μm. When wiring has been formed of such thin layer, a warpage disadvantageously takes place in wiring due to a difference in coefficient of thermal expansion between the metal layer and the polymeric insulating layer.

When the thermal properties of the insulating layer and the conductor layer are known, the warpage σ of this substrate can be calculated according to the following equation (Miyaaki and Miki, NITTO TECHNICAL REPORT, 35 (3), 1 (1997)).

$$\sigma = \frac{31 E_1 E_2}{2h(E_1^2 + 14 E_1 E_2^2 + E_2^2)} \Delta \alpha \Delta T$$

wherein
E1: modulus of the metal,
E2: modulus of the insulating layer,
Δα: difference in coefficient of thermal expansion between the metal and the insulating layer,
ΔT: temperature difference, and
h: layer thickness 1: wiring length.

According to this equation, the following two methods are considered effective for reducing the warpage of wiring:
1. a reduction in modulus of insulating layer; and
2. a reduction in the difference in coefficient of thermal expansion between the insulating layer and the metal wiring layer.

Regarding the wiring formation method, in the laminate used in the method for the formation of wiring through etching of a metal in the laminate having layer construction of first metal layer—insulating layer—second metal layer, in order to reduce the warpage of the laminate, a low-expansion polyimide is used as the insulating layer from the viewpoint of the necessity of rendering the coefficient of thermal expansion of the metal identical to the coefficient of thermal expansion of the insulating layer (U.S. Pat. No. 4,543,295 and Japanese Patent Laid-Open Nos. 18426/1980 and 25267/1977).

Since, however, the low-expansion polyimide is not generally thermoplastic, the adhesion to metal layers is poor making it difficult to provide adhesive strength high enough to withstand practical use. To overcome this problem, a thermoplastic polyimide resin or epoxy resin having good adhesion to the metal layer is used as an adhesive insulating layer between the metal layer and the insulating layer (core layer) of the low-expansion polyimide (Japanese Patent Laid-Open No. 58428/1995).

Since the thermoplastic resin generally has a high coefficient of thermal expansion, the lamination onto a metal is causative of the warpage. To overcome this drawback, the thickness of the low-expansion core insulating layer having a coefficient of thermal expansion close to that of the metal is made larger than the thickness of the adhesive layer to avoid the appearance of warpage of the whole laminate on the surface of the laminate. The smaller the thickness of the adhesive insulating layer, the better the warpage preventive effect. When the thickness of the adhesive insulating layer is excessively small, however, the adhesion is deteriorated. At least when the total thickness of the adhesive layers respectively overlying and underlying the core layer is not more than the half of the thickness of the core layer, the warpage is less likely to occur. For this reason, for commercially available laminates fabricated for electronic circuit components, in many cases, the total thickness of adhesive insulating layers is not more than the half of the thickness of the core insulating layer. The formation of the adhesive insulating layer in a smallest possible thickness, which can ensure the adhesion, is regarded as ideal (Japanese Patent Laid-Open No. 245587/1989).

At the present time, rapid expansion of production of personal computers has lead to increased production of hard disk drives incorporated in the personal computers. A component, in the hard disk drive, called a "suspension," which supports a head for reading magnetism, is being shifted in its main products from one, wherein copper wiring is connected to a stainless steel plate spring, to one called a "wireless suspension" comprising copper wiring which has been connected directly to a stainless steel plate spring, from the viewpoint of coping with the size reduction.

The wireless suspension is mainly prepared using a laminate having a layer construction of first metal layer—adhesive insulating layer—core insulating layer—adhesive insulating layer—second metal layer. An example of the laminate is such that the first metal layer is formed of a copper alloy foil, the second metal layer is formed of a stainless steel foil, and the insulating layer is comprised of a core insulating layer and an adhesive insulating layer provided on both sides of the core insulating layer. A wireless suspension using the laminate is scanned on a disk being rotated at a high speed and thus is a member to which fine vibration is applied. Therefore, the adhesive strength of wiring is very important. Accordingly, the wireless suspension using the laminate should satisfy strict specifications.

Hard disk drives are devices for recording information thereon. Therefore, a high level of data read/write reliability is required. To meet this requirement, dust and outgas produced from the wireless suspension should be minimized.

A component called the "wireless suspension" is produced mainly by two methods, an additive method wherein wiring is formed by plating, and a subtractive method wherein wiring is formed by etching a copper foil. In the case of the subtractive method, plasma etching by dry process is solely used for patterning of polyimide as the insulating layer.

In the laminate such as the three-layer material used in electronic components, in general, in order to render the coefficient of thermal expansion of the conductive inorganic material layer and the coefficient of thermal expansion of the insulating layer identical to each other for preventing the warpage of the substrate, a low-expansion insulating layer, particularly a low-expansion polyimide, is in many cases included. In the laminate in which only a low-expansion polyimide is used in the insulating layer, polyimide films, for example, KAPTON (tradename; manufactured by Du Pont-Toray Co., Ltd.), Upilex (tradeneme; manufactured by Ube Industries, Ltd.), and APIKAL (tradename; manufactured by Kanegafuchi Chemical Ind. Co., Ltd.), are used as the low-expansion polyimide. A metal layer (mainly copper) is formed, for example, by sputtering or electroless plating on the surface of the low-expansion polyimide film, and, thereafter, the thickness of the conductor layer is increased by electroplating (hereinafter referred to as "type-I laminate"). Another type of laminate is such that an insulator having a three-layer structure, wherein a layer of an adhesive (for example, an epoxy adhesive) other than polyimide is formed on both sides of a low-expansion polyimide, that is, having a layer construction of adhesive other than polyimide—low-expansion polyimide—adhesive other than polyimide, is provided and a conductor foil is adhered to the insulating layer by thermocompression bonding (hereinafter referred to as "type-II laminate"). A further type of laminate is such that an insulator having a three-layer structure, wherein an adhesive polyimide layer is formed on both sides of a low-expansion polyimide, that is, having a layer construction of adhesive polyimide—low-expansion polyimide—adhesive polyimide, is provided and a conductor foil is adhered to the insulating layer by thermocompression bonding (hereinafter referred to as "type-III laminate").

In the type-I laminate, since the insulating layer is formed of a polyimide having a single composition, the warpage is less likely to occur. Further, a thin metal layer can be formed. Therefore, this is advantageous for the formation of fine wiring. On the other hand, in the type-II laminate and the type-III laminate, since the conductor layer is formed by thermocompression bonding, the conductive layer can be selected from various types. For example, the preparation of a laminate using a rolled copper foil, a stainless steel foil or the like is possible. The type—II laminate advantageously has good adhesion. For the type-III laminate, since the adhesive layer is formed of highly heat-resistant polyimide, the heat resistance is advantageously good. Further, both the type-II and type-III laminates have an additional advantage that the thickness of the metal layer can be increased.

Since spring properties are required of the wireless suspension, a stainless steel foil is in many cases used as the metal layer. An example of the laminate structure is copper foil—adhesive polyimide-low-expansion polyimide—adhesive polyimide—stainless steel. In the conventional wireless suspension, since the etching area of the insulating layer is large, rather than laser beam etching, plasma etching, which belongs to the same category of process, i.e., dry process, is mainly used for patterning of the insulating layer. In the plasma etching, however, the etching rate is low, and, thus, the time necessary for etching is long. Further, since sheet-by-sheet production is adopted, the productivity is low. Moreover, the apparatus for plasma etching is so expensive that the production cost is disadvantageously very high.

For the above reason, patterning of the insulating layer by a wet process, which is high in etching rate and thus is high in productivity and can realize low apparatus cost, has been desired in the art.

Also in electronic components, such as flexible printed boards or multilayer substrate, wherein a hole is formed by laser beams for providing continuity between layers in the multilayer substrate followed by pattern drawing in a mold into a desired form, when the wet etching technique is used, the step of hole formation and the step of pattern drawing can be simultaneously carried out. In addition, a fine shape, which cannot be formed in the mold, can be formed by wet etching. Therefore, patterning of the insulating layer by the wet process has also been desired in each field of electronic components.

For the type-II laminate, the use of an epoxy adhesive poses a problem that the solvent resistant is so high that wet etching cannot be carried out at all.

For the type-III laminate, due to a significant difference in etching properties between the adhesive polyimide layer and the low-expansion polyimide layer, the sectional form after etching is not sharp, and this makes it substantially defficult to prepare electronic components by wet etching.

For the type-I laminate, in some cases, wet etching is adopted. Since, however, the conductive inorganic material layer is formed by sputtering or the like, a metal is collided at a high speed against the surface of the polyimide. As a result, the metal bites into the surface layer, as well as into the inside of the polyimide layer. This somewhat denatures the polyimide in the surface layer. The adhesion between the insulating layer and the conductive inorganic material layer in the type-I laminate relies mainly upon a chemical bond or chemical interaction between the conductive inorganic material layer and the insulating layer. Therefore, the affinity of the conductive inorganic material layer for the insulating layer is high. This poses a problem that, when the type-I laminate is wet etched, the insulating layer in its denatured portion located at the interface of the conductive inorganic material layer and the insulating layer remains unetched, resulting in pattern detects.

On the other hand, in the laminate prepared by integrating the conductive inorganic material layer with the insulating layer by pressing, as compared with the chemical bond or chemical interaction, the anchor effect attained by concaves and convexes on the surface of the conductive inorganic material layer more greatly contributes to the adhesive strength. Therefore, an unfavorable phenomenon, wherein a portion to be etched remains unetched, is less likely to occur. As described above, in the production of the laminate by pressing, since the degree of freedom in the selection of the conductive inorganic material layer is large, products, which could not have been produced in the case of the formation of the conductive inorganic material layer by sputtering, can also be produced.

Polyimides generally have poor solubility in solvents. Since, however, they are decomposed by a hydrazine or alkali solution, various studies have hitherto been made on wet etching of polyimide films with a chemical liquid. For example, Japanese Patent Laid-Open No. 4577/1975 discloses a production process of a wiring structure using hydrazine and ammonia. Japanese Patent Laid-Open No. 103531/1983 discloses a method for etching a polyimide film with an inorganic basic aqueous solution. Japanese Patent Laid-Open No. 65727/1982 discloses a method for etching a polyimide with an aliphatic diamine. Other methods for wet etching a polyimide disclosed up to now are such that a chemical liquid prepared by mixing water or an organic polar solvent with hydrazine/inorganic alkali/organic alkali/aliphatic amine (diamine)/aliphatic alcohol as a solvent is used (for example, Japanese Patent Laid-Open Nos. 74041/1983, 96632/1983, 101228/1991, 190610/1993, 202206/1993, and 157560/1995).

Hydrazine as a component for decomposing the polyimide, however, is highly toxic and thus is unsuitable for use in production process. For this reason, in proposals in recent years, in many cases, an etching solution comprising an inorganic basic aqueous solution and various additives added thereto is used.

Conventional methods for etching a polyimide film by wet etching to form a pattern include: a method wherein a metal is used in a pattern mask (Japanese Patent Laid-Open No. 283486/1993); a method wherein a solvent development-solvent separation-type negative-working liquid resist is used (Japanese Patent Laid-Open No. 301981/1993); and a method wherein a solvent development-solvent separation-type positive-working liquid resist is used (Japanese Patent Laid-Open Nos. 27464/1976, 49068/1978, 49068/1978, 65727/1982, and 74041/1983). These conventional methods for wet etching a polyimide film to form a pattern is effective in shorting the time necessary for patterning of the insulating layer.

The laminate using a polyimide as an insulating layer is in many cases thin and thus has low rigidity. Therefore, this laminate is disadvantageously inferior in handleability to conventional rigid glass epoxy substrates or the like. This is a serious limitation on process design.

DISCLOSURE OF THE INVENTION

First Invention

As described above, the low-expansion insulating layer (core insulating layer) and the adhesive insulating layer used in adhesion to a metal layer in electronic circuit components, which should satisfy strict specifications, are formed of an polyimide resin from the viewpoint of the necessity of ensuring a high level of insulation reliability. In order to impart adhesive properties to the polyimide resin, it is common practice to impart thermoplasticity to the polyimide resin. The introduction of a flexible structure, which can impart thermoplasticity, into the polyimide skeleton, however, in many cases increases the chemical resistance of the polyimide. Therefore, the polyimide resin, to which adhesive properties have been imparted, is likely to be poor in suitability for etching in wet process and is difficult to be etched by the wet process as compared with the core insulating layer. For this reason, the insulating layers are simultaneously etched by dry process using plasma or laser.

In dry process, in general, sheet-by-sheet treatment is carried out. Therefore, the productivity is poor, and the apparatus is expensive. This disadvantageously leads to very high production cost. On the other hand, in the wet process, since a continuous object can be continuously etched, advantageously, the productivity is high and the apparatus cost is low. In wireless suspensions, however, the core insulating layer can be easily etched, while the adhesive insulating layer is difficult to be etched. Therefore, the adhesive insulating layer is left in a projected form, and this poses problems including that a desired sharp etching shape cannot be provided, uneven etching occurs, and dust occurs during the use of the wireless suspension. For this reason, in the laminate for wireless suspensions which should satisfy strict specifications, the wet process cannot be put to practical use.

Accordingly, it is an object of the first invention to provide an insulator which, when the insulator exists as an insulating layer in a laminate having a layer construction of first inorganic material layer—insulating layer—second inorganic material layer or a layer construction of inorganic material layer—insulating layer, does not pose the above-described problem upon wet etching, can suppress dusting during the use of the laminate, and more particularly to provide an electronic circuit component to which the insulator has been applied, particularly a wireless suspension.

The present inventors have found that an insulator, which exists as an insulating layer in a laminate having a layer construction of first inorganic material layer—insulating layer—second inorganic material layer or a layer construction of inorganic material layer—insulating layer, can suppress dusting when, after wet etching, the wet etched end face of the insulator is subjected to plasma treatment to strengthen the end face.

Thus, according to the present invention, there is provided an insulator comprising a laminate of one or more insulation unit layers etchable by a wet process, the insulator having been subjected to plasma treatment after wet etching.

The insulator according to the present invention exists mainly as an insulating layer in a laminate having a layer construction of first inorganic material layer—insulating layer—second inorganic material layer or a layer construction of inorganic material layer—insulating layer, and at least a part of the inorganic material layer has been removed to expose the insulating layer.

The insulator according to the present invention can be usefully applied as an insulating layer in an electronic circuit component, particularly in a suspension for a hard disk drive.

In the present invention, the expression "insulator etchable by a wet process" means an insulator which can provide a good etching shape upon wet etching. For example, in an insulator which is a laminate of two or more insulation unit layers, the etching rate ratio between the layers at the time of the wet etching is in the range of 6:1 to 1:1, preferably in the range of 4:1 to 1:1. The selection of the insulating unit layers which satisfy this etching rate ratio range requirement can realize a good etching shape in the insulating layer. Therefore, in the case of a laminate for a wireless suspension which should satisfy strict specifications, wet etching can be carried out with high accuracy, and wet etching, which can realize etching in a shorter time and can realize higher productivity as compared with the dry etching, can be applied.

The mechanism, through which dusting of the insulator subjected to plasma treatment according to the present invention can be suppressed, is considered as follows. Wet etching of the insulating layer will be described by taking etching of a polyimide resin with an alkali solution as an example. In the wet process, an imide bond or other easily hydrolyzable bond (for example, ester bond) in the insulator is hydrolyzed by hydroxide ions. When the insulator is formed of a polyimide resin, the polyimide is hydrolyzed to reduce the molecular weight, or to form an amic acid to increase the solubility, whereby the hydrolyzation product is eluted into the etching liquid.

On the other hand, there is a high possibility that, after patterning by the wet process, a long molecular chain portion, which has not been eluted into the etching liquid and has been partially decomposed to an amic acid, or a reduced molecular weight product, which is not eluted into the etching liquid, is left on the end face of the pattern. These sites cleaved by the hydrolysis have low activity and are less likely to react with other atoms. Therefore, it is considered that, as compared with sites not exposed to the etching solution, the end face of the pattern has lower molecular weight and lower strength. This is considered causative of dusting.

Upon plasma treatment, the etched end face, which has been embrittled as a result of the wet etching, is strengthened. The reason for this is considered as follows. The atoms which have been cleaved by the hydrolysis are rendered highly active, and these atoms, together with neighboring atoms, form a bond to strengthen the etched end face.

It is considered that, by virtue of the above mechanism, the insulator, which has been subjected to plasma treatment, according to the present invention is less likely to cause partial dropouts or separation and this offers the effect of suppressing dusting.

In the present invention, plasma treatment activates the surface of the insulator in a dry state and thus is advantageously suitable for large scale treatment. In this connection, it should be noted that, for example, laser beam treatment, which can perform activation in a dry process, is mere treatment for points and is unsuitable for large scale treatment.

Second Invention

Accordingly, it is an object of the second invention to provide an insulator which, when the insulator exists as an insulating layer in a laminate having a layer construction of first inorganic material layer—insulating layer—second inorganic material layer or a layer construction of inorganic material layer—insulating layer, does not pose the above-described problem upon wet etching, can suppress dusting during the use of the laminate, and more particularly to provide an electronic circuit component to which the insulator has been applied, particularly a wireless suspension.

The present inventors have found that an insulator, which exists as an insulating layer in a laminate having a layer construction of first inorganic material layer—insulating layer—second inorganic material layer or a layer construction of inorganic material layer—insulating layer, can suppress dusting when, even after wet etching, the wet etched end face of the insulator is heat treated to strengthen the end face.

Thus, according to the present invention, there is provided an insulator comprising a laminate of one or more insulation unit layers etchable by a wet process, the insulator having been heat treated after wet etching.

The insulator according to the present invention exists mainly as an insulating layer in a laminate having a layer construction of first inorganic material layer—insulating layer—second inorganic material layer or a layer construction of inorganic material layer—insulating layer, and at least a part of the inorganic material layer has been removed to expose the insulating layer.

The insulator according to the present invention can be usefully applied as an insulating layer in an electronic circuit component, particularly in a suspension for a hard disk drive.

In the present invention, the expression "insulator etchable by a wet process" means an insulator which can provide a good etching shape upon wet etching. For example, in an insulator which is a laminate of two or more insulation unit layers, the etching rate ratio between the layers at the time of the wet etching is in the range of 6:1 to 1:1, preferably in the range of 4:1 to 1:1. The selection of each of the insulation unit layers which satisfy this etching rate ratio range requirement can realize a good etching shape in the insulating layer. Therefore, in the case of a laminate for a wireless suspension which should satisfy strict specifications, wet etching can be carried out with high accuracy, and wet etching, which can realize etching in a shorter time and can realize higher productivity as compared with the dry etching, can be applied.

The mechanism, through which dusting of the heat treated insulator according to the present invention can be suppressed, is considered as follows. Wet etching of the insulating layer will be described by taking etching of a polyimide resin with an alkali solution as an example. In the wet process, an imide bond or other easily hydrolyzable bond (for example, ester bond) in the insulator is hydrolyzed by hydroxide ions. When the insulator is formed of a polyimide resin, the polyimide is hydrolyzed to reduce the molecular weight, or to form an amic acid to increase the solubility, whereby the hydrolyzation product is eluted into the etching liquid.

On the other hand, there is a high possibility that, after patterning by the wet process, a long molecular chain portion, which has not been eluted into the etching liquid and has been partially decomposed to an amic acid, or a reduced molecular weight product, which is not eluted into the etching liquid, is left on the end face of the pattern. These sites cleaved by the hydrolysis have low activity and are less likely to react with other atoms. Therefore, it is considered that, as compared with sites not exposed to the etching liquid, the end face of the pattern has lower molecular weight and lower strength. This is considered causative of dusting.

Upon heat treatment, the etched end face, which has been embrittled as a result of the wet etching, is strengthened. The reason for this is considered as follows. Amino groups and dicarboxyl groups in molecular chain in the low-molecular weight compound and amic acid, which have been produced as a result of cleavage by the hydrolysis, are relatively easily thermally reacted, and, upon heating, these groups are reacted to bond molecular chains to each other and thus to strengthen the etched end face.

By virtue of the above mechanism, the insulator, which has been heat treated, according to the present invention is less likely to cause partial dropouts or separation and this offers the effect of suppressing dusting.

In the present invention, heat treatment activates the surface of the insulator in a dry state and thus is advantageously suitable for large scale treatment.

Third Invention

It is an object of the third invention to provide an insulator which, when the insulator exists as an insulating layer in a laminate having a layer construction of first inorganic material layer—insulating layer—second inorganic material layer or a layer construction of inorganic material layer—insulating layer, does not pose the above-described problem upon wet etching, can suppress dusting during the use of the laminate, and more particularly to provide an electronic circuit component to which the insulator has been applied, particularly a wireless suspension.

The present inventors have found that an insulator, which exists as an insulating layer in a laminate having a layer construction of first inorganic material layer—insulating layer—second inorganic material layer or a layer construction of inorganic material layer—insulating layer, can suppress dusting when, after wet etching, the wet etched end face of the insulator is treated with a dehydration catalyst to strengthen the end face.

Thus, according to the present invention, there is provided an insulator comprising a laminate of one or more insulation unit layers etchable by a wet process, the insulator having been treated with a dehydration catalyst after wet etching.

The insulator according to the present invention exists mainly as an insulating layer in a laminate having a layer construction of first inorganic material layer—insulating layer—second inorganic material layer or a layer construction of inorganic material layer—insulating layer, and at least a part of the inorganic material layer has been removed to expose the insulating layer.

The insulator according to the present invention can be usefully applied as an insulating layer in an electronic circuit component, particularly in a suspension for a hard disk drive.

In the present invention, the expression "insulator etchable by a wet process" means an insulator which can provide a good etching shape upon wet etching. For example, in the case where the insulating layer is an insulator which is a laminate of two or more insulation unit layers, the etching rate ratio between the layers at the time of the wet etching is in the range of 6:1 to 1:1, preferably in the range of 4:1 to 1:1. The selection of each of the insulation unit layers which satisfy this etching rate ratio range requirement can realize a good etching shape in the insulating layer. Therefore, in the case of a laminate for a wireless suspension which should satisfy strict specifications, wet etching can be carried out with high accuracy, and wet etching, which can realize etching in a shorter time and can realize higher productivity as compared with the dry etching, can be applied.

The mechanism, through which dusting of the insulator, which has been treated with a dehydration catalyst, according to the present invention can be suppressed, is considered as follows. Wet etching of the insulating layer will be described by taking etching of a polyimide resin with an alkali solution as an example. In the wet process, an imide bond or other easily hydrolyzable bond (for example, ester bond) in the insulator is hydrolyzed by hydroxide ions. When the insulator is formed of a polyimide resin, the polyimide is hydrolyzed to reduce the molecular weight, or to form an amic acid to increase the solubility, whereby the hydrolyzation product is eluted into the etching liquid.

On the other hand, there is a high possibility that, after patterning by the wet process, a long molecular chain portion, which has not been eluted into the etching liquid and has been partially decomposed to an amic acid, or a reduced molecular weight product, which is not eluted into the etching liquid, is left on the end face of the pattern. These sites cleaved by the hydrolysis have low activity and are less likely to react with other atoms. Therefore, it is considered that, as compared with sites not exposed to the etching liquid, the end face of the pattern has lower molecular weight and lower strength. This is considered causative of dusting.

Upon treatment with a dehydration catalyst, the etched end face, which has been embrittled as a result of the wet etching, is strengthened. The reason for this is considered as follows. Amino groups and dicarboxyl groups in molecular chain in the low-molecular weight compound and amic acid, which have been produced as a result of cleavage by the hydrolysis, are relatively easily reacted through the action of a dehydration catalyst, and, upon treatment with the dehydration catalyst, these groups are reacted to bond molecular chains to each other and thus to strengthen the etched end face.

By virtue of the above mechanism, the insulator, which has been treated with a dehydration catalyst, according to the present invention is less likely to cause partial dropouts or separation and this offers the effect of suppressing dusting.

In the present invention, the treatment with the dehydration catalyst does not require any special apparatus. Therefore, the apparatus cost is low, and, in addition, the treatment with the dehydration catalyst is advantageously suitable for large scale treatment.

Fourth Invention

In the above method wherein the polyimide is etched using the metal layer as a pattern mask, after the metal layer is etched to form a final pattern shape of the insulating layer followed by etching of the insulating layer using the etched metal layer as a pattern mask, the metal layer should be further re-patterned by etching into a desired wiring shape. That is, in this method, the metal should be etched twice in total, and, in addition, the etching liquid comes into contact with the metal at the time of etching of the polyimide. This is causative of a deterioration in the metal layer.

Further, when a resist pattern is prepared using a solvent development-separation-type liquid resist, an organic solvent is necessary for the developing solution and the separating solution. Therefore, a load on the environment is large, and expenses for wastewater treatment are necessary. Moreover, when the solvent development-separation-type liquid resist is used, it is difficult to stably form a coating having even thickness for the following reason. Specifically, in the production of electronic components such as suspensions for hard disk drives, a liquid resist is coated onto a substrate having low rigidity, and the coating is dried. In this case, it is difficult to form a coating having even thickness. Patterning with high accuracy is required of electronic components such as suspensions for hard disk drives. In this case, when a resist film is formed by coating, very close control in the step of coating/drying is necessary for forming a coating having even thickness with high accuracy.

Basically, it is confirmed that, in the case of a basic aqueous solution developable-basic aqueous solution separable resist, when a polyimide etching liquid containing an inorganic basic aqueous solution is used, the resist is disadvantageously separated from the laminate as a substrate by the action of an alkali component in the etching liquid. For this reason, it was thought that the realization of the production of electronic components by etching of the laminate was difficult.

In techniques for wet etching of polyimides which are currently known in the art, a laminate comprising an insulating layer having one polyimide layer is mainly used. There are a few reports on examples of wet etching of a laminate of a plurality of polyimide layers (Japanese Patent Laid-Open No. 164084/1994). The reason for this is that, since the plurality of polyimide layers put on top of each other are different from each other in etching properties, a good sectional form cannot be disadvantageously provided by wet etching.

In the suspension for a hard disk drive, stainless steel as the spring material is an essential element. Therefore, the suspension is produced using a laminate produced by sandwiching a low-expansion polyimide film having on its both sides an adhesive resin layer between a conductor foil and a stainless steel foil and pressing the assembly, or a laminate produced by putting a plurality of polyimide layers on top of a stainless steel foil and further forming a conductor layer thereon by thermocompression bonding. Therefore, the production of the suspension faces the above various problems, and, for this reason, the preparation of a suspension by patterning of the polyimide layer by wet etching could not have been realized.

Accordingly, it is an object of the fourth invention to provide a process for producing an electronic component by wet etching of an insulating layer in a laminate of conductive inorganic material layer—insulating layer—conductive inorganic material layer or a laminate of conductive inorganic material layer—insulating layer, which process is low in cost, can eliminate the need to use an organic solvent, which poses a problem of waste treatment, and, at the same time, can solve the above problems of the prior art.

It is a subordinate object of the present invention to provide a production process of an electronic component which can realize single etching of the conductive inorganic material layer to prevent a deterioration in the conductive inorganic material layer, can eliminate the need to use any organic solvent, which imposes a large burden on the environment, as a chemical for the development and separation of the resist, and enables the application of wet etching using a resist to an insulating layer having a single layer structure or a laminate structure of two or more insulation unit layers.

It is another subordinate object of the present invention to provide a production process of an electronic component that can provide a laminate which provides a good sectional form after wet etching with good etching accuracy, and to provide an electronic component and a suspension for a hard disk drive produced by said production process.

It is still another subordinate object of the present invention to enable wet etching of the laminate in the step of treatment using a dry film resist, that is, the step of development with an aqueous solution, particularly a basic aqueous solution and separation with a basic aqueous solution.

It is a further subordinate object of the present invention to realize wet etching of the laminate in the step of treatment using a dry film resist, that is, the step of development with a basic aqueous solution and separation with a basic aqueous solution, also in a sheet-by-sheet manner.

Fifth Invention

In the above method wherein the polyimide is etched using the metal layer as a pattern mask, after the metal layer is etched to form a final pattern shape of the insulating layer followed by etching of the insulating layer using the etched metal layer as a pattern mask, the metal layer should be further re-patterned by etching into a desired wiring shape. That is, in this method, the metal should be etched twice in total, and, in addition, the etching liquid comes into contact with the metal at the time of etching of the polyimide. This is causative of a deterioration in the metal layer.

Further, when a resist pattern is prepared using a solvent development-separation-type liquid resist, an organic solvent is necessary for the developing solution and the separating solution. Therefore, a load on the environment is large, and expenses for wastewater treatment are necessary. Moreover, when the solvent development-separation-type liquid resist is used, it is difficult to stably form a coating having even thickness for the following reason. Specifically, in the production of electronic components such as suspensions for hard disk drives, a liquid resist is coated onto a substrate having no rigidity, and the coating is dried. In this case, it is difficult to form a coating having even thickness. Patterning with high accuracy is required of electronic components such as suspensions for hard disk drives. In this case, when a resist film is formed by coating, very close control in the step of coating/drying is necessary for forming a coating having even thickness with high accuracy. In particular, when the coating has surface irregularities, the surface of the resist coated film is less likely to become flat, making it impossible to perform patterning with high accuracy.

Under these circumstances, the realization of wet etching of the insulating layer using a resist, which is developable and separable with an aqueous alkali solution, has been desired for production reasons.

Basically, it is confirmed that, in the case of a an alkali developable-alkali separable resist, when a polyimide etching liquid containing an inorganic alkali is used, the resist is disadvantageously separated from the laminate as a substrate by the action of an alkali component in the etching liquid. For this reason, it has hitherto been thought that the realization of the production of electronic components by etching of the laminate was difficult.

Wet etching of a polyimide with a basic (alkali) chemical solution using a dry film resist is considered very advantageous for the production of electronic components. Up to now, however, any dry film resist applicable to wet etching of the polyimide layer as an insulating layer with a basic (alkali) chemical solution has not been known in the art. Further, since the conventional laminate has a problem that a lot of time is required for wet etching or a good etching shape cannot be provided, the selection and application of a dry film resist capable of solving these problems are difficult. Further, detailed studies have hitherto not been made due to the nonsense of the application of the dry film resist.

Accordingly, it is an object of the fifth invention to provide a process for producing an electronic component using a dry film resist which is suitable for the production of an electronic component by wet etching of a laminate of conductive inorganic material layer—insulating layer—conductive inorganic material layer or a laminate of conductive inorganic material layer—insulating layer and, in addition, can solve the above problems of the prior art, and to provide an electronic component per se and a suspension for a hard disk drive produced by said production process.

It is a subordinate object of the present invention to provide a production process of an electronic component using a dry film resist which can realize wet etching of the laminate in the step of alkali development and alkali separation, and to provide an electronic component per se and a suspension for a hard disk drive produced by said production process.

It is another subordinate object of the present invention to provide a production process of an electronic component using a dry film resist which can realize single etching of the conductive inorganic material layer to prevent a deterioration in the conductive inorganic material layer, can eliminate the need to use any organic solvent, which imposes a large burden on the environment, as a chemical liquid for the development and separation of the resist, and enables the application of wet etching to an insulating layer having a single layer structure or a laminate structure of two or more insulation unit layers, and to provide an electronic component per se and a suspension for a hard disk drive produced by said production process.

It is still another subordinate object of the present invention to provide a production process of an electronic component that can provide a laminate which provides a good sectional form after wet etching with good etching accuracy, and to provide an electronic component per se and a suspension for a hard disk drive produced by said production process.

According to the present invention, the above problems of the prior art can be solved by a process for producing an electronic component using a dry film resist, comprising the steps of: laminating a dry film onto a laminate of conductive inorganic material layer—insulating layer—conductive inorganic material layer or a laminate of conductive inorganic material layer—insulating layer; and performing wet etching, wherein the insulating layer in the laminate is wet etchable to form a pattern, the insulating layer has a single-layer or a multilayer structure, the thickness of the dry film applied is not less than 1.1 times that of one conductive inorganic material layer in the laminate, and, when the object to be etched is dipped in an etching liquid kept at 70° C., the retention time of the dry film resist pattern is not less than one min.

According to a preferred embodiment of the present invention, the dry film resist is developable with an aqueous alkali solution and is separable with an aqueous alkali solution. The development with an aqueous alkali solution and the separation with an aqueous alkali solution are advantageous in that the problem of the treatment of the used organic solvent can be avoided.

The present inventors have investigated the resistance of various dry film resists to various etching liquids. As a result, they have found that, for alkali development-alkali separation-type dry film resists, when etching conditions and dry film resists are optimized as follows, some materials for dry film resists are resistant to etching liquids. Further, it was found that, likewise, lactic acid development-lactic acid separation type dry film resists, which are dry film resists other than the alkali development-alkali separation-type dry film resists, are resistant to etching liquids.

Specifically, in order to impart the wet etching resistance of the dry film to the laminate, preferably, a method is adopted wherein a dry film resist is laminated onto the laminate, with the conductive inorganic material layer being patterned, by a vacuum press under reduced pressure and the laminate of the dry film resist thus obtained is then wet etched. Flat pressing of the dry film resist against the laminate under reduced pressure can solve the problem of warpage after the lamination.

In general, the warpage after the lamination of the dry film resist onto the laminate occurs as follows. In general, a laminate used in the production of electronic components, that is, a laminate of conductive inorganic material layer—insulating layer—conductive inorganic material layer or a laminate of conductive inorganic material layer, is prepared under reduced pressure by thermocompression bonding from the viewpoint of pursuing a high level of flatness. Therefore, the laminate is not in the form of a continuous product in a roll form but in a sheet form.

In forming a pattern of the insulating layer in the laminate, the lamination of a dry film resist onto the substrate, after the patterning of the metal, by means of a roll laminator causes the warpage of the laminate because the laminate per se is thin and has poor rigidity. The warpage of the laminate poses a problem that the misalignment with the mask at the time of exposure to the resist is significant.

The wet etching of the insulating layer is characterized in that the dimensional accuracy of the patterning is higher than that in plasma etching which is an existing dry process. Therefore, in order to exactly reproduce the insulating layer pattern of the laminate, the misalignment is a severe problem, and solving this problem is very important for establishing the wet etching process.

In the present invention, the problem of the warpage after the lamination is solved by flat pressing the dry film resist under reduced pressure. When a conventional dry film resist is used, in the case of flat pressure, wiring of the conductive inorganic material layer is provided on the insulting layer. Therefore, wiring of the conductive inorganic material layer in the form of concaves and convexes, and air bubbles are disadvantageously included into portions between the edges of the concaves or convexes and the dry film resist.

In this case, in order to reduce the inclusion of air bubbles, the formation of fine concaves and convexes on at least one surface of the dry film resist is preferred.

The fine concaves and convexes can be formed by embossing. The formation of the air bubbles can be suppressed by laminating the dry film resist having concaves and convexes on its surface in such a manner that the concaves and convexes face the concave/convex side (that is, wiring side) of the conductive inorganic material layer. That is, the concaves and convexes form a place for escape of air bubbles to prevent the inclusion of air bubbles.

Further, in order to impart the above etching resistance to the laminate, a method is preferably adopted wherein, after the laminate of the dry film resist is exposed and developed to form a pattern, treatment selected from ultraviolet light irradiation, heat treatment, and a combination of ultraviolet light irradiation with heat treatment is carried out to improve the resistance of the dry film resist to the etchant for the insulating layer. For products which are not required to have high alignment accuracy, lamination by a conventional lamination method under the atmospheric pressure poses no problem.

Further, in order to impart the etching resistance to the laminate, the thickness of the dry film resist is preferably 1.1 to 5 times that of one conductive inorganic material layer in the laminate as the starting material and is preferably equal to or larger than the thickness of the insulating layer to be wet etched. In this case, the thickness of the inorganic material layer is the largest thickness in the thicknesses of the inorganic material layer provided in the insulating layer at the time of etching of the insulating layer.

Furthermore, in order to impart the etching resistance to the laminate, the temperature of the insulating layer at the time of wet etching is preferably not less than 10° C. and not more than 120° C.

Furthermore, in order to impart the etching resistance to the laminate, the pH value of the etching liquid used in wet etching is preferably larger than 8.

At the present time, the dry film resist, which is developable and separable with an aqueous alkali solution, is most widely used and thus is inexpensive. Therefore, the number of types is large, and the range of selection is wide. Further, since a large number of apparatuses usable in the development and separation are also commercially available, a desired apparatus is easily available at a low price. In the case of an aqueous inorganic alkali solution, the wastewater treatment is easy, and, as compared with the solvent development-solvent separation-type liquid resist, the cost necessary for the whole process can be significantly reduced.

The laminate, to which the dry film is applied according to the present invention, is good in sectional form after wet etching and in etching accuracy. Therefore, the laminate is particularly useful for a suspension for a hard disk drive.

BEST MODE FOR CARRYING OUT THE INVENTION

First Invention

Figure 1:
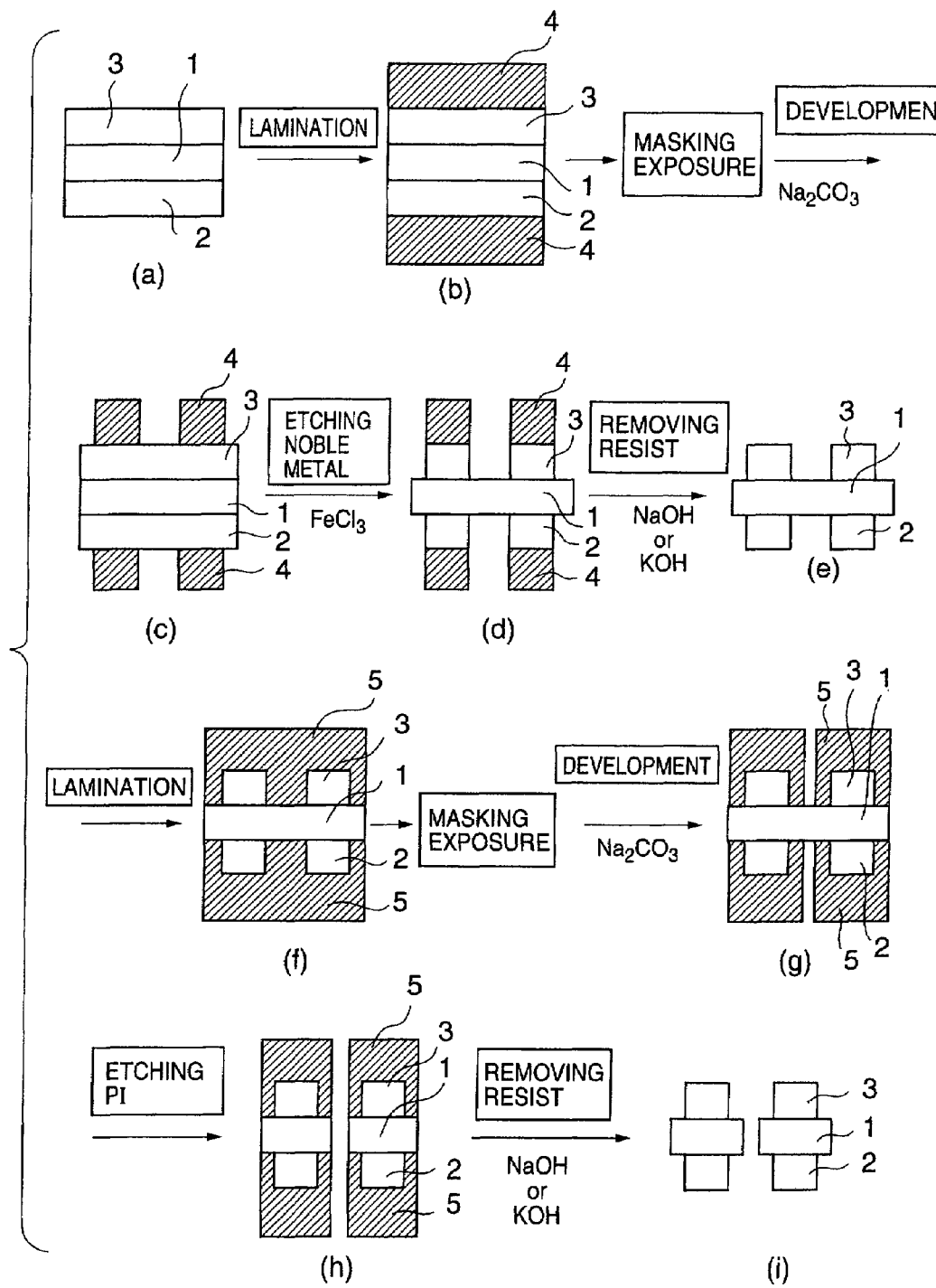
FIG. 1 is a process diagram illustrating a production process of an electronic component by wet etching using, as a starting material, a laminate comprising an insulating layer of a polyimide, a conductive inorganic material layer of copper provided on one side of the insulating layer, and a conductive inorganic material layer of SUS provided on the other side of the insulating layer.

The wet etchable insulator according to the first invention is a laminate of one or more insulation unit layers. The end face reinforcement effect attained by plasma treatment of the etched end face after wet etching can be attained independently of whether the insulator has a single layer structure or is a laminate having a multilayer structure.

When the insulator according to the present invention is applied to electronic circuit components, the layer construction of the insulator is preferably a laminate structure of adhesive insulating layer—core insulating layer—adhesive insulating layer. When the construction of the insulator according to the present invention is such that two adhesive insulating layers are provided respectively on the top surface and the back surface of the laminate and a low-expansion core insulating layer is interposed between the two adhesive insulating layers, the thickness of the adhesive insulating layer is preferably one-fourth of the thickness of the core insulating layer from the viewpoint of suppressing the warpage.

The insulation unit layer as the constituent unit of the insulator according to the present invention is generally formed of an organic material. However, at least one of the insulation unit layers constituting the insulator may contain an inorganic material. Inorganic materials include, for example, colloidal silica, glass fiber, and other inorganic fillers.

In the insulator according to the present invention, from the viewpoints of excellent heat resistance and insulating properties, at least one of the insulation unit layers constituting the insulator is formed of a polyimide resin, and, more preferably, all the insulation unit layers constituting the insulator are formed of a polyimide resin. The material, however, is not particularly limited so far as the resin is heat resistant or has insulating properties or an inorganic material has been added to the resin, and is independent of whether or not an imide bond is present in the resin.

The insulator according to the present invention can be laminated onto a conductive inorganic material layer(s) (mainly a metal layers) to prepare a laminate which is suitable for an electronic circuit component, particularly a suspension for a hard disk drive. Accordingly, from the viewpoint of preventing the warpage of the electronic circuit component, the insulator preferably comprises a low-expansion insulator, particularly a polyimide resin layer. In this case, the coefficient of thermal expansion of the low-expansion insulator is preferably substantially equal to that of the inorganic material to be laminated from the viewpoint of preventing the warpage. In this case, the low-expansion material refers to a material having a coefficient of thermal expansion of not more than 30 ppm. Further, the difference in coefficient of linear thermal expansion between at least one of the insulation unit layers constituting the insulator according to the present invention and the inorganic material layer is preferably not more than 15 ppm. For example, a low-expansion polyimide is preferably used as the resin having the above coefficient of linear thermal expansion.

In the insulator according to the present invention, the resin used as the adhesive insulating layer is preferably an adhesive polyimide having a strength of adhesion to an adherend of not less than 100 g/cm. The resin, however, is not limited to this only, so far as the resin has similar adhesion and good heat resistance or insulating properties, and is independent of whether or not an imide bond is present. A thermoplastic polyimide is mainly used in the adhesive insulating layer in the insulator according to the present invention. The material for the adhesive insulating layer, however, is not limited to this only. Further, the adhesive strength of the insulator according to the present invention sometimes varies depending upon the relationship with the adhesion to the adherend. The adhesive polyimide should be properly selected according to the type of the adherend or according to properties required of the laminate adhered to the adherend. Therefore, when different inorganic material layers are stacked respectively onto the top surface and the back surface of the insulating layer, it is not always necessary to use adhesive polyimdies having an identical composition as materials for the adhesive insulating layers in contact with the respective inorganic material layers.

Each of the insulation unit layers in the insulator according to the present invention may have any molecular weight so far as a strength, which poses no problem in practical use, can be maintained. In particular, the weight average molecular weight is generally preferably not less than 6000 and not more than 500000 although the preferred molecular weight depends upon the molecular structure. The weight average molecular weight is particularly preferably not less than 8000 and not more than 100000. When the molecular weight is not less than 500000, the formation of an even coating is difficult, while, when the molecular weight is not more than 6000, the film formability is poor making it difficult to form an even adhesive coating. This molecular weight range specifies the range of molecular weight, in the case where the insulator has been constituted by a polymeric resin as a starting material, and is not applied to an insulator produced by forming a layer using a low-molecular weight material and then increasing the molecular weight by heat treatment or the like.

The insulator according to the present invention may be formed by applying a coating liquid. Alternatively, for example, a self-contained film may be used. Further, a method may be used wherein a precursor or a derivative thereof is molded, and the molded product is then treated to form a desired chemical structure.

When the insulator according to the present invention is applied to an electronic circuit component, the layer construction of the laminate materials in the electronic circuit component is first inorganic material layer—insulating layer—second inorganic material layer, or inorganic material layer—insulating layer, and the insulator according to the present invention mainly exists as the insulating layer in the laminate. This laminate may be produced by any method without particular limitation so far as the final layer construction of the laminate is the same. Examples of production methods include: a method (cast method) wherein a solution of a material for the insulator is coated directly onto the inorganic material to form one or more stacked layers as the insulating layer, another inorganic material is laminated, and the assembly is then thermocompression bonded; a method (film method) wherein an adhesive insulating layer is formed on a previously provided core insulating film, an inorganic material is thermocompression bonded onto the top surface and the back surface of the adhesive insulating layer; and a method wherein, after the formation of an adhesive insulating layer onto a film, an inorganic material layer is formed by vapor deposition, sputtering, plating or the like.

The inorganic material in the inorganic material layer in the laminate, in which the insulator according to the present invention is present, refers to a wide variety of materials which are not organic, and examples thereof include metals, metal oxides, single crystalline silicon, and semiconductor products produced by the fabrication of the single crystalline silicon. In particular, when the insulator according to the present invention is applied to a suspension for a hard disk drive, properties as a spring are required. Therefore, the lamination of the insulator onto a highly elastic metal, such as stainless steel, and a copper foil or an alloy copper foil for the formation of wiring is preferred.

The insulator according to the present invention is basically directed to a wet etched insulating layer in a laminate. In this case, the type of the inorganic material is not particularly limited, and, in the laminate, the insulating layer may be laminated onto any inorganic material so far as dusting is suppressed at the time of use of the laminate.

Wet etching of the insulator according to the present invention may be carried out after lamination onto an inorganic material layer to form a laminate, or alternatively may be carried out before the lamination. Embodiments of the wet etched insulator according to the present invention are as follows.

(i) An inorganic material layer for the formation of a substrate with wiring formed therein is adhered to both sides of an insulating film, and the insulating film is then wet etched.

(ii) After wiring is formed on a substrate of an inorganic material layer, an insulating film is adhered. Thereafter, an inorganic material layer is applied onto the surface of the insulating film, and the inorganic material layer and the insulating film are wet etched.

(iii) A previously wet etched insulating film is applied onto an inorganic material layer.

When the insulator is formed of a polyimide, the wet etching according to the present invention is generally carried out with an etching liquid at a pH value of more than 7.0.

For example, in the case of wet etching of a polyimide, for example, an alkali-amine etching liquid as disclosed in Japanese Patent Laid-Open No. 97081/1998 may be mentioned as a suitable etching liquid. The etching liquid, however, is not limited to this only. Specifically, the etching liquid is preferably an aqueous alkaline solution and is more preferably a basic chemical liquid having a pH value of not less than 9, still more preferably not less than 11. Further, the etching liquid may be an organic alkali or an inorganic alkali or a mixture of an organic alkali with an inorganic alkali.

The present inventors have aimed at the fact that the maximum ratio between the thickness of the core insulating layer and the thickness of each of the adhesive insulating layer constituting the insulating layer in a laminate having a layer construction of first metal layer—insulating layer—second metal layer or a layer construction of metal layer—insulating layer for a high-precision electronic circuit component such as a wireless suspension or the like is 4:1. The present inventors have built up a hypothesis that, in the case of an adhesive insulating layer, of which the etching rate is one-fourth of the etching rate of the core insulating layer, the time necessary for etching of the core insulating layer is the same as the time necessary for etching of the adhesive insulating layer, and, thus, a good etching shape is obtained. They have substantiated this by experimentation. When the etching rate ratio between the insulation unit layer having a higher etching rate and the insulation unit layer having a lower etching rate constituting the insulting layer is in the range of 6:1 to 1:1, preferably in the range of 4:1 to 1:1, even in the wet process, the whole insulating layer is evenly etched with a good etching shape.

The temperature at which wet etching is carried out is not particularly limited so far as the etchant can exhibit the desired function. In particular, when the etchant is an aqueous solution, the etching temperature is preferably 0 to 110° C. When the temperature is low, the etching rate is generally low. Further, when the temperature is high, the working efficiency is not good due to the occurrence of boiling or the like. For this reason, more preferably, the etching temperature is in the range of 30 to 90° C. Still more preferably, wet etching is carried out at a temperature in the range of 50 to 90° C. from the viewpoints of suppressing a change in composition of the etchant due to the evaporation of components or the like and, in addition, shortening the etching time.

Low-temperature plasma is used in the plasma treatment applied to the insulator according to the present invention. The plasma treatment is treatment which utilizes a chemical reaction, induced by active radicals in a plasma system, and energy and heat of positive ions which have been accelerated in an electric field. A parallel flat RIE apparatus may be mentioned as a plasma treatment apparatus usable in the present invention. The plasma treatment apparatus is operated under conditions of pressure 0.1 to 100 Pa and high frequency power supply 40 kHz to 13.56 MHz. Gases such as polyfluorocarbon, inorganic halogen, hydrocarbon, noble gas, $O_2$, $H_2$, and $N_2$ may be used, as process gas, solely or as a mixture of two or more. The treatment time is about 0.01 sec to 30 min although the treatment time varies depending upon the construction of the apparatus, treatment area, treatment conditions and the like.

Electronic Circuit Component

An electronic circuit component may be generally produced by the following method.

A photosensitive resin layer is formed by coating or lamination onto the surface of a conductive inorganic material layer, located on the side in which the formation of a circuit is contemplated, in a laminate (a layer construction of first inorganic material layer—insulating layer—second inorganic material layer or a layer construction of inorganic material layer—insulating layer). A mask with a desired pattern image drawn thereon is brought into intimate contact with the surface of the photosensitive resin layer, and a electromagnetic radiation with a wavelength, to which the photosensitive resin is sensitive, is applied. The exposed portion in the case of a positive-working photosensitive resin or the unexposed portion in the case of a negative-working photosensitive resin is eluted with a predetermined developing solution to form a desired circuit image on the inorganic material layer. The assembly in this stage is dipped in a solution, which can dissolve a metal, such as an aqueous ferric chloride solution, or alternatively the solution is sprayed on the substrate, whereby the exposed metal is eluted. Therefore, the photosensitive resin is separated with a predetermined separation solution to form a circuit. Next, likewise, a mask with a desired pattern image drawn thereon is brought into intimate contact with the surface of the circuit formed on the surface of the metal, and the insulating layer is patterned by the wet process. Next, the patterned insulating layer is subjected to plasma treatment.

Electronic circuit components, to which the laminate according to the present invention can be applied, include, for example, wiring boards such as flexible printed boards, semiconductor-related components such as CSP (chip scale package), and devices such as nozzles of toner jet printers, particularly suspensions for hard disk drives.

Second Invention

The wet etchable insulator according to the second invention is a laminate of one or more insulation unit layers. The end face reinforcement effect attained by heat treatment of the etched end face after wet etching can be attained independently of whether the insulator has a single layer structure or is a laminate having a multilayer structure.

When the insulator according to the present invention is applied to electronic circuit components, the layer construction of the insulator is preferably a laminate structure of adhesive insulating layer—core insulating layer—adhesive insulating layer. When the construction of the insulator according to the present invention is such that two adhesive insulating layers are provided respectively on the top surface and the back surface of the laminate and a low-expansion core insulating layer is interposed between the two adhesive insulating layers, the thickness of the adhesive insulating layer is preferably one-fourth of the thickness of the core insulating layer from the viewpoint of suppressing the warpage.

The insulation unit layer as the constituent unit of the insulator according to the present invention is generally formed of an organic material. However, at least one of the insulation unit layers constituting the insulator may contain an inorganic material. Inorganic materials include, for example, colloidal silica, glass fiber, and other inorganic fillers.

In the insulator according to the present invention, from the viewpoints of excellent heat resistance and insulating properties, at least one of the insulation unit layers constituting the insulator is formed of a polyimide resin, and, more preferably, all the insulation unit layers constituting the insulator are formed of a polyimide resin. The material, however, is not particularly limited so far as the resin is heat resistant or has insulating properties or an inorganic material has been added to the resin, and is independent of whether or not an imide bond is present in the resin.

The insulator according to the present invention can be laminated onto a conductive inorganic material layer(s) (mainly a metal layers) to prepare a laminate which is suitable for an electronic circuit component, particularly a suspension for a hard disk drive. Accordingly, from the viewpoint of preventing the warpage of the electronic circuit component, the insulator preferably comprises a low-expansion insulator, particularly a polyimide resin layer. In this case, the coefficient of thermal expansion of the low-expansion insulator is preferably substantially equal to that of the inorganic material to be laminated from the viewpoint of preventing the warpage. In this case, the low-expansion material refers to a material having a coefficient of thermal expansion of not more than 30 ppm. Further, the difference in coefficient of linear thermal expansion between at least one of the insulation unit layers constituting the insulator according to the present invention and the inorganic material layer is preferably not more than 15 ppm. For example, a low-expansion polyimide is preferably used as the resin having the above coefficient of linear thermal expansion.

In the insulator according to the present invention, the resin used as the adhesive insulating layer is preferably an adhesive polyimide having a strength of adhesion to an adherend of not less than 100 g/cm. The resin, however, is not limited to this only, so far as the resin has similar adhesion and good heat resistance or insulating properties, and is independent of whether or not an imide bond is present. A thermoplastic polyimide is mainly used in the adhesive insulating layer in the insulator according to the present invention. The material for the adhesive insulating layer, however, is not limited to this only. Further, the adhesive strength of the insulator according to the present invention sometimes varies depending upon the relationship with the adhesion to the adherend. The adhesive polyimide should be properly selected according to the type of the adherend or according to properties required of the laminate adhered to the adherend. Therefore, when different inorganic material layers are stacked respectively onto the top surface and the back surface of the insulating layer, it is not always necessary to use adhesive polyimdies having an identical composition as materials for the adhesive insulating layers in contact with the respective inorganic material layers.

Each of the insulation unit layers in the insulator according to the present invention may have any molecular weight so far as a strength, which poses no problem in practical use, can be maintained. In particular, the weight average molecular weight is generally preferably not less than 6000 and not more than 500000 although the preferred molecular weight depends upon the molecular structure. The weight average molecular weight is particularly preferably not less than 8000 and not more than 100000. When the molecular weight is not less than 500000, the formation of an even coating is difficult, while, when the molecular weight is not more than 6000, the film formability is poor making it difficult to form an even adhesive coating. This molecular weight range specifies the range of molecular weight, in the case where the insulator has been constituted by a polymeric resin as a starting material, and is not applied to an insulator produced by forming a layer using a low-molecular weight material and then increasing the molecular weight by heat treatment or the like.

The insulator according to the present invention may be formed by applying a coating liquid. Alternatively, for example, a self-contained film may be used. Further, a method may be used wherein a precursor or a derivative thereof is molded, and the molded product is then treated to form a desired chemical structure.

When the insulator according to the present invention is applied to an electronic circuit component, the layer construction of the laminate materials in the electronic circuit component is first inorganic material layer—insulating layer—second inorganic material layer, or inorganic material layer—insulating layer, and the insulator according to the present invention mainly exists as the insulating layer in the laminate. This laminate may be produced by any method without particular limitation so far as the final layer construction of the laminate is the same. Examples of production methods include: a method (cast method) wherein a solution of a material for the insulator is coated directly onto the inorganic material to form one or more stacked layers as the insulating layer, another inorganic material is laminated, and the assembly is then thermocompression bonded; a method (film method) wherein an adhesive insulating layer is formed on a previously provided core insulating film, an inorganic material is thermocompression bonded onto the top surface and the back surface of the adhesive insulating layer; and a method wherein, after the formation of an adhesive insulating layer onto a film, an inorganic material layer is formed by vapor deposition, sputtering, plating or the like.

The inorganic material in the inorganic material layer in the laminate, in which the insulator according to the present invention is present, refers to a wide variety of materials which are not organic, and examples thereof include metals, metal oxides, single crystalline silicon, and semiconductor products produced by the fabrication of the single crystalline silicon. In particular, when the insulator according to the present invention is applied to a suspension for a hard disk drive, properties as a spring are required. Therefore, the lamination of the insulator onto a highly elastic metal, such as stainless steel, and a copper foil or an alloy copper foil for the formation of wiring is preferred.

The insulator according to the present invention is basically directed to a wet etched insulating layer in a laminate. In this case, the type of the inorganic material is not particularly limited, and, in the laminate, the insulating layer may be laminated onto any inorganic material so far as dusting is suppressed at the time of use of the laminate.

Wet etching of the insulator according to the present invention may be carried out after lamination onto an inorganic material layer to form a laminate, or alternatively may be carried out before the lamination. Embodiments of the wet etched insulator according to the present invention are as follows.

(i) An inorganic material layer for the formation of a substrate with wiring formed therein is adhered to both sides of an insulating film, and the insulating film is then wet etched.

(ii) After wiring is formed on a substrate of an inorganic material layer, an insulating film is adhered. Thereafter, an inorganic material layer is applied onto the surface of the insulating film, and the inorganic material layer and the insulating film are wet etched.

(iii) A previously wet etched insulating film is applied onto an inorganic material layer.

When the insulator is formed of a polyimide, the wet etching according to the present invention is generally carried out with an etching liquid at a pH value of more than 7.0.

For example, in the case of wet etching of a polyimide, for example, an alkali-amine etching liquid as disclosed in Japanese Patent Laid-Open No. 97081/1998 may be mentioned as a suitable etching liquid. The etching liquid, however, is not limited to this only. Specifically, the etching liquid is preferably an aqueous alkaline solution and is more preferably a basic chemical liquid having a pH value of not less than 9, still more preferably not less than 11. Further, the etching liquid may be an organic alkali or an inorganic alkali or a mixture of an organic alkali with an inorganic alkali.

The present inventors have aimed at the fact that the maximum ratio between the thickness of the core insulating layer and the thickness of each of the adhesive insulating layer constituting the insulating layer in a laminate having a layer construction of first metal layer—insulating layer—second metal layer or a layer construction of metal layer—insulating layer for a high-precision electronic circuit component such as a wireless suspension or the like is 4:1. The present inventors have built up a hypothesis that, in the case of an adhesive insulating layer, of which the etching rate is one-fourth of the etching rate of the core insulating layer, the time necessary for etching of the core insulating layer is the same as the time necessary for etching of the adhesive insulating layer, and, thus, a good etching shape is obtained. They have substantiated this by experimentation. When the etching rate ratio between the insulation unit layer having a higher etching rate and the insulation unit layer having a lower etching rate constituting the insulting layer is in the range of 6:1 to 1:1, preferably in the range of 4:1 to 1:1, even in the wet process, the whole insulating layer is evenly etched with a good etching shape.

The temperature at which wet etching is carried out is not particularly limited so far as the etchant can exhibit the desired function. In particular, when the etchant is an aqueous solution, the etching temperature is preferably 0 to 110° C. When the temperature is low, the etching rate is generally low. Further, when the temperature is high, the working efficiency is not good due to the occurrence of boiling or the like. For this reason, more preferably, the etching temperature is in the range of 30 to 90° C. Still more preferably, wet etching is carried out at a temperature in the range of 50 to 90° C. from the viewpoints of suppressing a change in composition of the etchant due to the evaporation of components or the like and, in addition, shortening the etching time.

The temperature of the heat treatment applied to the insulator according to the present invention is preferably such that a conventional dehydration reaction proceeds. Specifically, the heat treatment temperature is preferably 100° C. or above. In order to shorten the time necessary for the heat treatment from the viewpoint of productivity, the heat treatment temperature is more preferably 180° C. or above. Further, the heat treatment temperature is preferably 380° C. or below from the viewpoint of avoiding the decomposition of the polyimide. Heat treatment for a long period of time at a high temperature of 300° C. or above in the air sometimes deteriorates the polyimide resulting in an increased level of the occurrence of particles. The heat treatment time may be properly regulated in the range of 0.01 sec to 30 min depending upon the treatment temperature. When the heat treatment time is less than 0.01 sec, no effect can be developed by the heat treatment. On the other hand, when the heat treatment time is more than 30 min, the productivity is significantly lowered.

Heat treatment methods include, but are not limited to, a method wherein the assembly is placed in an oven, a method wherein the assembly is passed below a nozzle through which hot air is blown, a method wherein the assembly is placed on a hot plate, and a method wherein the assembly is moved on a hot plate.

When the insulator according to the present invention is applied to electronic members, the heat treatment is preferably carried out in an inert atmosphere from the viewpoint of preventing the corrosion of wiring or the substrate. Further, heat treatment under a reduced pressure of not more than $10^{-2}$ Torr is also preferred because the same effect attained by the heat treatment in an inert atmosphere can be attained.

Electronic Circuit Component

An electronic circuit component may be generally produced by the following method.

A photosensitive resin layer is formed by coating or lamination onto the surface of a conductive inorganic material layer, located on the side in which the formation of a circuit is contemplated, in a laminate (a layer construction of first inorganic material layer—insulating layer—second inorganic material layer or a layer construction of inorganic material layer—insulating layer). A mask with a desired pattern image drawn thereon is brought into intimate contact with the surface of the photosensitive resin layer, and a electromagnetic radiation with a wavelength, to which the photosensitive resin is sensitive, is applied. The exposed portion in the case of a positive-working photosensitive resin or the unexposed portion in the case of a negative-working photosensitive resin is eluted with a predetermined developing solution to form a desired circuit image on the inorganic material layer. The assembly in this stage is dipped in a solution, which can dissolve a metal, such as an aqueous ferric chloride solution, or alternatively the solution is sprayed on the substrate, whereby the exposed metal is eluted. Therefore, the photosensitive resin is separated with a predetermined separation solution to form a circuit. Next, likewise, a mask with a desired pattern image drawn thereon is brought into intimate contact with the surface of the circuit formed on the surface of the metal, and the insulating layer is patterned by the wet process. Next, the patterned insulating layer is heat treated.

Electronic circuit components, to which the laminate according to the present invention can be applied, include, for example, wiring boards such as flexible printed boards, semiconductor-related components such as CSP (chip scale package), and devices such as nozzles of toner jet printers, particularly suspensions for hard disk drives.

Third Invention

The wet etchable insulator according to the third invention is a laminate of one or more insulation unit layers. The end face reinforcement effect attained by the treatment with a dehydration catalyst of the etched end face after wet etching can be attained independently of whether the insulator has a single layer structure or is a laminate having a multilayer structure.

When the insulator according to the present invention is applied to electronic circuit components, the layer construction of the insulator is preferably a laminate structure of adhesive insulating layer—core insulating layer—adhesive insulating layer. When the construction of the insulator according to the present invention is such that two adhesive insulating layers are provided respectively on the top surface and the back surface of the laminate and a low-expansion core insulating layer is interposed between the two adhesive insulating layers, the thickness of the adhesive insulating layer is preferably one-fourth of the thickness of the core insulating layer from the viewpoint of suppressing the warpage.

The insulation unit layer as the constituent unit of the insulator according to the present invention is generally formed of an organic material. However, at least one of the insulation unit layers constituting the insulator may contain an inorganic material. Inorganic materials include, for example, colloidal silica, glass fiber, and other inorganic fillers.

In the insulator according to the present invention, from the viewpoints of excellent heat resistance and insulating properties, at least one of the insulation unit layers constituting the insulator is formed of a polyimide resin, and, more preferably, all the insulation unit layers constituting the insulator are formed of a polyimide resin. The material, however, is not particularly limited so far as the resin is heat resistant or has insulating properties or an inorganic material has been added to the resin, and is independent of whether or not an imide bond is present in the resin.

The insulator according to the present invention can be laminated onto a conductive inorganic material layer(s) (mainly a metal layers) to prepare a laminate which is suitable for an electronic circuit component, particularly a suspension for a hard disk drive. Accordingly, from the viewpoint of preventing the warpage of the electronic circuit component, the insulator preferably comprises a low-expansion insulator, particularly a polyimide resin layer. In this case, the coefficient of thermal expansion of the low-expansion insulator is preferably substantially equal to that of the inorganic material to be laminated from the viewpoint of preventing the warpage. In this case, the low-expansion material refers to a material having a coefficient of thermal expansion of not more than 30 ppm. Further, the difference in coefficient of linear thermal expansion between at least one of the insulation unit layers constituting the insulator according to the present invention and the inorganic material layer is preferably not more than 15 ppm. For example, a low-expansion polyimide is preferably used as the resin having the above coefficient of linear thermal expansion.

In the insulator according to the present invention, the resin used as the adhesive insulating layer is preferably an adhesive polyimide having a strength of adhesion to an adherend of not less than 100 g/cm. The resin, however, is not limited to this only, so far as the resin has similar adhesion and good heat resistance or insulating properties, and is independent of whether or not an imide bond is present. A thermoplastic polyimide is mainly used in the adhesive insulating layer in the insulator according to the present invention. The material for the adhesive insulating layer, however, is not limited to this only. Further, the adhesive strength of the insulator according to the present invention sometimes varies depending upon the relationship with the adhesion to the adherend. The adhesive polyimide should be properly selected according to the type of the adherend or according to properties required of the laminate adhered to the adherend. Therefore, when different inorganic material layers are stacked respectively onto the top surface and the back surface of the insulating layer, it is not always necessary to use adhesive polyimdies having an identical composition as materials for the adhesive insulating layers in contact with the respective inorganic material layers.

Each of the insulation unit layers in the insulator according to the present invention may have any molecular weight so far as a strength, which poses no problem in practical use, can be maintained. In particular, the weight average molecular weight is generally preferably not less than 6000 and not more than 500000 although the preferred molecular weight depends upon the molecular structure. The weight average molecular weight is particularly preferably not less than 8000 and not more than 100000. When the molecular weight is not less than 500000, the formation of an even coating is difficult, while, when the molecular weight is not more than 6000, the film formability is poor making it difficult to form an even adhesive coating. This molecular weight range specifies the range of molecular weight, in the case where the insulator has been constituted by a polymeric resin as a starting material, and is not applied to an insulator produced by forming a layer using a low-molecular weight material and then increasing the molecular weight by heat treatment or the like.

The insulator according to the present invention may be formed by applying a coating liquid. Alternatively, for example, a self-contained film may be used. Further, a method may be used wherein a precursor or a derivative thereof is molded, and the molded product is then treated to form a desired chemical structure.

When the insulator according to the present invention is applied to an electronic circuit component, the layer construction of the laminate materials in the electronic circuit component is first inorganic material layer—insulating layer—second inorganic material layer, or inorganic material layer—insulating layer, and the insulator according to the present invention mainly exists as the insulating layer in the laminate. This laminate may be produced by any method without particular limitation so far as the final layer construction of the laminate is the same. Examples of production methods include: a method (cast method) wherein a solution of a material for the insulator is coated directly onto the inorganic material to form one or more stacked layers as the insulating layer, another inorganic material is laminated, and the assembly is then thermocompression bonded; a method (film method) wherein an adhesive insulating layer is formed on a previously provided core insulating film, an inorganic material is thermocompression bonded onto the top surface and the back surface of the adhesive insulating layer; and a method wherein, after the formation of an adhesive insulating layer onto a film, an inorganic material layer is formed by vapor deposition, sputtering, plating or the like.

The inorganic material in the inorganic material layer in the laminate, in which the insulator according to the present invention is present, refers to a wide variety of materials which are not organic, and examples thereof include metals, metal oxides, single crystalline silicon, and semiconductor products produced by the fabrication of the single crystalline silicon. In particular, when the insulator according to the present invention is applied to a suspension for a hard disk drive, properties as a spring are required. Therefore, the lamination of the insulator onto a highly elastic metal, such as stainless steel, and a copper foil or an alloy copper foil for the formation of wiring is preferred.

The insulator according to the present invention is basically directed to a wet etched insulating layer in a laminate. In this case, the type of the inorganic material is not particularly limited, and, in the laminate, the insulating layer may be laminated onto any inorganic material so far as dusting is suppressed at the time of use of the laminate.

Wet etching of the insulator according to the present invention may be carried out after lamination onto an inorganic material layer to form a laminate, or alternatively may be carried out before the lamination. Embodiments of the wet etched insulator according to the present invention are as follows.

(i) An inorganic material layer for the formation of a substrate with wiring formed therein is adhered to both sides of an insulating film, and the insulating film is then wet etched.

(ii) After wiring is formed on a substrate of an inorganic material layer, an insulating film is adhered. Thereafter, an inorganic material layer is applied onto the surface of the insulating film, and the inorganic material layer and the insulating film are wet etched.

(iii) A previously wet etched insulating film is applied onto an inorganic material layer.

When the insulator is formed of a polyimide, the wet etching according to the present invention is generally carried out with an etching liquid at a pH value of more than 7.0.

For example, in the case of wet etching of a polyimide, for example, an alkali-amine etching liquid as disclosed in Japanese Patent Laid-Open No. 97081/1998 may be mentioned as a suitable etching liquid. The etching liquid, however, is not limited to this only. Specifically, the etching liquid is preferably an aqueous alkaline solution and is more preferably a basic chemical liquid having a pH value of not less than 9, still more preferably not less than 11. Further, the etching liquid may be an organic alkali or an inorganic alkali or a mixture of an organic alkali with an inorganic alkali.

The present inventors have aimed at the fact that the maximum ratio between the thickness of the core insulating layer and the thickness of each of the adhesive insulating layer constituting the insulating layer in a laminate having a layer construction of first metal layer—insulating layer—second metal layer or a layer construction of metal layer—insulating layer for a high-precision electronic circuit component such as a wireless suspension or the like is 4:1. The present inventors have built up a hypothesis that, in the case of an adhesive insulating layer, of which the etching rate is one-fourth of the etching rate of the core insulating layer, the time necessary for etching of the core insulating layer is the same as the time necessary for etching of the adhesive insulating layer, and, thus, a good etching shape is obtained. They have substantiated this by experimentation. When the etching rate ratio between the insulation unit layer having a higher etching rate and the insulation unit layer having a lower etching rate constituting the insulting layer is in the range of 6:1 to 1:1, preferably in the range of 4:1 to 1:1, even in the wet process, the whole insulating layer is evenly etched with a good etching shape.

The temperature at which wet etching is carried out is not particularly limited so far as the etchant can exhibit the desired function. In particular, when the etchant is an aqueous solution, the etching temperature is preferably 0 to 110° C. When the temperature is low, the etching rate is generally low. Further, when the temperature is high, the working efficiency is not good due to the occurrence of boiling or the like. For this reason, more preferably, the etching temperature is in the range of 30 to 90° C. Still more preferably, wet etching is carried out at a temperature in the range of 50 to 90° C. from the viewpoints of suppressing a change in composition of the etchant due to the evaporation of components or the like and, in addition, shortening the etching time.

The treatment with a dehydration catalyst applied to the insulator according to the present invention refers to post treatment after wet etching of the insulator or the laminate of the insulator and the inorganic material layer, wherein the insulator or the laminate is dipped in a treatment liquid of a dehydration catalyst, or alternatively the treatment liquid of a dehydration catalyst is sprayed on the insulator or the laminate, thereby permitting the treatment liquid to be brought into contact with a specific site of the insulator or the laminate to be treated. In this case, the contact may be carried out by any method without particular limitation. The temperature of the treatment liquid is not particularly limited so far as a condensation reaction satisfactorily proceeds and no problem occurs from the practical viewpoint. However, the temperature of the treatment liquid is preferably 0 to 100° C., more preferably 10 to 40° C. from the viewpoint of working efficiency. When the treatment time is less than 0.01 sec, the treatment effect is unsatisfactory, while when the treatment time is not less than 30 min, the productivity is disadvantageously lowered.

The dehydration catalyst used in the present invention refers to a reagent which acts to accelerate a condensation reaction of an amino group with a carboxyl group or a condensation reaction of amide group with a carboxyl group. Specific examples thereof include, but are not limited to: acid anhydride compounds such as acetic anhydride and tetrafluoroacetic anhydride; carbodiimide compounds such as dicyclohexylcarbodiimide; carbodiimide resins; organic compounds such as DBN (1,5-diazabicyclo[4.3.0]non-5-ene); and inorganic material such as concentrated sulfuric acid, phosphoryl chloride, and phosphorus trichloride. Acid anhydride compounds and carbodiimide compounds are preferred from the viewpoints of cost and handleability. Among them, acetic anhydride is most widely used and thus is preferred.

In the treatment with a dehydration catalyst, a compound, which acts to further promote the reaction, such as a tertiary amine or pyridine, may be added. Specific examples of tertiary amines include, but are not limited to, triethylamine.

The dehydration catalyst as such may be used as the treatment liquid. Alternatively, the dehydration catalyst may be diluted with other solvent so far as the dehydration action is satisfactorily provided. Specific examples of solvents usable for the dilution include, but are not limited to: ketone solvents such as acetone or methyl ethyl ketone; aromatic hydrocarbons such as toluene; hydrocarbons such as hexane and cyclohexane; ethers such as diethyl ether; and esters such as ethyl acetate.

Electronic Circuit Component

An electronic circuit component may be generally produced by the following method.

A photosensitive resin layer is formed by coating or lamination onto the surface of a conductive inorganic material layer, located on the side in which the formation of a circuit is contemplated, in a laminate (a layer construction of first inorganic material layer—insulating layer—second inorganic material layer or a layer construction of inorganic material layer—insulating layer). A mask with a desired pattern image drawn thereon is brought into intimate contact with the surface of the photosensitive resin layer, and a electromagnetic radiation with a wavelength, to which the photosensitive resin is sensitive, is applied. The exposed portion in the case of a positive-working photosensitive resin or the unexposed portion in the case of a negative-working photosensitive resin is eluted with a predetermined developing solution to form a desired circuit image on the inorganic material layer. The assembly in this stage is dipped in a solution, which can dissolve a metal, such as an aqueous ferric chloride solution, or alternatively the solution is sprayed on the substrate, whereby the exposed metal is eluted. Therefore, the photosensitive resin is separated with a predetermined separation solution to form a circuit. Next, likewise, a mask with a desired pattern image drawn thereon is brought into intimate contact with the surface of the circuit formed on the surface of the metal, and the insulating layer is patterned by the wet process. Next, the patterned insulating layer is treated with a dehydration catalyst.

Electronic circuit components, to which the laminate according to the present invention can be applied, include, for example, wiring boards such as flexible printed boards, semiconductor-related components such as CSP (chip scale package), and devices such as nozzles of toner jet printers, particularly suspensions for hard disk drives.

Fourth Invention

Specific preferred embodiments of the production process of an electronic component according to the fourth invention will be described with reference to a process diagram, though the present invention is not limited to these preferred embodiments. FIG. 1 is a process diagram illustrating a production process of an electronic component by wet etching, wherein a laminate comprised of an insulating layer 1 of a polyimide, a conductive inorganic material layer 3 of copper provided on one side of the insulating layer 1, and a conductive inorganic material layer 2 of SUS provided on the other side of the insulating layer 1 is used as a starting material.

FIG. 1(a) shows the layer construction of the laminate as the starting material. A dry film resist 4 is laminated by roll pressing or flat pressing onto each of the conductive inorganic material layers 2, 3 located respectively on the top surface and the back surface of the laminate to prepare a laminate having a laminate structure shown in FIG. 1(b). A mask for bringing the conductive inorganic material layers 2, 3 to a desired pattern is put on the laminate, and the assembly is then exposed. Nest, development with an aqueous $Na_2CO_3$ solution is carried out to form a resist pattern shown in FIG. 1(c). The conductive inorganic material layers 2, 3 are then etched with an aqueous $FeCl_3$ solution to form an etching pattern of the conductive inorganic material layers 2, 3 according to the resist pattern shown in FIG. 1(d). The resist is then dissolved in and separated by an aqueous NaOH solution or an aqueous KOH solution to form an etching pattern of the conductive inorganic material layers 2, 3 shown in FIG. 1(e). Next, a dry film resist 5 is laminated by roll pressing or flat pressing onto the conductive inorganic material layers 2, 3 located on the top surface and the back surface of the laminate shown in FIG. (e) to prepare a laminate having a laminate structure shown in FIG. 1(f). A mask for bringing the insulating layer 1 to a desired pattern is put on the laminate, and the assembly is then exposed and is developed with an aqueous $Na_2CO_3$ solution to form a resist pattern shown in FIG. 1(g). Next, the insulating layer 1 is etched with an aqueous basic solution to form an etching pattern of the insulating layer according to the resist pattern shown in FIG. 1(h). Next, the resist is dissolved in and separated by an aqueous NaOH solution or an aqueous KOH solution to an electronic component according to the present invention with an etching pattern has been formed as shown in FIG. 1(i).

Next, each constituent feature of the present invention will be described.

Laminate

The laminate used in the present invention has a layer construction of conductive inorganic material layer—insulating layer—conductive inorganic material layer or a layer construction of insulating layer—conductive inorganic material layer. Here the conductive inorganic material layer used refers to a conductive material layer which is not organic. Examples of conductive inorganic material layers include a pure metal layer of copper, iron or the like, an alloy layer such as stainless steel, a material layer formed by treating the surface of the metal layer, a single crystal silicon layer, an inorganic semiconductor layer, and an metal oxide layer. When a conductive inorganic material layer is provided on both sides of the insulating layer, the conductive inorganic material layers may be the same or different. In particular, in the case of electronic components, copper, copper alloy, iron, nickel, stainless steel and the like are suitable. The conductive inorganic material layer preferably has a thickness in the range of 0.1 μm to 1 mm. In particular, when the conductive inorganic material layer is formed of a metal, the thickness of this layer is more preferably in the range of 0.1 μm to 200 μm.

When the electronic component produced by the production process of an electronic component according to the present invention is a suspension for a hard disk drive, there is no particular limitation so far as one of the conductive inorganic material layers in the laminate as the starting material is formed of stainless steel. From the viewpoint of spring properties required in the suspension or dimensional stability, however, SUS 304 is preferred. More preferred is SUS 304 which has been tension annealed at a temperature of 300° C. or above. The thickness of the stainless steel foil is preferably in the range of 10 to 70 μm, more preferably 15 to 30 μm.

For example, a copper foil or copper alloy foil having a thickness of 3 to 20 μm may be mentioned as the other conductive inorganic material layer in the laminate as the starting material. The copper alloy foil is an alloy foil formed of copper in combination with a dissimilar element such as nickel, silicon, zinc, tin, or beryllium and has a copper content of not less than 80%.

These stainless steel foil and copper alloy foil may be chemically or mechanically surface treated from the viewpoint of improving the adhesion or the like.

The insulating layer in the laminate may be formed of any material without particular limitation so far as the material has insulating properties. From the viewpoints of insulating properties and heat resistance in the form of a thin film, however, at least one layer of a polyimide resin is properly included in the insulating layer. The insulating layer may be in the form of a laminate of a plurality of insulation unit layers, for improving the adhesion to the conductive inorganic material layer. For example, an adhesive insulating layer may be included. In this case, all the layers constituting the insulating layer are formed of a polyimide from the viewpoints of heat resistance and insulating properties. Further, according to required properties, these layers may be different from each other or one another in composition, or alternatively a plurality of layers having an identical composition may be used. An example of the above construction is a laminate of stainless steel—adhesive polyimide A—low-expansion polyimide—adhesive polyimide B—copper. In this case, since the conductive inorganic material layers as adherends are different from each other, one of which is formed of stainless steel and the other is formed of copper, layers (adhesive polyimides A and B) constituting the insulating layer, which are different from each other in composition, are used for good adhesion to the respective adherends.

Further, from the viewpoint of preventing the warpage of the substrate, at least one of the layers constituting the insulting layer has a coefficient of thermal expansion (a coefficient of linear thermal expansion) which is relatively close to that of the conductive inorganic material layer (see Japanese Patent Laid-Open No. 157286/1985). The acceptable range of the difference in coefficient of thermal expansion is ±15 ppm. Further, since the conductive inorganic material generally has a coefficient of thermal expansion of not more than 30 ppm, the use of an insulating layer having a coefficient of thermal expansion of not more than 30 ppm is more preferred. When more fully preventing the warpage is desired, the total thickness of the layers having a coefficient of thermal expansion of not more than 30 ppm in the insulating layer is preferably not less than the half of the total thickness of all the layers constituting the insulating layer.

When the insulating layer in the laminate has a multilayer structure of a plurality of polyimide layers, the etching properties of the polyimide layers are important. When the insulating layer in the laminate according to the present invention constituted by two or more insulation unit layers, the ratio of the etching rate of the insulation unit layer having a higher etching rate to the etching rate of the insulation unit layer having a lower etching rate at the time of the wet etching is preferably in the range of 6:1 to 1:1, more preferably in the range of 4:1 to 1:1. When the insulation unit layers falling within this etching rate ratio are selected, a good etching shape can be realized in the insulating layer. In this case, even in the laminate for a wireless suspension which is required to satisfy strict specifications, wet etching can be carried out with high accuracy, and, as compared with dry etching, etching can be carried out in a shorter time with better productivity.

The total thickness of the layers constituting the insulating layer is preferably in the range of 3 to 500 μm. Further, from the viewpoints of productivity and resistance of the dry film resist to the etching liquid, the wet etching time is preferably 10 sec to 30 min. Wet etching within 15 min is further preferred. On the other hand, a wet etching time of more than 30 min leads to lowered productivity. When the etching rate under wet etching conditions is large and the insulating layer can be etched by no less than 500 μm in 30 min, a thickness of the layers constituting the insulating layer of 500 μm may be adopted. On the other hand, when the etching rate is small and etching of the thickness 500 μm cannot be realized in 30 min, the acceptable upper limit of the thickness of the insulating layer is such that the insulating layer can be etched in 30 min. More specifically, for example, when the etching rate of the insulating layer is 20 μm/min, the acceptable upper limit of the thickness of the insulating layer is 600 μm. When the etching rate of the insulating layer is 2 μm/min, the acceptable upper limit of the thickness of the insulating layer is 60 μm.

In the wet etching of the insulating layer, for example, in the case of etching of a polyimide as the insulating layer with a basic aqueous solution, an imide bond is reacted with hydroxide ions in the solution to cause ring opening and consequently to give polyamic acid. Even in this state, the solubility in the basic aqueous solution is higher than that of the polyimide in the basic aqueous solution. Further, the amide group in the amic acid is hyrolyzed by hydroxide ions to lower the molecular weight of the polymer, and this improves the solubility. When an easily hydrolyzable group is contained in the molecular chain, this site is sometimes hydrolyzed. In general, in the case of insulating layers having an identical structure produced under the same production conditions, the rate is approximately proportional to the number of times of collision of hydroxide ions against imide bond in the polyimide, and this thermodynamically exponentially increases with increasing the temperature.

According to this mechanism, in the case of a linear polymer, when the molecular weight is in a practically usable range, it is considered that the etching rate is not significantly influenced by the molecular weight. In fact, the above hypothesis is supported by data obtained by experiments conducted by the present inventors.

In the laminate as the starting material used in the present invention, the adhesive insulating layer constituting the insulating layer is mainly formed of a polyimide or a resin similar to the polyimide. However, the resin is not particularly limited to this only, and any resin may be used so far as the resin is heat resistant or has insulating properties (the resin usable herein is independent of whether or not imide bond is present). The adhesive polyimide in the present invention refers to a polyimide, which has an adhesive strength to an adherend of not less than 100 g/cm in a 90-degree peel test, and a thermoplastic polyimide is mainly used. However, the adhesive polyimide is not particularly limited to this only.

The laminate as the starting material used in the present invention may be produced by any method without particular limitation so far as the final layer construction of the laminate is the same, and the production method may be properly selected according to properties required of the contemplated product. Examples of production methods include: a method (cast method) wherein a solution of a material for the insulating layer is coated directly onto the conductive inorganic material layer to form one or more stacked layers as the insulating layer, another conductive inorganic material layer is laminated, and the assembly is then thermocompression bonded; a method (film method) wherein an adhesive insulating layer is formed on a previously provided core film as the insulating layer, a conductive inorganic material layer is laminated and thermocompression bonded onto the top surface and the back surface of the adhesive insulating layer; and a method wherein, after the formation of an adhesive insulating layer onto an insulation film, an conductive inorganic material layer is formed by vapor deposition, sputtering, plating or the like.

In the contemplated electronic component, when a conductive inorganic material layer, which cannot be formed by plating, such as a rolled copper foil or stainless steel is indispensable, the use of a laminate produced by a method, wherein conductive inorganic material layers are formed by thermocompression bonding, is preferred. When the conductive inorganic material layer should be very finely patterned in a wiring width of not more than 1 µm, the use of a laminate, in which a conductive inorganic material layer is thinly formed by sputtering or plating, is preferred.

The thickness of the whole laminate including the conductive inorganic material layers may vary depending upon contemplated applications. Preferably, however, the thickness of the whole laminate including the conductive inorganic material layers is in the range of 5 to 2000 µm. In particular, when all the conductive inorganic material layers in the laminate are formed of a metal, the thickness of the whole laminate including the conductive inorganic material layers is preferably in the range of 5 to 1000 µm, particularly preferably in the range of 5 to 500 µm.

Dry Film Resist

A material, which undergoes a change in solubility in a developing solution upon exposure to ultraviolet light (electromagnetic radiation), is used as the dry film resist in the present invention. The dry film resist refers to a solid film formed by molding a photosensitive resin composition which, upon the application of ultraviolet light (electromagnetic radiation) through an exposure mask having a desired pattern, can be patterned by utilizing the exposed portion and the unexposed portion. Dry film resists are classified into positive-working resists, wherein the exposed portion is eluted into the developing solution, and negative-working resists wherein the unexposed portion is eluted into the developing solution. In the present invention, any of the positive-working or negative-working resists may be used so far as the following property requirements are met.

The dry film resist in the present invention is preferably developable and separable with an aqueous solution, particularly a basic aqueous solution. The dry film resist, however, is not particularly limited so far as the resist is resistant to the etching liquid and can maintain the pattern shape during wet etching of the insulating layer. Dry film resists, which are developable and separable with a basic aqueous solution, include, for example, SUNFORT (tradename) series manufactured by Asahi Kasei Kogyo K.K.; and ALPHO (tradename) series and LAMINAR (tradename) series manufactured by Nichigo-Morton Co., Ltd. Further, commercially available lactic acid solution development-lactic acid solution separation type dry film resists such as SFP-00GI-25 AR (tradename; manufactured by Nippon Steel Chemical Co., Ltd.) are also usable.

In the wet etching of the insulating layer in the present invention, in many cases, concaves and convexes such as wiring of the conductive inorganic material layer are formed on the surface of the insulating layer. In this case, the thickness of the dry film resist is preferably 1.1 to 5 times the thickness of the conductive inorganic material layer. When the thickness of the dry film resist is less than 1.1 times the thickness of the conductive inorganic material layer, after the lamination of the dry film resist, there is a fear of convexes breaking through the dry film resist and consequently being exposed. This is causative of a poor etching shape. The upper limit of the thickness of the dry film resist is preferably 5 times the thickness of the conductive inorganic material layer on the insulating layer form the viewpoints of stabilization of the pattern shape and resolution of a fine pattern. In short, a good pattern shape can be obtained when the thickness of the dry film resist is in the range of 1.1 to 5 times the thickness of the conductive inorganic material layer located on the side in which a pattern is to be formed by the dry film resist.

In general, the aspect ratio of the commercially available dry film resist is about 2 to 1, and, when the formation of a fine wiring pattern is contemplated, a smaller thickness of the dry film resist is more advantageous. Since, however, the above-described problem exists, the thickness of the dry film resist should be larger than the thickness of the conductive inorganic material layer provided in the laminate.

Conventional lamination methods such as roll pressing or flat pressing may be used in the lamination of the dry film resist. In the laminate used in the present invention, the thickness of the insulating layer is 500 µm at the maximum and is preferably not more than 300 µm. Therefore, in such a state that the conductive inorganic material layer has been patterned to a desired shape, the rigidity of the substrate is low. Due to this nature, when the laminate is laminated by roll pressing sheet by sheet, the substrate is disadvantageously warped. The warpage of the substrate causes a significant misalignment at the time of exposure in a later step. This misalignment is causative of a misalignment of the pattern of the conductive inorganic material layer with the pattern of the insulating layer. For this reason, the warpage of the substrate should be minimized. To this end, when the dry film resist is laminated onto the substrate on the sheet, the use of a flat press is indispensable for the preparation of products with high accuracy as designed.

Further, in laminating the dry film resist onto the etched conductive inorganic material layer, the inclusion of air bubbles, for example, the inclusion of air bubbles between edges of concaves and convexes of the conductive inorganic material layer formed by etching and the dry film resist, causes contact failure at that portion. This results in an unacceptable poor etching shape. Since the etching rate of the wet etching is several tens of times larger than the etching rate of plasma etching as the dry process, the contact failure is likely to cause etching of a site not to be etched. In this case, the pattern defect extends in a wider area than that in the case of dry process. To solve this problem, in the present invention, the lamination is carried out under reduced pressure or under vacuum, preferably at a vapor pressure of not more than 80 KPa ($\approx$ 600 mmHg), more preferably not more than 40 KPa ($\approx$ 300 mmHg), most preferably not more than 6.7 KPa ($\approx$ 50 mmHg), from the viewpoint of removing air bubbles.

When a dry film resist having a smooth surface is used, even flat pressing under reduced pressure sometimes causes not less than about 20% of the surface of the substrate to be accounted for by air bubbles. In this case, when a dry film resist having on its surface fine concaves and convexes is used and is laminated so that the concaves and convexes face the substrate side, the fine concaves and convexes function as a passage for the escape of the air bubbles. This can prevent the occurrence of the above unfavorable phenomenon and is very effective for removing air bubbles.

That is, when the dry film resist is laminated in sheet-by-sheet treatment, flat pressing under reduced pressure and the use of a dry film resist having on its surface concaves and convexes are preferred for the preparation of products with good dimensional accuracy.

Regarding the concaves and convexes provided on the surface of the dry film resist, preferably, the dry film resist has a surface roughness Rz in the range of 0.5 to 50 μm. The concaves and convexes may be formed by any method without particular limitation. For example, after bringing a photosensitive resin composition to a dry film resist by coating or molding, the dry film resist is embossed to form concaves and convexes. Alternatively, a method may be used wherein a photosensitive resin composition in a solution form is coated onto a film having concaves and convexes and the coating is dried to prepare a dry film resist with concaves and convexes formed thereon.

The dry film resist is preferably laminated under conditions of temperature 20 to 100° C. and press pressure 0.05 to 0.3 MPa (0.5 to 3 kgf/cm$^2$). In this case, regarding the atmosphere in the lamination, the lamination is preferably carried out under reduced pressure or under vacuum, preferably at a vapor pressure of not more than 80 KPa ($\approx$ 600 mmHg), more preferably not more than 40 KPa ($\approx$ 300 mmHg), most preferably not more than 6.7 KPa ($\approx$ 50 mmHg). Vacuum suction time is regulated according to sheet size of the laminate to be processed. Specifically, the vacuum suction time is set so that, at the time of contact bonding, air bubbles are not left between the dry film resist and the laminate sheet. Lamination conditions vary depending upon Tg of the dry film resist used, and the lamination is carried out at a temperature high enough to fully cover a portion between patterns of the conductive inorganic material layer. In this case, when the temperature is excessively high, the sensitivity at the time of exposure is unstable.

The development and separation of the dry film resist are preferably carried out using a developing solution or a separation solution corresponding to the dry film resist used under recommendation conditions. However, the method for the development and separation of the dry film resist is not particularly limited. As described above, development with an aqueous solution, preferably a basic aqueous solution, particularly preferably an aqueous inorganic basic solution, is preferred from the viewpoint of waste treatment. The aqueous solution in the present invention may be a liquid composed mainly of water. Depending upon development and separation conditions, the aqueous solution may contain less than 50% by weight of an organic solvent such as an aliphatic alcohol, an aromatic alcohol, or an organic polar solvent. There is no particular limitation on the method for development, and examples of development methods include dipping, air spray, and submerged spray.

When the dry film resist is used in wet etching of the polyimide, since the etching liquid contains a highly reactive component in a high concentration, as compared with other cases, it is difficult for the dry film resist to maintain the pattern. To overcome this problem, the following method may be used. After the dry film resist is laminated followed by exposure and development to form a pattern, the assembly is heated. Alternatively, in the case of a negative-working dry film resist, an ionizing radiation, preferably ultraviolet light, is again applied. This method can strengthen the pattern of the dry film resist and can increase pattern shape retention time upon contact with the etching liquid.

The heating is carried out at a temperature in the range of 30 to 200° C., preferably 70 to 150° C., and the treatment time is suitably 10 sec to 20 min. The treatment method is not particularly limited, and examples thereof include a method wherein the assembly is allowed to stand on a hot plate, a method wherein the assembly is placed in an oven, a method wherein the assembly is treated with hot air, and a method wherein an infrared heater is used.

When the pattern shape retention is improved by the application of ultraviolet light (electromagnetic radiation) after the formation of a resist pattern, the application of energy at not less than 5 mJ with the same wavelength as used in the pattern-wise exposure is preferred.

Etching Liquid

Various etching liquids as described in the column of "BACKGROUND OF THE INVENTION," may be used as the etching liquid used in the present invention. The production process of an electronic component according to the present invention aims at high productivity, low process cost (apparatus cost, maintenance cost, and waste treatment cost), and low toxicity. Therefore, the etching liquid preferably has low toxicity and high service life. Preferably, the etching liquid does not contain highly toxic hydrazine. However, hydrazine may be contained as an additive in an amount of not more than 10% by weight based on the etching liquid. When the content of hydrazine exceeds 10%, etching shape is likely to be unstable making it difficult to process control. As described in Japanese Patent Laid-Open No. 301981/1993, the behavior of hydrazine in etching is unstable, and a lower hydrazine content is preferred from the viewpoints of process control and working environment.

The etching liquid used in the present invention should have etching rate high enough to etch polyimide within the pattern shape retention time of the dry film resist. Specifically, a basic aqueous solution composed mainly of an inorganic alkali disclosed in Japanese Patent Laid-Open Nos. 97081/1998 and 195214/1998 is most preferred. The etching liquid usable in the present invention is basically an aqueous solution containing one of or a mixture of two or more of an inorganic alkali, an aliphatic amine (diamine), an aliphatic alcohol, and an aliphatic amino alcohol and, as an additive, urea or an organic polar solvent and preferably has a pH value of more than 9.

The etching treatment temperature is above the solidifying point or precipitation temperature of the etching liquid and below the boiling point of the etching liquid and, from the viewpoints of productivity and process control, is 10 to 120° C., preferably 30 to 95° C., more preferably 50 to 90° C. In the case of an etching liquid containing a component which is volatile at the treatment temperature, treatment for a long period of time sometimes causes a change in composition of the etching liquid. Therefore, the treatment is preferably carried out at a temperature such that the evaporation of the components of the etching liquid can be avoided. This, however, is not essential.

The smaller the temperature profile within the etching bath, the better the results. The temperature profile is preferably within ±1° C., more preferably within ±0.5° C.

It has been experientially confirmed that, based on the mechanism of wet etching of polyimide, the etching rate exponentially increases with increasing the etching temperature. When the treatment is carried out under conditions which provide a higher etching rate, the dependency of the etching rate upon the temperature becomes larger. Therefore, when temperature profile exists within the etching bath, a variation in pattern accuracy within the plane of the substrate is large. This is particularly significant when the etching rate of the insulating layer is large. Therefore, the minimization of the temperature profile is effective for uniform processing.

Etching methods include dipping, air spray, submerged spray, and dipping+application of ultrasonic wave. In the case of air spray, however, components of the etching liquid are significantly evaporated making it difficult to perform the liquid control. Preferred are dipping or submerged spray. Submerged spray is preferred from the viewpoint of further reducing the taper angle of the etching shape.

When ultrasonic wave is applied to the etching liquid, conditions for the application of ultrasonic wave should be carefully set so as to avoid an unfavorable phenomenon such that, upon the application of ultrasonic wave, the dry film resist is partially separated and the etching shape becomes unacceptable.

The etching of the laminate may be carried out in such a state that the laminate vertically stands up or is horizontally placed. When the etching of the laminate is carried out in such a state that the laminate vertically stands up, upon the removal of the laminate from the etching bath after the completion of the etching, the etching liquid is easily removed and the loss of the etching liquid is small. On the other hand, when the etching of the laminate is carried out in such a state that the laminate is horizontally placed, laminates can be horizontally continuously carried and, thus, advantageously, this method is more suitable for mass production and, in addition, the temperature profile of the etching liquid is small.

If necessary, before etching, the surface of the laminate may be treated with a surfactant to enhance the affinity of the laminate with the etching liquid. When the etching liquid is composed mainly of an inorganic basic aqueous solution, the affinity of the etching liquid for the surface of the insulating layer is sometimes poor. In this case, the treatment with a surfactant is effective for improving the affinity of the laminate for the etching liquid to evenly etch the whole laminate. The type of the surfactant used for this purpose is not particularly limited. In the case of continuous large-scale treatment, however, since the surfactant is gradually incorporated into the etching solution, the use of an ionic surfactant leads to a fear of the surfactant functioning as a buffer and thus deteriorating the etching liquid. In this case, the use of a nonionic surfactant is preferred.

Further, after the treatment with an etching liquid, if necessary, the laminate may be rinsed. When rinsing is not carried out, components of the etching liquid or the residue of the etched insulating layer are unfavorably sometimes left on the surface of the substrate. Rinsing liquids usable for the rinsing treatment include, but are not limited to: a basic aqueous solution; a mixed solution composed of an organic polar solvent and water; a mixed solution composed of an organic polar solvent and an alcohol; and water. The rinsing treatment temperature may be in any temperature range so far as the temperature is above the solidifying point or precipitation point of the rinsing liquid used and below the boiling point of the rinsing liquid. In this case, the separation liquid in the step of separating the dry film resist after the step of etching as such may be used as the rinsing liquid to simultaneously carry out the rising treatment and the separation of the dry film resist.

Organic polar solvents usable in the rinsing liquid include, but are not limited to, n-methyl-2-pyrrolidone (NMP), dimethylformamide, and dimethyl acetamide. Alcohols usable in the rinsing liquid include: aliphatic alcohols such as methanol, ethanol, and propanol; aromatic alcohols such as phenol and cresol; and compounds containing a plurality of hydroxyl groups in one molecule, such as diols.

Separation of Dry Film Resist

The dry film resist is separated under recommendation conditions for the separation of the dry film resist. When the polyimide or the like as the insulating layer used has poor alkali resistance, the use of an aqueous solution of an organic base such as ethanolamine is preferred. The dry film resist is in many cases separated by spraying a basic aqueous solution. Alternatively, dipping or application of ultrasonic wave may be used.

In the case of a laminate produced by hot pressing, in many cases, the surface of the conductive inorganic material layer in the laminate has been roughened for adhesion improvement purposes. When the roughened face has been transferred onto the insulating layer, the dry film resist is embedded in the roughened face. Therefore, severer conditions should be adopted. This is true of the case where the treatment for improving the resistance to the etching liquid has been carried out.

Fifth Invention

Specific preferred embodiments of the production process of an electronic component using a dry film resist, an electronic component, and a suspension for a hard disk drive according to the fifth invention will be described with reference to a process diagram, though the present invention is not limited to these preferred embodiments only. FIG. 1 is a process diagram illustrating a production process of an electronic component by wet etching, wherein a laminate comprised of an insulating layer 1 of a polyimide, a conductive inorganic material layer 3 of copper provided on one side of the insulating layer 1, and a conductive inorganic material layer 2 of SUS provided on the other side of the insulating layer 1 is used as a starting material.

FIG. 1(a) shows the layer construction of the laminate as the starting material. A dry film resist 4 is laminated by roll pressing or flat pressing onto each of the conductive inorganic material layers 2, 3 located respectively on the top surface and the back surface of the laminate to prepare a laminate having a laminate structure shown in FIG. 1(b). A mask for bringing the conductive inorganic material layers 2, 3 to a desired pattern is put on the laminate, and the assembly is then exposed. Nest, development with an aqueous NaHCO$_3$ solution is carried out to form a resist pattern shown in FIG. 1(c). The conductive inorganic material layers 2, 3 are then etched with an aqueous FeCl$_3$ solution to form an etching pattern of the conductive inorganic material layers 2, 3 according to the resist pattern shown in FIG. 1(d). The resist is then dissolved in and separated by an aqueous NaOH solution or an aqueous KOH solution to form an etching pattern of the conductive inorganic material layers 2, 3 shown in FIG. 1(e). Next, a dry film resist 5 is laminated by roll pressing or flat pressing onto the conductive inorganic material layers 2, 3 located on the top surface and the back surface of the laminate shown in FIG. (e) to prepare a laminate having a laminate structure shown in FIG. 1(f). A mask for bringing the insulating layer 1 to a desired pattern is put on the laminate, and the assembly is then exposed and is developed with an aqueous NaHCO$_3$ solution to form a resist pattern shown in FIG. 1(g). Next, the insulating layer 1 is etched with an aqueous basic solution to form an etching pattern of the insulating layer according to the resist pattern shown in FIG. 1(h). Next, the resist is dissolved in and separated by an aqueous NaOH solution or an aqueous KOH solution to an electronic component according to the present invention with an etching pattern has been formed as shown in FIG. 1(i).

Next, each constituent feature of the present invention will be described.

Laminate

The laminate used in the present invention has a layer construction of conductive inorganic material layer—insulating layer—conductive inorganic material layer or a layer construction of insulating layer—conductive inorganic material layer. Here the conductive inorganic material layer used refers to a conductive material layer which is not organic. Examples of conductive inorganic material layers include a pure metal layer of copper, iron or the like, an alloy layer such as stainless steel, a material layer formed by treating the surface of the metal layer, a single crystal silicon layer, an inorganic semiconductor layer, and an metal oxide layer. When a conductive inorganic material layer is provided on both sides of the insulating layer, the conductive inorganic material layers may be the same or different. In particular, in the case of electronic components, copper, copper alloy, iron, nickel, stainless steel and the like are suitable. The conductive inorganic material layer preferably has a thickness in the range of 0.1 μm to 1 mm. In particular, when the conductive inorganic material layer is formed of a metal, the thickness of this layer is more preferably in the range of 0.1 μm to 200 μm.

When the electronic component produced by the production process of an electronic component according to the present invention is a suspension for a hard disk drive, there is no particular limitation so far as one of the conductive inorganic material layers in the laminate as the starting material is formed of stainless steel. From the viewpoint of spring properties required in the suspension or dimensional stability, however, SUS 304 is preferred. More preferred is SUS 304 which has been tension annealed at a temperature of 300° C. or above. The thickness of the stainless steel foil is preferably in the range of 10 to 70 μm, more preferably 15 to 30 μm.

For example, a copper foil or copper alloy foil having a thickness of 3 to 20 μm may be mentioned as the other conductive inorganic material layer in the laminate as the starting material. The copper alloy foil is an alloy foil formed of copper in combination with a dissimilar element such as nickel, silicon, zinc, tin, or beryllium and has a copper content of not less than 70%.

These stainless steel foil and copper alloy foil may be chemically or mechanically surface treated from the viewpoint of improving the adhesion or the like.

The insulating layer in the laminate may be formed of any material without particular limitation so far as the material has insulating properties. From the viewpoints of insulating properties and heat resistance in the form of a thin film, however, at least one layer of a polyimide resin is properly included in the insulating layer. The insulating layer may be in the form of a laminate of a plurality of insulation unit layers, for improving the adhesion to the conductive inorganic material layer. For example, an adhesive insulating layer may be included. In this case, all the layers constituting the insulating layer are formed of a polyimide from the viewpoints of heat resistance and insulating properties. Further, according to required properties, these layers may be different from each other or one another in composition, or alternatively a plurality of layers having an identical composition may be used. An example of the above construction is a laminate of stainless steel—adhesive polyimide A—low-expansion polyimide—adhesive polyimide B—copper. In this case, since the conductive inorganic material layers as adherends are different from each other, one of which is formed of stainless steel and the other is formed of copper, layers (adhesive polyimides A and B) constituting the insulating layer, which are different from each other in composition, are used for good adhesion to the respective adherends.

In the insulating layer of the laminate, at least one of the layers constituting the insulating layer may be formed of a composite composed of an organic material and an inorganic material. Examples of composites include one wherein inorganic fine particles such as inorganic fillers are dispersed in a matrix resin layer and one wherein a fiber sheet such as a glass cloth is impregnated with a matrix resin.

Further, from the viewpoint of preventing the warpage of the substrate, at least one of the layers constituting the insulting layer has a coefficient of thermal expansion (a coefficient of linear thermal expansion) which is relatively close to that of the conductive inorganic material layer (see Japanese Patent Laid-Open No. 157286/1985). The acceptable range of the difference in coefficient of thermal expansion is ±15 ppm. Further, since the conductive inorganic material generally has a coefficient of thermal expansion of not more than 30 ppm, the use of an insulating layer having a coefficient of thermal expansion of not more than 30 ppm is more preferred. When more fully preventing the warpage is desired, the total thickness of the layers having a coefficient of thermal expansion of not more than 30 ppm in the insulating layer is preferably not less than the half of the total thickness of all the layers constituting the insulating layer.

When the insulating layer in the laminate has a multilayer structure of a plurality of polyimide layers, the etching properties of the polyimide layers are important. When the insulating layer in the laminate according to the present invention constituted by two or more insulation unit layers, the ratio of the etching rate of the insulation unit layer having a higher etching rate to the etching rate of the insulation unit layer having a lower etching rate at the time of the wet etching is preferably in the range of 6:1 to 1:1, more preferably in the range of 4:1 to 1:1. When the insulation unit layers falling within this etching rate ratio are selected, a good etching shape can be realized in the insulating layer. In this case, even in the laminate for a wireless suspension which is required to satisfy strict specifications, wet etching can be carried out with high accuracy, and, as compared with dry etching, etching can be carried out in a shorter time with better productivity.

The total thickness of the layers constituting the insulating layer is preferably in the range of 3 to 500 μm. Further, from the viewpoints of productivity and resistance of the dry film resist to the etching liquid, the wet etching time is preferably 10 sec to 30 min. The wet etching time is more preferably 10 sec to 15 min, still more preferably 10 sec to 10 min, most preferably 10 sec to 15 min. When the etching time exceeds 30 min, since the etching liquid is strongly alkaline, the dry film resist is unfavorably separated at the time of etching and this makes it impossible to form a desired etching pattern. When the etching rate under wet etching conditions is large and the insulating layer can be etched by no less than 500 μm in 30 min, a thickness of the layers constituting the insulating layer of 500 μm may be adopted. On the other hand, when the etching rate is small and etching of the thickness 500 μm cannot be realized in 30 min, the acceptable upper limit of the thickness of the insulating layer is such that the insulating layer can be etched in 30 min. More specifically, for example, when the etching rate of the insulating layer is 20 μm/min, the acceptable upper limit of the thickness of the insulating layer is 600 μm. When the etching rate of the insulating layer is 2 μm/min, the acceptable upper limit of the thickness of the insulating layer is 60 μm.

In the wet etching of the insulating layer, for example, in the case of etching of a polyimide as the insulating layer with an alkali solution, an imide bond is reacted with hydroxide ions in the solution to cause ring opening and consequently to give polyamic acid. Even in this state, the solubility in the basic aqueous solution is higher than that of the polyimide in the basic aqueous solution. Further, the amide group in the amic acid is attacked by hydroxide ions and hyrolyzed by to lower the molecular weight of the polymer, and this improves the solubility. When an easily hydrolyzable group is contained in the molecular chain, this site is sometimes hydrolyzed. In general, in the case of insulating layers having an identical structure produced under the same production conditions, the rate is approximately proportional to the number of times of collision of hydroxide ions against imide bond in the polyimide, and this thermodynamically exponentially increases with increasing the temperature.

According to this mechanism, in the case of a linear polymer, when the molecular weight is in a practically usable range, it is considered that the etching rate is not significantly influenced by the molecular weight. In fact, the above hypothesis is supported by data obtained by experiments conducted by the present inventors.

In the laminate as the starting material used in the present invention, the adhesive insulating layer constituting the insulating layer is mainly formed of a polyimide or a resin similar to the polyimide. However, the resin is not particularly limited to this only, and any resin may be used so far as the resin is heat resistant or has insulating properties (the resin usable herein is independent of whether or not imide bond is present). The adhesive polyimide in the present invention refers to a polyimide, which has an adhesive strength to an adherend of not less than 100 g/cm in a 90-degree peel test, and a thermoplastic polyimide is mainly used. However, the adhesive polyimide is not particularly limited to this only.

The laminate as the starting material used in the present invention may be produced by any method without particular limitation so far as the final layer construction of the laminate is the same, and the production method may be properly selected according to properties required of the contemplated product. Examples of production methods include: a method (cast method) wherein a solution of a material for the insulating layer is coated directly onto the conductive inorganic material layer to form one or more stacked layers as the insulating layer, another conductive inorganic material layer is laminated, and the assembly is then thermocompression bonded; a method (film method) wherein an adhesive insulating layer is formed on a previously provided core film as the insulating layer, a conductive inorganic material layer is laminated and thermocompression bonded onto the top surface and the back surface of the adhesive insulating layer; and a method wherein, after the formation of an adhesive insulating layer onto an insulation film, an conductive inorganic material layer is formed by vapor deposition, sputtering, plating or the like.

In the contemplated electronic component, when a conductive inorganic material layer, which cannot be formed by plating, such as a rolled copper foil or stainless steel is indispensable, the use of a laminate produced by a method, wherein conductive inorganic material layers are formed by thermocompression bonding, is preferred. When the conductive inorganic material layer should be very finely patterned in a wiring width of not more than 1 μm, the use of a laminate, in which a conductive inorganic material layer is thinly formed by sputtering or plating, is preferred.

The thickness of the whole laminate including the conductive inorganic material layers may vary depending upon contemplated applications. Preferably, however, the thickness of the whole laminate including the conductive inorganic material layers is in the range of 5 to 2000 μm. In particular, when all the conductive inorganic material layers in the laminate are formed of a metal, the thickness of the whole laminate including the conductive inorganic material layers is preferably in the range of 5 to 1000 μm, particularly preferably in the range of 5 to 500 μm.

Dry Film Resist

A material, which undergoes a change in solubility in a developing solution upon exposure to ultraviolet light (electromagnetic radiation), is used as the dry film resist. The dry film resist refers to a solid film formed by molding a photosensitive resin composition which, upon the application of ultraviolet light (electromagnetic radiation) through an exposure mask having a desired pattern, can be patterned by utilizing the exposed portion and the unexposed portion. Dry film resists are classified into positive-working resists, wherein the exposed portion is eluted into the developing solution, and negative-working resists wherein the unexposed portion is eluted into the developing solution. In the present invention, any of the positive-working or negative-working resists may be used so far as the following property requirements are met.

The dry film resist used in the present invention may be specifically produced by blending a polymeric binder, a monofunctional and/or polyfunctional monomer, a photopolymerization initiator, and other additives together, and, in general, a mixed solution composed of these components is coated onto a substrate such as a film.

The polymeric binder as one component of the dry film resist used in the present invention is incorporated into the dry film resist for retaining the form of the dry film resist or for imparting developability, that is, is a component as a skeleton of the dry film resist. An acrylic resin may be mainly used as this polymeric binder, and other examples of polymeric binders usable herein include, but are not particularly limited to, polyesters, polyamides, polyethers, and polyallylamines. Further, since the form of the dry film resist should be retained, the weight average molecular weight of the polymeric binder is preferably not less than 6000. The weight average molecular weight is preferably not more than 100000 from the viewpoint of developability. However, the weight average molecular weight of the polymeric binder is not particularly limited to the above defined range.

In many cases, an acidic functional group in the case of alkali development and a basic functional group in the case of acid development are introduced into the polymeric binder as one component of the dry film resist used in the present invention, for imparting developability. When the functional group is a polyfunctional monomer or a monofunctional monomer, upon the application of ultraviolet light or the like, radicals generated by a photopolymerization initiator induces a reaction of the polyfunctional or monofunctional monomer with the polymeric binder or other polyfuncitonal monomer to form a crosslinked structure which functions to reduce the solubility of the dry film resist.

Specific examples of such functional groups include, but are not particularly limited to, 1,6-hexanediol di(meth)acrylate, 1,4-cyclohexanediol di(meth)acrylate, polypropylene glycol di(meth)acrylate, polyethylene glycol di(meth)acrylate, polyoxyalkylene glycol di(meth)acrylates such as polyoxyethylene polyoxypropylene glycol di(meth)acrylate, 2-di(p-hydroxyphenyl)propane di(meth)acrylate, glycerol tri(meth)acrylate, trimethylolpropane tri(meth)acrylate, polyoxypropyl trimethylolpropane tri(meth)acrylate, polyoxyethyltrimethylolpropane triacrylate, dipentaerythritol penta(meth)acrylate, trimethylolpropane triglycidyl ether tri(meth)acrylate, bisphenol A diglycidyl ether di(meth)acrylate, 2,2-bis (4-methacryloxypentaethoxyphenyl)propane, urethane group-containing polyfunctional (meth)acrylate, and polyfunctional methacrylate or acrylate containing bisphenol A in its structure.

The photopolymerization initiator as one component of the dry film resist used in the present invention functions to absorb electromagnetic wave, particularly ultraviolet light to cause cleavage and/or hydrogen abstraction from other molecule to generate radicals, and examples thereof include, but are not particularly limited to: quinones, such as 2-ethylanthraquinone, octaethylanthraquinone, 1,2-benzanthraquinone, 2,3-benzanthraquinone, 2-phenylanthraquinone, 2,3-diphenylanthraquinone, 1-chloroanthraquinone, 2-chloroanthraquinone, 2-methylanthraquinone, 1,4-naphthoquinone, 9,10-phenanthraquinone, 2-methyl-1,4-naphthoquinone, 2,3-dimethylanthraquinone, and 3-chloro-2-methylanthraquinone; aromatic ketones, such as benzophenone, Michler's ketone [4,4'-bis (dimethylamino)benzophenone], and 4,4'-bis(diethylamino)benzophenone; benzoin ethers, such as benzoin, benzoin ethyl ether, benzoin phenyl ether, methyl benzoin, and ethyl benzoin; biimidazole compounds, such as benzyl dimethyl ketal, benzyl diethyl ketal, and 2-(o-chlorophenyl)-4,5-diphenylimidazolyl dimer; combinations of thioxanthones with alkylaminobenzoic acids, for example, a combination of ethylthioxanthone with ethyl dimethylaminobenzoate, a combination of 2-chlorothioxanthone with ethyl dimethylaminobenzoate, a combination of isopropylthioxanthone with ethyl dimethylaminobenzoate, or a combination of 2-(o-chlorophenyl)-4,5-diphenylimidazolyl dimer with Michler's ketone; acridines, such as 9-phenylacryidine; and oxime esters, such as 1-phenyl-1,2-propanedione-2-o-benzoyloxime and 1-phenyl-1,2-propanedion-2-(o-ethoxycarbonyl)oxime.

Other additives to the dry film resist used in the present invention include, but are not particularly limited to, dyes or pigments for enhancing absorption efficiency of applied electromagnetic wave, plasticizers for imparting flexibility to the dry film per se.

The dry film resist used in the present invention is preferably developable and separable with an aqueous alkali solution. The dry film resist, however, is not particularly limited so far as the resist is resistant to the etching liquid and can maintain the pattern shape during wet etching of the insulating layer. Dry film resists, which are developable and separable with an aqueous alkali solution, include, for example, SUNFORT (tradename) series manufactured by Asahi Kasei Kogyo K.K.; and ALPHO (tradename) series and LAMINAR (tradename) series manufactured by Nichigo-Morton Co., Ltd. Further, commercially available lactic acid solution development-lactic acid solution separation type dry film resists such as SFP-00GI-25 AR (tradename; manufactured by Nippon Steel Chemical Co., Ltd.) are also usable.

In the wet etching of the insulating layer in the laminate used in the present invention, in many cases, concaves and convexes such as wiring of the conductive inorganic material layer are formed on the surface of the insulating layer. In this case, the thickness of the dry film resist is preferably not less than 1.1 times the thickness of the conductive inorganic material layer. When the thickness of the dry film resist is less than 1.1 times the thickness of the conductive inorganic material layer, after the lamination of the dry film resist, there is a fear of convexes breaking through the dry film resist and consequently being exposed. This is causative of a poor etching shape. In short, a good pattern shape can be obtained when the thickness of the dry film resist is not less than 1.1 times the maximum thickness of the conductive inorganic material layer located on the side in which a pattern is to be formed by the dry film resist.

In general, the aspect ratio of the commercially available dry film resist is about 2 to 1, and, when the formation of a fine wiring pattern is contemplated, a smaller thickness of the dry film resist is more advantageous. Since, however, the above-described problem exists, the thickness of the dry film resist should be larger than the thickness of the conductive inorganic material layer provided in the laminate.

Conventional lamination methods such as roll pressing or flat pressing may be used in the lamination of the dry film resist.

When the insulating layer in the laminate used in the present invention is thin, the rigidity of the laminate is low in such a state that the inorganic material layer has been patterned into a desired shape. Due to this nature, when the laminate is laminated by roll pressing sheet by sheet, the substrate is disadvantageously warped. The warpage of the substrate causes a significant misalignment at the time of exposure in a later step. This misalignment is causative of a misalignment of the pattern of the conductive inorganic material layer with the pattern of the insulating layer. For this reason, the warpage of the substrate should be minimized. To this end, when the dry film resist is laminated onto the substrate on the sheet, the use of a flat press is preferred for the preparation of products with high accuracy as designed.

Further, in laminating the dry film resist onto the etched conductive inorganic material layer, the inclusion of air bubbles, for example, the inclusion of air bubbles between edges of concaves and convexes of the conductive inorganic material layer formed by etching and the dry film resist, causes contact failure at that portion. This results in an unacceptable poor etching shape. Since the etching rate of the wet etching is several tens of times larger than the etching rate of plasma etching as the dry process, the contact failure is likely to cause etching of a site not to be etched. In this case, the pattern defect extends in a wider area than that in the case of dry process. To solve this problem, in the case of products of which high-accuracy patterning is required, the lamination is carried out under reduced pressure or under vacuum, preferably at a vapor pressure of not more than 80 KPa ($\approx$ 600 mmHg), more preferably not more than 40 KPa ($\approx$ 300 mmHg), most preferably not more than 6.7 KPa ($\approx$ 50 mmHg), from the viewpoint of removing air bubbles.

When a dry film resist having a smooth surface is used, even flat pressing under reduced pressure sometimes causes not less than about 20% of the surface of the substrate to be accounted for by air bubbles. In this case, when a dry film resist having on its surface fine concaves and convexes is used and is laminated so that the concaves and convexes face the substrate side, the fine concaves and convexes function as a passage for the escape of the air bubbles. This can prevent the occurrence of the above unfavorable phenomenon and is very effective for removing air bubbles.

That is, when the dry film resist is laminated in sheet-by-sheet treatment, flat pressing under reduced pressure and the use of a dry film resist having on its surface concaves and convexes are preferred for the preparation of products with good dimensional accuracy.

Regarding the concaves and convexes provided on the surface of the dry film resist, preferably, the dry film resist has a surface roughness Rz in the range of 0.5 to 50 µm. The concaves and convexes may be formed by any method without particular limitation. For example, after bringing a photosensitive resin composition to a dry film resist by coating or molding, the dry film resist is embossed to form concaves and convexes. Alternatively, a method may be used wherein a photosensitive resin composition in a solution form is coated onto a film having concaves and convexes and the coating is dried to prepare a dry film resist with concaves and convexes formed thereon.

Lamination Method

When high-accuracy processing is required, the dry film resist is preferably laminated under conditions of temperature 20 to 100° C. and pressure 0.05 to 0.3 MPa (0.5 to 3 kgf/cm$^2$). In this case, regarding the atmosphere in the lamination, the lamination is preferably carried out under reduced pressure or under vacuum, preferably at a vapor pressure of not more than 80 KPa ($\approx$ 600 mmHg), more preferably not more than 40 KPa ($\approx$ 300 mmHg), most preferably not more than 6.7 KPa ($\approx$ 50 mmHg). Vacuum suction time is regulated according to sheet size of the laminate to be processed. Specifically, the vacuum suction time is set so that, at the time of contact bonding, air bubbles are not left between the dry film resist and the laminate sheet. Lamination conditions vary depending upon Tg of the dry film resist used, and the lamination is carried out at a temperature high enough to fully cover a portion between patterns of the conductive inorganic material layer. In this case, when the temperature is excessively high, the sensitivity at the time of exposure is unstable.

The development and separation of the dry film resist are preferably carried out using a developing solution or a separation solution corresponding to the dry film resist used under recommendation conditions. However, the method for the development and separation of the dry film resist is not particularly limited. As described above, development with an aqueous inorganic alkali solution is preferred from the viewpoint of waste treatment. Development methods include, but are not limited to, dipping, air spray, and submerged spray.

When the dry film resist is used in wet etching of the polyimide, since the etching liquid contains a highly reactive component in a high concentration, as compared with other cases, it is difficult for the dry film resist to maintain the pattern. To overcome this problem, the following method may be used. After the dry film resist is laminated followed by exposure and development to form a pattern, the assembly is heated. Alternatively, in the case of a negative-working dry film resist, an ionizing radiation, preferably ultraviolet light, is again applied. This method can strengthen the pattern of the dry film resist and can increase pattern shape retention time upon contact with the etching liquid.

The heating is carried out at a temperature in the range of 30 to 200° C., preferably 70 to 150° C., and the treatment time is suitably 10 sec to 20 min. The treatment method is not particularly limited, and examples thereof include a method wherein the assembly is allowed to stand on a hot plate, a method wherein the assembly is placed in an oven, a method wherein the assembly is treated with hot air, and a method wherein an infrared heater is used.

When the pattern shape retention is improved by the application of ultraviolet light (electromagnetic radiation) after the formation of a resist pattern, the application of energy at not less than 5 mJ with the same wavelength as used in the pattern-wise exposure is preferred.

In this case, when the dry film resist is not in intimate contact with the laminate, the dry film resist is disadvantageously separated at the time of wet etching. For this reason, a 90-degree peel strength of not less than 200 g/cm is preferably maintained.

In the case of a laminate produced by hot pressing, in many cases, the surface of the conductive inorganic material layer in the laminate has been roughened for adhesion improvement purposes. When the roughened face has been transferred onto the insulating layer, the dry film bites into the roughened face. Therefore, adhesive strength is advantageously likely to be ensured.

Etching Liquid

Various etching liquids as described in the column of "BACKGROUND OF THE INVENTION," may be used as the etching liquid which can be applied to the dry film resist used in the present invention. The production process of an electronic component according to the present invention aims at high productivity, low process cost (apparatus cost, maintenance cost, and waste treatment cost), and low toxicity. Therefore, the etching liquid preferably has low toxicity and high service life. Preferably, the etching liquid does not contain highly toxic hydrazine. However, hydrazine may be contained as an additive in an amount of not more than 10% by weight based on the etching liquid. When the content of hydrazine exceeds 10%, etching shape is likely to be unstable making it difficult to process control. As described in Japanese Patent Laid-Open No. 301981/1993, the behavior of hydrazine in etching is unstable, and a lower hydrazine content is preferred from the viewpoints of process control and working environment.

The etching liquid which can be applied to the dry film resist used in the present invention should have etching rate high enough to etch polyimide within the pattern shape retention time of the dry film resist. Specifically, an aqueous alkali solution composed mainly of an inorganic alkali disclosed in Japanese Patent Laid-Open Nos. 97081/1998 and 195214/1998 is most preferred. The etching liquid usable in the present invention is basically an aqueous solution containing one of or a mixture of two or more of an inorganic alkali, an aliphatic amine (diamine), an aliphatic alcohol, and an aliphatic amino alcohol and, as an additive, urea or an organic polar solvent and preferably has a pH value of more than 9.

The etching treatment temperature is above the solidifying point or precipitation temperature of the etching liquid and below the boiling point of the etching liquid and, from the viewpoints of productivity and process control, is 10 to 120° C., preferably 30 to 95° C., more preferably 50 to 90° C. In the case of an etching liquid containing a component which is volatile at the treatment temperature, treatment for a long period of time sometimes causes a change in composition of the etching liquid. Therefore, the treatment is preferably carried out at a temperature such that the evaporation of the components of the etching liquid can be avoided. This, however, is not essential.

The smaller the temperature profile within the etching bath, the better the results. The temperature profile is preferably within ±1° C., more preferably within ±0.5° C.

It has been experientially confirmed that, based on the mechanism of wet etching of polyimide, the etching rate exponentially increases with increasing the etching temperature. When the treatment is carried out under conditions which provide a higher etching rate, the dependency of the etching rate upon the temperature becomes larger. Therefore, when temperature profile exists within the etching bath, a variation in pattern accuracy within the plane of the substrate is large. This is particularly significant when the etching rate of the insulating layer is large. Therefore, the minimization of the temperature profile is effective for uniform processing.

Etching methods include dipping, air spray, submerged spray, and dipping+application of ultrasonic wave. In the case of air spray, however, components of the etching liquid are significantly evaporated making it difficult to perform the liquid control. Preferred are dipping or submerged spray. Submerged spray is preferred from the viewpoint of further reducing the taper angle of the etching shape.

When ultrasonic wave is applied to the etching liquid, conditions for the application of ultrasonic wave should be carefully set so as to avoid an unfavorable phenomenon such that, upon the application of ultrasonic wave, the dry film resist is partially separated and the etching shape becomes unacceptable.

The etching of the laminate may be carried out in such a state that the laminate vertically stands up or is horizontally placed. When the etching of the laminate is carried out in such a state that the laminate vertically stands up, upon the removal of the laminate from the etching bath after the completion of the etching, the etching liquid is easily removed and the loss of the etching liquid is small. On the other hand, when the etching of the laminate is carried out in such a state that the laminate is horizontally placed, laminates can be horizontally continuously carried and, thus, advantageously, this method is more suitable for mass production and, in addition, the temperature profile of the etching liquid is small.

Separation of Dry Film Resist

The dry film resist is separated under recommendation conditions for the separation of the dry film resist. When the polyimide or the like as the insulating layer used has poor alkali resistance, the use of an organic alkali such as ethanolamine is preferred. The dry film resist is in many cases separated by spraying a basic aqueous solution. Alternatively, dipping or application of ultrasonic wave may be used.

In the case of a laminate produced by hot pressing, in many cases, the surface of the conductive inorganic material layer in the laminate has been roughened for adhesion improvement purposes. When the roughened face has been transferred onto the insulating layer, the dry film resist is embedded in the roughened face. Therefore, severer conditions should be adopted. This is true of the case where the treatment for improving the resistance to the etching liquid has been carried out.

EXAMPLE A

Etchability Test

A thermoplastic polyimide A to be used in an adhesive insulating layer on copper side, a thermoplastic polyimide B to be used in an adhesive insulating layer on SUS side, and a low-expansion polyimide to be used in a core insulating layer were provided. An alkali-amine polyimide etching liquid TPE-3000 (tradename) manufactured by Toray Engineering Co., Ltd. was provided as an etching liquid used in the etching test.

Each of these resins was bar coated to a film thickness of 20 to 40 µm on a 20 µm-thick SUS 304 foil having a size of 15 cm×15 cm, and the film was heat treated to form each polyimide film on SUS. These coatings were taken off into a size of about 1.5 cm in length×about 2 cm in width. The center portion was cut with a cutter knife, and the film thickness was then measured as an initial film thickness with a tracer type film thickness meter Dektak. Thereafter, the samples were dipped (immersed) in a polyimide etching liquid TPE-3000, which had been kept at 80° C. and had been stirred with a magnetic stirrer to such an extent that a whirlpool was formed, and the film thickness was measured with Dektak every immersion time in the same place as that where the initial film thickness was measured. The film thickness after immersion was subtracted from the initial film thickness to determine a reduction level of film thickness and to determine the etching rate. The results are shown in Table A below.

TABLE A1

| Sample | Etching rate, µm/min |
| --- | --- |
| Low-expansion polyimide | 14.8 |
| Thermoplastic polyimide A (copper side) | 14.8 |
| Thermoplastic polyimide B (SUS side) | 8.3 |

The above polyimides were used to prepare a laminate having a layer construction of SUS 304H-TA foil (tradename; thickness 20 µm, manufactured by Nippon Steel Chemical Co., Ltd.)—thermoplastic polyimide B (thickness 1.5 µm)—low-expansion polyimide (thickness 14.5 µm)— thermoplastic polyimide A (thickness 1.5 μm)—rolled copper foil C 7025 (tradename; thickness 18 μm, manufactured by Olin Corp.) which was used in the following experiment.

Evaluation of Dusting

The laminate with a mask provided on the SUS side was immersed in a ferric chloride solution to etch the copper foil. A 50 μm-thick alkali development-type dry film resist was laminated by a hot laminator onto the exposed surface of the adhesive layer at a speed of 6.5 m/min under conditions of roll surface temperature 105° C. and line pressure 2 to 4 kg/cm, and the laminate was then allowed to stand at room temperature for 15 min. Thereafter, exposure was carried out using a predetermined mask by means of an intimate contact exposure system at 100 mJ/cm$^2$. After standing at room temperature for 15 min, the dry film resist was developed with a 1 wt % aqueous $Na_2CO_3$ solution under conditions of temperature 30° C. and spray pressure 2 kg for 40 sec. Thereafter, the laminate was dried and was then immersed in an etching liquid TPE-3000 for polyimide (tradename; manufactured by Toray Engineering Co., Ltd.) which had been stirred at 70° C. with a magnetic stirrer to such an extent that a whirlpool had been formed. At the time when the polyimide film had been fully removed in the form of the mask, the laminate was taken out of the etching liquid, and the dry film resist was separated with a 3 wt % aqueous NaOH solution at 50° C. at a spray pressure of 1 kg to prepare an insulating layer. The insulating layer thus obtained was subjected to plasma treatment under conditions of pressure 25 to 30 Pa, process gas $NF_3/O_2$=10/90%, and frequency 40 kHz, and dusting level was measured for the samples before and after the plasma treatment (sample A is a sample before the plasma treatment, and sample B a sample after the plasma treatment) according to the following procedure.

Previously filtered distilled water (hereinafter referred to as "blank") and fully cleaned beaker and tweezers were provided.

Insulating layers (each four patterns) randomly selected from each sample prepared in the above steps were placed in the beaker, and a given amount of the blank was poured into the beaker. The beaker was then placed within an ultrasonic irradiation system, and ultrasonic wave was applied for one min (extraction). After the application of ultrasonic wave, the beaker was taken out of the system, and the sample was taken out with the tweezers. After taking the sample out of the beaker, 30 ml of the extract was set in a measuring apparatus equipped with an automatic fine particle measuring device for a liquid manufactured by HIAC/ROYCO, a suction-type semi-automatic sampling device, and a laser diode light blocking-type sensor to measure the amount of particles. To determine a blank value, the same measurement as described above was carried out except that the sample was not placed. The measuring apparatus was cleaned for each measurement. The blank value was subtracted from the measured value to determine the measured value of the sample. The measurement was carried out five times per sample, and the average of the five values was regarded as the final measured value. The measured value for the sample A before the plasma treatment and the measured value for the sample B after the plasma treatment thus obtained are shown in Table A2 below. The amount of particles in each sample column is the average of four patterns.

TABLE A2

| Particle diameter, μm | Sample A, number of particles | Sample B, number of particles |
| --- | --- | --- |
| 0.5 μm | 71177 | 56000 |
| 1.0 μm | 8683 | 2800 |
| 2.0 μm | 3311 | 1200 |
| 3.0 μm | 880 | 450 |
| 5.0 μm | 306 | 140 |
| 10.0 μm | 121 | 18 |
| 15.0 μm | 52 | 5 |
| 25.0 μm | 12 | 1 |

As is apparent from Table A2, the dusting level in the sample B subjected to the plasma treatment is smaller than that in the sample A not subjected to the plasma treatment.

According to the insulator in the present invention, since the insulating layer, which has been patterned by the wet process, is subjected to plasma treatment, dusting of the end face of the insulating layer, which comes into contact with the etching liquid, is inhibited upon ultrasonic wave application, indicating that the surface of the insulating layer has been modified. Therefore, when the insulator according to the present invention is applied to electronic circuit components, the level of dusting is low. This can enhance the reliability of electronic circuit components to which the wet process has been applied. In particular, in the case of a suspension for a hard disk drive, the area of the insulating layer to be removed by etching is large and, at the same time, a fine pattern is required. Therefore, the effect attained by the application of the wet etching is large. The insulator of the present invention enhances the reliability of the wet etching and thus is suitable as an insulating layer in the suspension for a hard disk drive.

EXAMPLE B

Etchability Test

A thermoplastic polyimide A used in an adhesive insulating layer on copper side, a thermoplastic polyimide B used in an adhesive insulating layer on SUS side, and a low-expansion polyimide used in a core insulating layer were provided. An alkali-amine polyimide etching liquid TPE-3000 (tradename) manufactured by Toray Engineering Co., Ltd. was provided as an etching liquid used in the etching test.

Each of these resins was bar coated to a film thickness of 20 to 40 μm on a 20 μm-thick SUS 304 foil having a size of 15 cm×15 cm, and the film was heat treated to form each polyimide film on SUS. These coatings were taken off into a size of about 1.5 cm in length×about 2 cm in width. The center portion was cut with a cutter knife, and the film thickness was then measured as an initial film thickness with a tracer type film thickness meter Dektak. Thereafter, the samples were immersed in a polyimide etching liquid TPE-3000, which had been kept at 80° C. and had been stirred with a magnetic stirrer to such an extent that a whirlpool was formed, and the film thickness was measured with Dektak every immersion time in the same place as that where the initial film thickness was measured. The film thickness after immersion was subtracted from the initial film thickness to determine a reduction level of film thickness and to determine the etching rate. The results are shown in Table B1 below.

TABLE B1

| Sample | Etching rate, μm/min |
| --- | --- |
| Low-expansion polyimide | 14.8 |
| Thermoplastic polyimide A (copper side) | 14.8 |
| Thermoplastic polyimide B (SUS side) | 8.3 |

The above polyimides were used to prepare a laminate having a layer construction of SUS 304H-TA foil (tradename; thickness 20 μm, manufactured by Nippon Steel Chemical Co., Ltd.)—thermoplastic polyimide B (thickness 1.5 μm)—low-expansion polyimide (thickness 14.5 μm)—thermoplastic polyimide A (thickness 1.5 μm)—rolled copper foil C 7025 (tradename; thickness 18 μm, manufactured by Olin Corp.) which was used in the following experiment.

Evaluation of Dusting

The laminate with a mask provided on the SUS side was immersed in a ferric chloride solution to etch the copper foil. A 50 μm-thick alkali development-type dry film resist was laminated by a hot laminator onto the exposed surface of the adhesive layer at a speed of 6.5 m/min under conditions of roll surface temperature 105° C. and line pressure 2 to 4 kg/cm, and the laminate was then allowed to stand at room temperature for 15 min. Thereafter, exposure was carried out using a predetermined mask by means of an intimate contact exposure system at 100 mJ/cm$^2$. After standing at room temperature for 15 min. the dry film resist was developed with a 1 wt % aqueous $Na_2CO_3$ solution under conditions of temperature 30° C. and spray pressure 2 kg for 40 sec. Thereafter, the laminate was dried and was then immersed in an etching liquid TPE-3000 for polyimide (tradename; manufactured by Toray Engineering Co., Ltd.) which had been stirred at 70° C. with a magnetic stirrer to such an extent that a whirlpool had been formed. At the time when the polyimide film had been fully removed in the form of the mask, the laminate was taken out of the etching liquid, and the dry film resist was separated with a 3 wt % aqueous NaOH solution at 50° C. at a spray pressure of 1 kg to prepare an insulating layer. The insulating layer thus obtained was placed in a clean oven manufactured by Tabai Espec Corp. at 200° C. for 10 min to perform heat treatment, and dusting level was measured for the samples before and after the heat treatment (sample A is a sample before the heat treatment, and sample B a sample after the heat treatment) according to the following procedure.

Previously filtered distilled water (hereinafter referred to as "blank") and fully cleaned beaker and tweezers were provided.

Insulating layers (each four patterns) randomly selected from each sample prepared in the above steps were placed in the beaker, a given amount of the blank was poured into the beaker. The beaker was then placed within an ultrasonic irradiation system, and ultrasonic wave was applied for one min (extraction). After the application of ultrasonic wave, the beaker was taken out of the system, and the sample was taken out with the tweezers. After taking the sample out of the beaker, 30 ml of the extract was set in a measuring apparatus equipped with an automatic fine particle measuring device for a liquid manufactured by HIAC/ROYCO, a suction-type semi-automatic sampling device, and a laser diode light blocking-type sensor to measure the amount of particles. To determine a blank value, the same measurement as described above was carried out except that the sample was not placed. The measuring apparatus was cleaned for each measurement. The blank value was subtracted from the measured value to determine the measured value of the sample. The measurement was carried out five times per sample, and the average of the five values was regarded as the final measured value. The measured value for the sample A before the heat treatment and the measured value for the sample B after the heat treatment thus obtained are shown in Table B2 below. The amount of particles in each sample column is the average of four patterns.

TABLE B2

| Particle diameter, μm | Sample A, number of particles | Sample B, number of particles |
| --- | --- | --- |
| 0.5 μm | 71000 | 56000 |
| 1.0 μm | 8700 | 3900 |
| 2.0 μm | 3300 | 2300 |
| 3.0 μm | 880 | 520 |
| 5.0 μm | 300 | 190 |
| 10.0 μm | 120 | 78 |
| 15.0 μm | 52 | 20 |
| 25.0 μm | 12 | 1 |

As is apparent from Table B2, the dusting level in the sample B subjected to the heat treatment is smaller than that in the sample A not subjected to the heat treatment.

According to the insulator in the present invention, since the insulating layer, which has been patterned by the wet process, is subjected to heat treatment, dusting of the end face of the insulating layer, which comes into contact with the etching liquid, is inhibited upon ultrasonic wave application, indicating that the surface of the insulating layer has been modified. Therefore, when the insulator according to the present invention is applied to electronic circuit components, the level of dusting is low. This can enhance the reliability of electronic circuit components to which the wet process has been applied. In particular, in the case of a suspension for a hard disk drive, the area of the insulating layer to be removed by etching is large and, at the same time, a fine pattern is required. Therefore, the effect attained by the application of the wet etching is large. The insulator of the present invention enhances the reliability of the wet etching and thus is suitable as an insulating layer in the suspension for a hard disk drive.

EXAMPLE C

Etchability Test

A thermoplastic polyimide A used in an adhesive insulating layer on copper side, a thermoplastic polyimide B used in an adhesive insulating layer on SUS side, and a low-expansion polyimide used in a core insulating layer were provided. An alkali-amine polyimide etching liquid TPE-3000 (tradename) manufactured by Toray Engineering Co., Ltd. was provided as an etching liquid used in the etching test.

Each of these resins was bar coated to a film thickness of 20 to 40 μm on a 20 μm-thick SUS 304 foil having a size of 15 cm×15 cm, and the film was heat treated to form each polyimide film on SUS. These coatings were taken off into a size of about 1.5 cm in length×about 2 cm in width. The center portion was cut with a cutter knife, and the film thickness was then measured as an initial film thickness with a tracer type film thickness meter Dektak. Thereafter, the samples were immersed in a polyimide etching liquid TPE-3000, which had been kept at 80° C. and had been stirred with a magnetic stirrer to such an extent that a whirlpool was formed, and the film thickness was measured with Dektak every immersion time in the same place as that where the initial film thickness was measured. The film thickness after immersion was subtracted from the initial film thickness to determine a reduction level of film thickness and to determine the etching rate. The results are shown in Table C1 below.

TABLE C1

| Sample | Etching rate, µm/min |
|---|---|
| Low-expansion polyimide | 14.8 |
| Thermoplastic polyimide A (copper side) | 14.8 |
| Thermoplastic polyimide B (SUS side) | 8.3 |

The above polyimides were used to prepare a laminate having a layer construction of SUS 304 H-TA foil (tradename; thickness 20 µm, manufactured by Nippon Steel Chemical Co., Ltd.)—thermoplastic polyimide B (thickness 1.5 µm)—low-expansion polyimide (thickness 14.5 µm)—thermoplastic polyimide A (thickness 1.5 µm)—rolled copper foil C 7025 (tradename; thickness 18 µm, manufactured by Olin Corp.) which was used in the following experiment.

Evaluation of Dusting

The laminate with a mask provided on the SUS side was immersed in a ferric chloride solution to etch the copper foil. A 50 µm-thick alkali development-type dry film resist was laminated by a hot laminator onto the exposed surface of the adhesive layer at a speed of 6.5 m/min under conditions of roll surface temperature 105° C. and line pressure 2 to 4 kg/cm, and the laminate was then allowed to stand at room temperature for 15 min. Thereafter, exposure was carried out using a predetermined mask by means of an intimate contact exposure system at 100 mJ/cm$^2$. After standing at room temperature for 15 min, the dry film resist was developed with a 1 wt % aqueous $Na_2CO_3$ solution under conditions of temperature 30° C. and spray pressure 2 kg for 40 sec. Thereafter, the laminate was dried and was then immersed in an etching liquid TPE-3000 for polyimide (tradename; manufactured by Toray Engineering Co., Ltd.) which had been stirred at 70° C. with a magnetic stirrer to such an extent that a whirlpool had been formed. At the time when the polyimide film had been fully removed in the form of the mask, the laminate was taken out of the etching liquid, and the dry film resist was separated with a 3 wt % aqueous NaOH solution at 50° C. at a spray pressure of 1 kg to prepare an insulating layer. The insulating layer thus obtained was immersed in a treatment liquid, which had been stirred at room temperature, for 3 min, was then washed with water at 60° C., and was dried. The treatment liquid was prepared by previously mixing 500 g of acetic anhydride with 5 g of triethylamine, and dusting level was measured for the samples before and after the treatment with the dehydration catalyst (sample A is a sample before the treatment, and sample B a sample after the treatment) according to the following procedure.

Previously filtered distilled water (hereinafter referred to as "blank") and fully cleaned beaker and tweezers were provided.

Insulating layers (each four patterns) randomly selected from each sample prepared in the above steps were placed in the beaker, a given amount of the blank was poured into the beaker. The beaker was then placed within an ultrasonic irradiation system, and ultrasonic wave was applied for one min (extraction). After the application of ultrasonic wave, the beaker was taken out of the system, and the sample was taken out with the tweezers. After taking the sample out of the beaker, 30 ml of the extract was set in a measuring apparatus equipped with an automatic fine particle measuring device for a liquid manufactured by HIAC/ROYCO, a suction-type semi-automatic sampling device, and a laser diode light blocking-type sensor to measure the amount of particles. To determine a blank value, the same measurement as described above was carried out except that the sample was not placed. The measuring apparatus was cleaned for each measurement. The blank value was subtracted from the measured value to determine the measured value of the sample. The measurement was carried out five times per sample, and the average of the five values was regarded as the final measured value. The measured value for the sample A before the treatment with the dehydration catalyst and the measured value for the sample B after the treatment with the dehydration catalyst thus obtained are shown in Table C2 below. The amount of particles in each sample column is the average of four patterns.

TABLE C2

| Particle diameter, µm | Sample A, number of particles | Sample B, number of particles |
|---|---|---|
| 0.5 µm | 71177 | 56000 |
| 1.0 µm | 8683 | 4800 |
| 2.0 µm | 3311 | 1800 |
| 3.0 µm | 880 | 650 |
| 5.0 µm | 306 | 240 |
| 10.0 µm | 121 | 98 |
| 15.0 µm | 52 | 35 |
| 25.0 µm | 12 | 8 |

As is apparent from Table C2, the dusting level in the sample B subjected to the heat treatment is smaller than that in the sample A not subjected to the heat treatment.

According to the insulator in the present invention, since the insulating layer, which has been patterned by the wet process, is subjected to the treatment with the dehydration catalyst, dusting of the end face of the insulating layer, which comes into contact with the etching liquid, is inhibited upon ultrasonic wave application, indicating that the surface of the insulating layer has been modified. Therefore, when the insulator according to the present invention is applied to electronic circuit components, the level of dusting is low. This can enhance the reliability of electronic circuit components to which the wet process has been applied. In particular, in the case of a suspension for a hard disk drive, the area of the insulating layer to be removed by etching is large and, at the same time, a fine pattern is required. Therefore, the effect attained by the application of the wet etching is large. The insulator of the present invention enhances the reliability of the wet etching and thus is suitable as an insulating layer in the suspension for a hard disk drive.

EXAMPLE D

Wet Etchable Laminate

[Etchable Test]

For the production of a sample for the formation of an insulating layer, PAA-A (tradename; polyamic acid varnish manufactured by Mitsui Chemicals Inc.) and EN-20 (tradename; polyimide varnish manufactured by New Japan Chemical Co., Ltd.) were provided as an adhesive resin.

APIKAL NPI (tradename; polyimide film (thickness 12.5 µm) manufactured by Kanegafuchi Chemical Ind. Co., Ltd.) was provided as a low-expansion polyimide to be functioned as a core. An alkali-amine polyimide etching liquid TPE-3000 (tradename; manufactured by Toray Engineering Co., Ltd.) was provided as an etching liquid used in the etching test.

The adhesive resin varnish EN-20 (tradename) was spin coated to a film thickness of 20 to 40 µm onto a 100 µm-thick SUS 304 plate having a size of 15 cm×15 cm, and the coating was dried in an oven at 180° C. for 30 min. PAA-A (tradename) was an amic acid varnish, and, after the solvent was removed in the step of drying at 120° C. for 15 min, the amic acid varnish was thermally imidated by a predetermined procedure to form a polyimide. Each dried product was taken off into a size of about 1.5 cm in length×about 2 cm in width. The center portion was cut with a cutter knife, and the film thickness was then measured as an initial film thickness with a tracer type film thickness meter Dektak 16000 (tradename; manufactured by Sloan Technology). Thereafter, the samples were immersed in a polyimide etching liquid TPE-3000 (tradename; manufactured by Toray Engineering Co., Ltd., which had been kept at 70° C. and had been stirred with a magnetic stirrer to such an extent that a whirlpool was formed, and the film thickness was measured with a tracer type film thickness meter Dektak 16000 (tradename; manufactured by Sloan Technology) every immersion time in substantially the same place as that where the initial film thickness was measured. The film thickness after immersion was subtracted from the initial film thickness to determine a reduction level of film thickness, and the reduction level of the film thickness per min was regarded as the etching rate (unit: µm/min). The results are shown in Table D1 below.

TABLE D1

| Sample | Etching rate, µm/min |
| --- | --- |
| EN-20 | About 11 µm/min |
| PAA-A | About 1 µm/min |
| APIKAL NPI | About 20 µm/min |

[Evaluation of Etchability]

EN-20 (tradename; polyimide varnish manufactured by New Japan Chemical Co., Ltd.) was coated on both sides of a 12.5 µm-thick polyimide film APIKAL NPI film (tradename; manufactured by Kanegafuchi Chemical Ind. Co., Ltd.) to a film thickness of 1.5 µm±0.3 µm on a dry basis, and the coatings were dried under the above-described drying conditions. The film thus obtained was designated as a film A with an adhesive layer.

Likewise, PAA-A (tradename; manufactured by Mitsui Chemicals Inc.) was coated on both sides of a 12.5 µm-thick APIKAL NPI film (tradename; manufactured by Kanegafuchi Chemical Ind. Co., Ltd.) to form a film which was designated as a film B with an adhesive layer. For the films A and B with an adhesive layer, the etching rate ratio is shown in Table D2 below.

TABLE D2

| | Etching rate | | Thickness of low-expansion layer: | Etching |
| --- | --- | --- | --- | --- |
| | Low-expansion layer | Adhesive layer | total thickness of adhesive layer | rate ratio |
| Film A with adhesive layer | About 20 µm/min | About 11 µm/min | 5:2 | 20:11 |
| Film B with adhesive layer | About 20 µm/min | About 1 µm/min | 5:2 | 20:1 |

Each of the films A and B with an adhesive layer was sandwiched between a 20 µm-thick SUS 304 HTA foil (tradename; manufactured by Nippon Steel Chemical Co., Ltd.) and a 18 µm-thick (Rz=1.5 µm) copper alloy foil C 7025 (tradename; manufactured by Olin Corp.), followed by vacuum pressing under conditions of pressure 20 kg/cm$^2$, 270° C. and 10 min to prepare two three-layer materials having a layer construction of SUS: insulating layer: copper. The laminates thus obtained were designated as a laminate A and a laminate B.

[Evaluation of Etching of Insulating Layer]

Each of the laminates A and B with the SUS side being masked prepared in the above step was immersed in a ferric chloride solution to etch the copper foil. Thereafter, the laminates were dried, were cut into a suitable size, and were then immersed in an etching liquid TPE-3000 (tradename; manufactured by Toray Engineering Co., Ltd.) which had been stirred at 70° C. with a magnetic stirrer to such an extent that a whirlpool was formed. At the time when the polyimide film was fully removed to expose the surface of SUS, the laminates were taken out of the etching liquid. Thus, the insulating layer was wet etched.

Likewise, the insulating layer was subjected to plasma treatment under conditions of pressure 25 to 30 Pa, process gas $NF_3/O_2=10/90\%$, and frequency 40 kHz to etch the insulating layer.

Etching was continued until, when the laminate was visually inspected, the polyamide layer no longer existed on SUS. The thickness of the insulating layer was divided by the time necessary for the etching to determine the etching rate. The results are shown in Table D3 below.

TABLE D3

| | Etching rate, µm/min | |
| --- | --- | --- |
| | Wet etching | Plasma etching |
| Laminate A | 12 | 0.2 |
| Laminate B | 2 | 0.2 |

As is apparent from Table D3, the etching rate in the wet etching is larger than that in the plasma etching, and, in the wet etching, the insulating layer can be etched in a very short time.

Evaluation of Plate Making

[Patterning of Conductive Inorganic Material]

A 50 µm-thick basic aqueous solution development-type dry film resist was laminated by a hot roll laminator onto both sides of the laminated A prepared in the test in the evaluation of etchability having a size of 300 mm×300 mm, that is, onto the stainless steel layer and onto the copper alloy foil layer at a speed of 0.5 m/min under conditions of roll surface temperature 105° C. and line pressure 2 to 4 kg/cm, and the laminate was then allowed to stand at room temperature for 15 min. At that time, since the stainless steel layer and the copper alloy foil layer were respectively provided on both sides of the laminate, and, after the lamination of the dry film resist, the laminate was flat and there was no warpage. Thereafter, exposure was carried out using a predetermined mask by means of a vacuum intimate contact exposure system at 100 mJ/cm$^2$. After standing at room temperature for 15 min the dry film resist was developed with a 1 wt % aqueous Na$_2$CO$_3$ solution under conditions of temperature 30° C. and spray pressure 2 kg/cm$^2$ for 60 sec to form a resist pattern.

Thereafter, the stainless steel layer and the copper foil layer were simultaneously etched with an aqueous ferric chloride solution. The dry film resist was then separated with an 3 wt % aqueous NaOH solution of 50° C. at a spray pressure of 1 kg/cm$^2$ to pattern the conductive inorganic material layer in the laminate A. Thus, the laminate A, wherein the stainless steel layer and the copper alloy layer have been patterned to partially expose the insulating layer, was prepared.

[Selection of Dry Film Resist]

The laminate A with the exposed insulating layer prepared in the above step was treated as follows. The laminate A with a mask provided on the SUS side was immersed in a ferric chloride solution to etch the copper foil. The basic aqueous solution development-type dry film resist was laminated by means of a heated roll laminator under conditions of speed 0.5 m/min, roll surface temperature 105° C., and line pressure 2 to 4 kg/cm onto the exposed adhesive layer surface, and the laminate was then allowed to stand at room temperature for 15 min. Thereafter, a stripe mask having a line & space pattern of 500 μm/500 μm and 80 μm/80 μm was brought into intimate contact with the sample, and one side of the laminate was exposed by means of a parallel light intimate contact exposure system manufactured by ORC at an exposure of 30 to 200 mJ which is a recommended exposure range for the dry film. Thereafter, the sample was turned over, the same mask was brought into intimate contact with the other side of the laminate, followed by exposure. After standing at room temperature for 15 min, the dry film resist was developed with a 1 wt % aqueous Na$_2$CO$_3$ solution under conditions of temperature 30° C. and spray pressure 2 kg/cm$^2$ for 60 sec. Thereafter, the laminate was dried and was then immersed in an etching liquid TPE-3000 (tradename; manufactured by Toray Engineering Co., Ltd.) which had been stirred at 70° C. with a magnetic stirrer to such an extent that a whirlpool had been formed. For the samples which had been immersed for varied immersion times, the dry film resist was separated with a 3 wt % aqueous NaOH solution at 50° C. at a spray pressure of 1 kg/cm$^2$. In this way, the insulating layer was wet etched into a desired shape. SUNFORT AQ-1558 (tradename), SUNFORT AQ-2058 (tradename), SUNFORT AQ-2538 (tradename), SUNFORT AQ-3038 (tradename), SUNFORT AQ-4038 (tradename), and SUNFORT AQ-5038 (tradename), manufactured by Asahi Kasei Kogyo K.K.; NPE 538 (tradename) and NPE 342 (tradename), manufactured by Nichigo-Morton Co., Ltd.; and SFP-00G1-25-AR (tradename), manufactured by Nippon Steel Chemical Co., Ltd. were used as the dry film resist. In this case, for the development of SFP-00G1-25-AR (tradename), a designated aqueous lactic acid solution was used.

For each sample, the dimension of the upper part of the stripe pattern was measured, and the point, at which the dimensional change was rapid, was regarded, for convenience, as the dry film resist pattern separation or dissolution time, and the time length up to this time was regarded as the pattern shape retention time of the dry film resist.

For each sample, the pattern retention time is shown in Table D4 below.

TABLE D4

| Sample | Thickness, μm | Pattern shape retention time |
|---|---|---|
| AQ-1558 | 15 | 1 min |
| AQ-2058 | 20 | 2 min |
| AQ-2538 | 25 | 5 min |
| AQ-3038 | 30 | 6 min |
| AQ-4038 | 40 | 8 min |
| AQ-5038 | 50 | 10 min |
| NPE 538 | 38 | 6 min |
| NPE 342 | 42 | 8 min |
| SFP00-GI-25AR | 25 | 4 min |

As is apparent from Table D4, SUNFORT AG-5038 (tradename), manufactured by Asahi Kasei Kogyo K.K. and NPE 342 (tradename), manufactured by Nichigo-Morton Co., Ltd. had relatively excellent resistance to etching liquid. SUNFORT AQ-2538 to SUNFORT AQ-5038 (tradename), manufactured by Asahi Kasei Kogyo K.K. were dry film resists which were identical to one another in composition and were different from one another only in thickness wherein the thickness of the dry film resist increased with increasing the sample number. As is apparent from Table D4, the pattern retention time increased with increasing the thickness, indicating that the resistance to etching liquid also improved with increasing the thickness.

Pattern Reinforcement Treatment

After patterning the dry film resist, the following post treatment was carried out to impart further resistance of the dry film resist to etching liquid. The laminate A, from which the whole copper alloy foil had been removed in the above step, was used as the sample, and SUNFORT AQ-5038 (tradename), manufactured by Asahi Kasei Kogyo K.K. was used after patterning into a stripe pattern of L/S=500 μm/500 μm and 80 μm/80 μm. The evaluation was carried out in the same manner as used in the selection of the dry film resist.

[Heat Treatment]

An aluminum foil was placed on a hot plate heated at 120° C., and the sample A was left to stand on the aluminum foil to determine the pattern retention time. In this case, the time was change as shown in the following table. The relationship between the treatment time and the pattern shape retention is shown in Table D5 below.

TABLE D5

| Treatment time | Pattern shape retention time |
|---|---|
| 10 sec | 10.5 min |
| 30 sec | 12 min |
| 60 sec | 14 min |
| 300 sec | Not less than 20 min |

[Post Exposure Treatment]

Since the negative-working dry film resist was used, after the development, the resist pattern should be further reinforced. To this end, post exposure was carried out under the following conditions to determine the pattern retention time. The relationship between the exposure and the pattern shape retention is shown in Table D6 below.

TABLE D6

| Exposure (in terms of i-ray) | Pattern shape retention time |
|---|---|
| 100 mJ | 10.5 min |
| 300 mJ | 12 min |
| 500 mJ | 13 min |

As is apparent from Tables D5 and D6, heating provided better pattern reinforcement. The post exposure, however, was also effective, although the effect was inferior to that attained by the heat treatment. The reinforcement method may be properly selected according to the electronic component required and the process. Further, in a combination of these methods, the contribution of the heat treatment effect was large, and the effect attained by the post exposure was not significant.

Preparation of Dry Film Resist for Patterning of Insulating Layer

[Dry Film Resist]

The following basic aqueous solution development-basic aqueous solution separation-type negative-working dry film resists were provided: SUNFORT AQ-1558 (tradename; thickness 15 μm), SUNFORT AQ-2058 (tradename; thickness 20 μm), SUNFORT AQ-2538 (tradename; thickness 25 μm), SUNFORT AQ-3038 (tradename; thickness 30 μm), SUNFORT AQ-4038 (tradename; thickness 40 μm), and SUNFORT AQ-5038 (tradename; thickness 50 μm), manufactured by Asahi Kasei Kogyo K.K. and ALPHO NPE 538 (tradename; thickness 38 μm; embossed) and ALPHO NPE 342 (tradename; thickness 42 μm; embossed), manufactured by Nichigo-Morton Co., Ltd.

The dry film resist was laminated by flat pressing (under reduced pressure and under the atmospheric pressure) and roll pressing (under reduced pressure and under the atmospheric pressure) according to the following methods onto the laminate A, and the appearance of the laminate A after the lamination of the dry film resist was inspected.

[Flat Pressing]

The laminate A was sandwiched between dry film resists (DFR), and they were stacked in the order of dry film—laminate—dry film and set on a hot plate set at 75° C. by means of a vacuum laminator MVLP-500 manufactured by Meiki, Co., Ltd. Thereafter, after the pressure within the chamber was reduced to 30 mmHg (≈ 4 KPa: about 1/25 of the atmospheric pressure), pressing was carried out at a pressure of 10 Pa for 80 sec. Further, the same procedure was repeated, except that the atmospheric pressure was used as the internal pressure at the time of pressing.

For these laminated laminates, in all the samples which had been laminated under the atmospheric pressure, the inclusion of air bubbles was observed in various places of the end portion in which the copper alloy foil or the stainless steel foil had been patterned. For pressing under reduced pressure, in the case of the dry film resist having a surface on which fine concaves and convexes had been formed by embossing, the inclusion of air bubbles was not observed, whereas, in the case of the dry film resist not subjected to embossing, the inclusion of air bubbles was observed in various places of the end portion in which the copper alloy foil or the stainless steel foil had been patterned. However, all the samples were flat, and no warpage was observed.

[Roll Pressing]

The laminate A was sandwiched between the dry film resists, followed by lamination by means of a heated roll laminator under conditions of speed 0.5 m/min, roll surface temperature 105° C., and line pressure 2 to 4 kg/cm. Thereafter, the laminates thus obtained were left to stand at room temperature for 15 min. For all the laminated laminates, when they were left to stand on a flat metal plate, both ends were lifted by about 1 to 2 cm, and the copper alloy foil was warped on the patterned side. For the samples which had been laminated under reduced pressure, the inclusion of air bubbles was not observed, whereas, for the samples which had been laminated under the atmospheric pressure, the inclusion of air bubbles was observed in various places of the end portion in which the copper alloy foil or stainless steel foil had been patterned.

The samples were inspected for whether or not the patterned stainless steel foil (thickness 20 μm) or the copper alloy foil (thickness 18 μm) was exposed from the surface of the dry film resist. As a result, when the thickness of the metal layer was identical to or smaller than the thickness of the dry film resist, the metal partially broke through the dry film resist and was exposed. The results of evaluation are shown in Table D7 below.

TABLE D7

| Sample | Thickness, μm | Embossing | Pressing method | Atm | Warpage | Inclusion of air bubbles | Exposure of metal layer SUS side | Exposure of metal layer Copper side | Overall evaluation |
|---|---|---|---|---|---|---|---|---|---|
| AQ-1558 | 15 | Not done | Flat pressing | Atmospheric pressure | ○ | x | x | x | x |
| | | | Flat pressing | Reduced pressure | ○ | x | x | x | x |
| | | | Roll pressing | Atmospheric pressure | x | x | x | x | x |
| | | | Roll pressing | Reduced pressure | x | ○ | x | x | x |
| AQ-2058 | 20 | Not done | Flat pressing | Atmospheric pressure | ○ | x | x | ○ | x |
| | | | Flat pressing | Reduced pressure | ○ | x | x | ○ | x |
| | | | Roll pressing | Atmospheric pressure | x | x | x | ○ | x |
| | | | Roll pressing | Reduced pressure | x | ○ | x | ○ | x |
| AQ-2538 | 25 | Not done | Flat pressing | Atmospheric pressure | ○ | x | ○ | ○ | x |
| | | | Flat pressing | Reduced pressure | ○ | x | ○ | ○ | x |
| | | | Roll pressing | Atmospheric pressure | x | x | ○ | ○ | x |
| | | | Roll pressing | Reduced pressure | x | ○ | ○ | ○ | x |
| AQ-3038 | 30 | Not done | Flat pressing | Atmospheric pressure | ○ | x | ○ | ○ | x |
| | | | Flat pressing | Reduced pressure | ○ | x | ○ | ○ | x |
| | | | Roll pressing | Atmospheric pressure | x | x | ○ | ○ | x |
| | | | Roll pressing | Reduced pressure | x | ○ | ○ | ○ | x |
| AQ-4038 | 40 | Not done | Flat pressing | Atmospheric pressure | ○ | x | ○ | ○ | x |
| | | | Flat pressing | Reduced pressure | ○ | x | ○ | ○ | x |

TABLE D7-continued

| Sample | Thickness, μm | Embossing | Pressing method | Atm | Warpage | Inclusion of air bubbles | Exposure of metal layer SUS side | Exposure of metal layer Copper side | Overall evaluation |
|---|---|---|---|---|---|---|---|---|---|
| | | | Roll pressing | Atmospheric pressure | x | x | o | o | x |
| | | | Roll pressing | Reduced pressure | x | o | o | o | x |
| AQ-5038 | 50 | Not done | Flat pressing | Atmospheric pressure | o | x | o | o | x |
| | | | Flat pressing | Reduced pressure | o | x | o | o | x |
| | | | Roll pressing | Atmospheric pressure | x | x | o | o | x |
| | | | Roll pressing | Reduced pressure | x | o | o | o | x |
| NPE 538 | 38 | Done | Flat pressing | Atmospheric pressure | o | x | o | o | x |
| | | | Flat pressing | Reduced pressure | o | o | o | o | o |
| | | | Roll pressing | Atmospheric pressure | x | x | o | o | x |
| | | | Roll pressing | Reduced pressure | x | o | o | o | x |
| NPE 342 | 42 | Done | Flat pressing | Atmospheric pressure | o | x | o | o | x |
| | | | Flat pressing | Reduced pressure | o | o | o | o | o |
| | | | Roll pressing | Atmospheric pressure | x | x | o | o | x |
| | | | Roll pressing | Reduced pressure | x | o | o | o | x |

Warpage = o: not warped, x: warped; Air bubbles = o: not included, x: included; Exposure of metal layer = o: not exposed, x: exposed

[Exposure and Development]

For the laminate A, prepared in the above step, on which the dry film resist had been laminated, a mask pattern was put thereon, followed by exposure to i-ray at an exposure of 30 to 150 mJ/cm². Development was then carried out by spray development with 1 wt % $Na_2CO_3$ at 30° C. Thus, an insulating layer processing resist pattern was formed so as to overlap with the stainless steel layer and the copper alloy foil layer patterned on the insulating layer.

If the insulating layer processing pattern is formed only on the region with the insulating layer being left, that is, is formed so as not to overlap the stainless steel layer and the copper alloy foil layer, the resist pattern would also be etched by wet etching. In this case, a space is formed between the pattern and the stainless steel layer or the copper alloy layer, and etching is carried out in that portion, possibly resulting in etching in the insulating layer in its portion not to be etched. In order to prevent this unfavorable phenomenon, the insulating layer processing resist pattern was formed so as to overlap with the patterned stainless steel layer or the copper alloy layer on the insulating layer. In particular, when the line width of the stainless steel layer or the copper alloy layer is small, the formation of the insulating layer processing resist pattern on the conductive layer with a small line width is also advantageous in this point.

In this case, the warped sample could not be brought into intimate contact with the mask at the time of exposure and was forcibly brought into intimate contact with the mask by suction. As a result, the alignment accuracy was inferior to other samples by about three to five times depending upon the warpage level.

[Wet Etching]

The samples prepared by the above step was wet etched under the following conditions. In this case, the treatment of the dry film resist for improving the resistance to etching liquid was not carried out. Regarding conditions for wet etching, as pretreatment, the samples were immersed in a 0.5% aqueous solution of Surfynol 104 E (tradename) manufactured by Nissin Chemical Industry Co., Ltd. as a nonionic surfactant for 30 sec and were then placed in a submerged spray-type horizontal transfer-type etching apparatus. An etching liquid TPE-3000 manufactured by Toray Engineering Co., Ltd. was used as the etching liquid, and the treatment temperature was 80° C. For the samples, the time necessary for etching was about 70 to 90 sec although the time depends, for example, upon the etching rate of the polyimide layer to the etching liquid and the etching temperature.

In this case, for the samples in which the inclusion of air bubbles in the resist pattern was observed and the samples in which the stainless steel layer and the copper alloy foil layer had been exposed, etching into a desired shape could not be achieved in many sites. This failure is attributable to the fact that, since, in wet etching, the etching rate is very high, etching occurs even upon slight touch with the etching liquid. Therefore, when the etching pattern of the copper alloy foil layer is not completely covered by the dry film resist, the failure is likely to occur.

Figure 2:
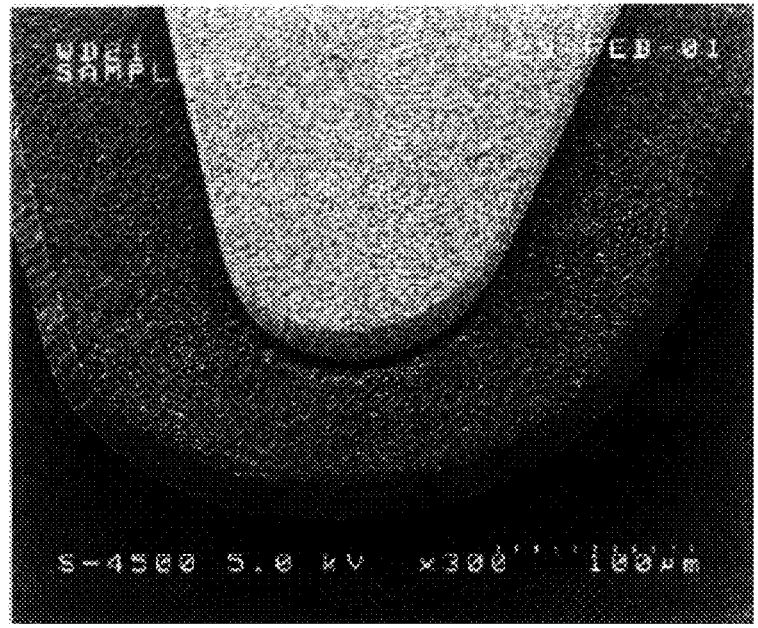
FIG. 2 is an electron photomicrograph of a sample after the completion of etching with good results.
Figure 3:
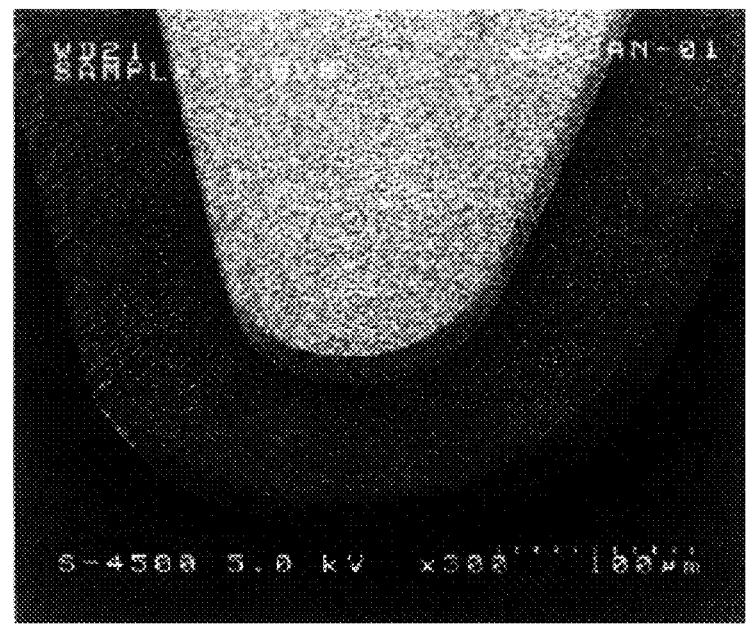
FIG. 3 is an electron photomicrograph of a sample wherein a copper alloy foil has been exposed and etching failure has occurred.

An electron microphotograph of the sample for which etching could be successfully carried out is shown in FIG. 2, and an electron microphotograph of the sample for which etching failure occurred is shown in FIG. 3. As is apparent from FIG. 3, the insulating layer of the polyimide in its portion around the base of the etching pattern of the copper alloy foil has been attacked. In FIG. 1(*g*), when the thickness of the dry film resist 5 is less than 1.1 times than the thickness of the conductive inorganic material layer 3 or 2, this failure occurs in the base of the conductive inorganic material layer 3 or 2 in its portion around the insulating layer 1.

[Post Treatment of Wet Etching]

For the sample in which SUNFORT AQ-5038 (tradename) manufactured by Asahi Kasei Kogyo K.K. was laminated onto the laminate A followed by wet etching of the insulating layer, the sample was taken out of the etching bath and was then rinsed by a method wherein the sample was immersed in a vat filled with a rinse bath having the following composition for 30 sec and the vat was swung. When the rinse treatment is not carried out, the residue of the etched polyimide, etching liquid or the like is left on the surface and deteriorates the appearance. In this case, the liquid for separation in the step of separating the dry film resist as such may be used for rinsing to simultaneously carry out the step of rinsing and the step of dry film separation.

In Table D8 below, "without rinsing" is such that the sample was allowed to stand after taking out the sample from the etching liquid.

TABLE D8

| Rinsing liquid | Liquid temp. | Evaluation result |
|---|---|---|
| Not rinsed | — | x |
| $H_2O$ | 25° C. | o |
| $H_2O$ | 50° C. | o |
| $H_2O$ | 75° C. | o |
| 3 wt % aq. KOH soln. | 25° C. | o |
| 3 wt % aq. KOH soln. | 50° C. | o |
| 3 wt % aq. KOH soln. | 75° C. | o |
| $H_2O$:NMP = 2:1 | 25° C. | o |
| $H_2O$:NMP = 2:1 | 50° C. | o |
| $H_2O$:NMP = 2:1 | 75° C. | o |
| IPA:NMP = 2:1 | 25° C. | o |
| IPA:NMP = 2:1 | 50° C. | o |
| IPA:NMP = 2:1 | 75° C. | o |

*NMP = n-methyl-2-pyrrolidone, IPA = isopropanol
o: residue absent, x: residue present

[Separation]

A high-temperature basic aqueous solution having a sodium hydroxide concentration of 3% by weight sprayed at 50° C. against the dry film resist used in the patterning of the insulating layer to separate the dry film resist from the laminate. When the insulating layer was formed of a polyimide or the like having poor alkali resistance, the use of an organic basic aqueous solution such as ethanolamine is preferred.

[Pickling/Rust Preventive Treatment/Gold Plating/Solder Printing]

A gold plating as finishing was applied to the patterned copper alloy foil layer in the wireless suspension blank for HDD formed by the above method. The gold plating was carried out to a thickness of 1 μm using a gold cyanide gold plating bath, Temperesist EX (tradename) manufactured by Japan Pure Chemical Co., Ltd. under conditions of 65° C., current density Dk=0.4 $A/dm^2$, and energization time about 4 min.

For the samples thus prepared, various properties were evaluated. As a result, for the samples in which there was warpage in such a state that the dry film resist was laminated, the alignment accuracy was poor, and, for the samples in which the inclusion of air bubbles was observed and the samples in which the patterned stainless steel foil or the copper alloy foil was exposed from the dry film resist, there was etching shape failure. The results are shown in Table D9 below.

| Sample | Thickness, μm | Embossing | Pressing method | Atm | Alignment accuracy | Shape after wet etching | Overall evaluation |
|---|---|---|---|---|---|---|---|
| AQ-1558 | 15 | Not done | Flat pressing | Atmospheric pressure | o | x | x |
| | | | Flat pressing | Reduced pressure | o | x | x |
| | | | Roll pressing | Atmospheric pressure | x | x | x |
| | | | Roll pressing | Reduced pressure | x | x | x |
| AQ-2058 | 20 | Not done | Flat pressing | Atmospheric pressure | o | x | x |
| | | | Flat pressing | Reduced pressure | o | x | x |
| | | | Roll pressing | Atmospheric pressure | x | x | x |
| | | | Roll pressing | Reduced pressure | x | o | x |
| AQ-2538 | 25 | Not done | Flat pressing | Atmospheric pressure | o | x | x |
| | | | Flat pressing | Reduced pressure | o | x | x |
| | | | Roll pressing | Atmospheric pressure | x | x | x |
| | | | Roll pressing | Reduced pressure | x | o | x |
| AQ-3038 | 30 | Not done | Flat pressing | Atmospheric pressure | o | x | x |
| | | | Flat pressing | Reduced pressure | o | x | x |
| | | | Roll pressing | Atmospheric pressure | x | x | x |
| | | | Roll pressing | Reduced pressure | x | o | x |
| AQ-4038 | 40 | Not done | Flat pressing | Atmospheric pressure | o | x | x |
| | | | Flat pressing | Reduced pressure | o | x | x |
| | | | Roll pressing | Atmospheric pressure | x | x | x |
| | | | Roll pressing | Reduced pressure | x | o | x |
| AQ-5038 | 50 | Not done | Flat pressing | Atmospheric pressure | o | x | x |
| | | | Flat pressing | Reduced pressure | o | x | x |
| | | | Roll pressing | Atmospheric pressure | x | x | x |
| | | | Roll pressing | Reduced pressure | x | o | x |
| NPE 538 | 38 | Done | Flat pressing | Atmospheric pressure | o | x | x |
| | | | Flat pressing | Reduced pressure | o | o | o |
| | | | Roll pressing | Atmospheric pressure | x | x | x |
| | | | Roll pressing | Reduced pressure | x | o | x |
| NPE 342 | 42 | Done | Flat pressing | Atmospheric pressure | o | x | x |
| | | | Flat pressing | Reduced pressure | o | o | o |
| | | | Roll pressing | Atmospheric pressure | x | x | x |
| | | | Roll pressing | Reduced pressure | x | o | x |

Alignment accuracy = o: within ± 15 μm, x: not less than ± 15 μm

According to the present invention, since the conductive inorganic material layer is patterned by wet etching followed by patterning of the insulating layer by wet etching, short-time etching is possible as compared with dry etching, contributing to higher productivity. In particular, in products, such as suspensions for a hard disk drive, wherein the area of the insulating layer to be removed by etching is large and, at the same time, a fine pattern is necessary, a great effect can be attained by the application of wet etching. Therefore, a production process can be realized wherein the workability is better and the reject ratio is lower.

Further, high accuracy patterning is required of electronic components such as suspensions for a hard disk drive. However, for a non-rigid substrate for preparing a suspension for a hard disk drive or the like, it is difficult to coat the liquid resist to bring the resist film to an even thickness with high accuracy, and very close control is necessary in the step of coating and drying, and, thus, the non-rigid substrate was unsuitable for fine etching. Since, however, in the present invention, the insulating layer is patterned using a dry film resist, the use of a dry film having an originally constant film thickness is advantageous in that the process control is easy for the formation of the resist and the resist film is suitable for fine etching.

In wet etching, when the electronic component of the present invention is produced using a dry film resist having on its surface fine concaves and convexes, the fine concaves and convexes function as the place for escape of air bubbles and, when the dry film resist is laminated, the inclusion of air bubbles can be prevented, contributing to improved resistance of the laminate to etching.

In the production process of the electronic component according to the present invention, the laminate of the dry film resist can be developed with a basic aqueous solution, and the separation of the dry film resist with the basic aqueous solution can be carried out. Therefore, the production equipment is inexpensive, and the use of an organic solvent, which poses a problem of waste, can be avoided.

In the production process of an electronic component according to the present invention, when a dry film is laminated onto the laminate, in which the conductive inorganic material layer has been patterned, under reduced pressure by means of a vacuum press, even in the lamination for each sheet unit, the prevention of warpage after the lamination and the inclusion of air bubbles can be realized.

In the production process of an electronic component according to the present invention, when the laminate of the dry film resist is exposed and developed to perform patterning followed by treatment selected from ultraviolet light irradiation treatment, heat treatment, and a combination of ultraviolet light irradiation treatment with heat treatment, the resistance of the dry film resist to the etchant for the insulating layer can be improved.

When the time necessary for wet etching for the insulating layer is 10 sec to 30 min, preferably 10 sec to 15 min, more preferably 10 sec to 5 min, even etching with a strongly basic aqueous solution does not cause the separation of the dry film resist during etching, and wet etching with high accuracy can be realized.

When a dry film resist having a thickness which is 1.1 to 5 times that of the level of concaves and convexes on the surface of the laminate is used, there is no possibility that, after the lamination of the dry film resist, the convex of the laminate breaks the dry film resist and is exposed. As a result, a good etching pattern shape can be formed.

EXAMPLE E

[Etchable Test]

For the production of a sample for the formation of an insulating layer, PAA-A (tradename; polyamic acid varnish manufactured by Mitsui Chemicals Inc.) and EN-20 (tradename; polyimide varnish manufactured by New Japan Chemical Co., Ltd.) were provided as an adhesive resin. APIKAL NPI (tradename; polyimide film (thickness 12.5 µm) manufactured by Kanegafuchi Chemical Ind. Co., Ltd.) was provided as a low-expansion polyimide to be functioned as a core. An alkal-amine polyimide etching liquid TPE-3000 (tradename) manufactured by Toray Engineering Co., Ltd. was provided as an etching liquid used in the etching test.

The adhesive resin varnish EN-20 (tradename; manufactured by New Japan Chemical Co., Ltd.) was spin coated to a film thickness of 20 to 40 µm onto a 100 µm-thick SUS 304 plate having a size of 15 cm×15 cm, and the coating was dried in an oven at 180° C. for 30 min. PAA-A (tradename; manufactured by Mitsui Chemicals Inc.) is an amic acid varnish, and, after the solvent was removed in the step of drying at 120° C. for 15 min, the amic acid varnish was thermally imidated by a predetermined procedure to form a polyimide. For APIKAL NPI (tradename; manufactured by Kanegafuchi Chemical Ind. Co., Ltd.), one side thereof was masked to prepare a sample. Each sample was taken off into a size of about 1.5 cm in length×about 2 cm in width. The center portion was cut with a cutter knife, and the film thickness was measured as an initial film thickness with a tracer type film thickness meter (Dektak manufactured by Sloan Technology). Thereafter, the samples were immersed in a polyimide etching liquid TPE-3000 (tradename; manufactured by Toray Engineering, which had been kept at 70° C. and had been stirred with a magnetic stirrer to such an extent that a whirlpool was formed, and the film thickness was measured with a tracer type film thickness meter (Dektak manufactured by Sloan Technology) every immersion time in the same place as that where the initial film thickness was measured. The film thickness after immersion was subtracted from the initial film thickness, and the reduction level of the film thickness per min was regarded as a reduction level of film thickness and to determine the etching rate (unit: µm/min). The results are shown in Table E1 below.

TABLE E1

| Sample | Etching rate, µm/min |
| --- | --- |
| EN-20 | About 11 µm/min |
| PAA-A | About 1 µm/min |
| APIKAL NPI | About 20 µm/min |

[Evaluation of Etchability]

EN-20 (tradename; polyimide varnish manufactured by New Japan Chemical Co., Ltd.) was coated on both sides of a 12.5 µm-thick polyimide film APIKAL NPI film (tradename; manufactured by Kanegafuchi Chemical Ind. Co., Ltd.) to a film thickness of 1.5 µm ±0.3 µm on a dry basis, and the coatings were dried in an oven at 180° C. for 30 min. The film thus obtained was designated as a film A with an adhesive layer.

Likewise, PAA-A (tradename; manufactured by Mitsui Chemicals Inc.) was coated on both sides of a 12.5 μm-thick APIKAL NPI film (tradename; manufactured by Kanegafuchi Chemical Ind. Co., Ltd.) to form a film which was designated as a film B with an adhesive layer. Since PAA-A (tradename; polyimide varnish manufactured by New Japan Chemical Co., Ltd.) was an amic acid varnish, after the solvent was removed in the step of drying at 120° C. for 15 min, the amic acid varnish was thermally imidated by a predetermined procedure to form a polyimide. The etching rate ratio of the core layer and the adhesive layer is shown below. The etching rate ratio of the film A with an adhesive layer and the film B with an adhesive layer is shown in Table E2 below.

TABLE E2

| | Etching rate | | Thickness of low-expansion layer: | Etching |
| --- | --- | --- | --- | --- |
| | Low-expansion layer | Adhesive layer | total thickness of adhesive layer | rate ratio |
| Film A with adhesive layer | About 20 μm/min | About 11 μm/min | 5:2 | 20:11 |
| Film B with adhesive layer | About 20 μm/min | About 1 μm/min | 5:2 | 20:1 |

Each of the films A and B with an adhesive layer was sandwiched between a 20 μm-thick SUS 304 HTA foil (tradename; manufactured by Nippon Steel Corp.) and a 18 μM-thick (Rz=1.5 μm) copper alloy foil C 7025 (tradename) manufactured by Olin Corp. so that the film faced the rough surface sides of the inorganic material, followed by vacuum pressing under conditions of pressure 20 kg/cm$^2$, 270° C. and 10 min to prepare two three-layer materials having a layer construction of SUS insulating layer copper. The laminates thus obtained were designated as a laminate A and a laminate B.

[Evaluation of Etching of Insulating Layer]

Each of the laminates A and B with the SUS side being masked prepared in the above step was immersed in a ferric chloride solution to etch the copper foil. Thereafter, the laminates were dried, were cut into a suitable size, and were then immersed in an etching liquid TPE-3000 (tradename) manufactured by Toray Engineering Co., Ltd. which had been stirred with a magnetic stirrer at 70° C. to such an extent that a whirlpool was formed. At the time when the polyimide film was fully removed to expose the surface of SUS, the laminates were taken out of the etching liquid. Thus, the insulating layer was wet etched.

Likewise, the insulating layer was subjected to plasma treatment under conditions of pressure 25 to 30 Pa, process gas NF$_3$/O$_2$=10/90%, and frequency 40 kHz to etch the insulating layer.

Etching was continued until, when the laminate was visually inspected, the polyamide layer no longer existed on SUS. The thickness of the insulating layer was divided by the time necessary for the etching to determine the etching rate. The results are shown in Table E3 below.

TABLE E3

| | Etching rate, μm/min | |
| --- | --- | --- |
| | Wet etching | Plasma etching |
| Laminate A | 12 | 0.2 |
| Laminate B | 2 | 0.2 |

As is apparent from Table E3, the etching rate in the wet etching is larger than that in the plasma etching, and, in the wet etching, the insulating layer can be etched in a very short time.

[Patterning of Conductive Inorganic Material]

A 50 μm-thick aqueous alkali solution development-type dry film resist was laminated by a hot roll laminator onto both sides of the laminated A prepared in the test in the evaluation of etchability having a size of 300 mm×300 mm, that is, onto the stainless steel layer and onto the copper alloy foil layer at a speed of 0.5 m/min under conditions of roll surface temperature 105° C. and line pressure 2 to 4 kg/cm, and the laminate was then allowed to stand at room temperature for 15 min. At that time, since the stainless steel layer and the copper alloy foil layer were respectively provided on both sides of the laminate, and, after the lamination of the dry film resist, the laminate was flat and there was no warpage. Thereafter, exposure was carried out using a predetermined mask by means of a vacuum intimate contact exposure system at 100 mJ/cm$^2$. After standing at room temperature for 15 min, the dry film resist was developed with a 1 wt % aqueous Na$_2$CO$_3$ solution under conditions of temperature 30° C., spray pressure 2 kg/cm$^2$, and 60 sec to form a resist pattern.

Thereafter, the stainless steel layer and the copper foil layer were simultaneously etched with an aqueous ferric chloride solution. The dry film resist was then separated with an 3 wt % aqueous NaOH solution of 50° C. at a spray pressure of 1 kg/cm$^2$ to pattern the conductive inorganic material layer in the laminate A. Thus, the laminate A, wherein the stainless steel layer and the copper alloy layer have been patterned to partially expose the insulating layer, was prepared.

[Dry Film Resist]

The following aqueous alkali solution development-aqueous alkali solution separation-type negative-working dry film resists were provided: SUNFORT AQ-1558 (tradename; thickness 15 μm), SUNFORT AQ-2058 (tradename; thickness 20 μM), SUNFORT AQ-2538 (tradename; thickness 25 μm), SUNFORT AQ-3038 (tradename; thickness 30 μm), SUNFORT AQ-4038 (tradename; thickness 40 μm), and SUNFORT AQ-5038 (tradename; thickness 50 μm), manufactured by Asahi Kasei Kogyo K.K. and ALPHO NPE 538 (tradename; thickness 38 μm; embossed) and ALPHO NPE 342 (tradename; thickness 42 μm; embossed), manufactured by Nichigo-Morton Co., Ltd. SFP-00G1-25-AR (tradename) manufactured by Nippon Steel Chemical Co., Ltd. was provided as a lactic acid development-lactic acid separation-type negative-working dry film resist.

The dry film resist was laminated by flat pressing (under reduced pressure and under the atmospheric pressure) and roll pressing (under reduced pressure and under the atmospheric pressure) according to the following methods onto the laminate A, and the appearance of the laminate A after the lamination of the dry film resist was inspected.

[Flat Pressing]

The laminate A was sandwiched between dry film resists (DFR), and they were stacked in the order of dry film— laminate—dry film and set on a hot plate set at 75° C. by means of a vacuum laminator MVLP-500 manufactured by Meiki, Co., Ltd. Thereafter, after the pressure within the chamber was reduced to 30 mmHg (≈ 4 Kpa: about 1/25 of the atmospheric pressure), pressing was carried out at a pressure of 1 kgf/cm² for 80 sec. Further, the same procedure was repeated, except that the atmospheric pressure was used as the internal pressure at the time of pressing.

For these laminated laminates, in all the samples which had been laminated under the atmospheric pressure, the inclusion of air bubbles was observed in various places of the end portion in which the copper alloy foil or the stainless steel foil had been patterned. For pressing under reduced pressure, in the case of the dry film resist having a surface on which fine concaves and convexes had been formed by embossing, the inclusion of air bubbles was not observed, whereas, in the case of the dry film resist not subjected to embossing, the inclusion of air bubbles was observed in various places of the end portion in which the copper alloy foil or the stainless steel foil had been patterned. However, all the samples were flat, and no warpage was observed.

[Roll Pressing]

The laminate A was sandwiched between the dry film resists, followed by lamination by means of a hot roll laminator under conditions of speed 0.5 m/min, roll surface temperature 105° C., and line pressure 2 to 4 kg/cm. Thereafter, the laminates thus obtained were left to stand at room temperature for 15 min. For all the laminated laminates, when they were left to stand on a flat metal plate, both ends were lifted by about 1.5 to 2 mm, and the copper alloy foil was warped on the patterned side. For the samples which had been laminated under reduced pressure, the inclusion of air bubbles was not observed, whereas, for the samples which had been laminated under the atmospheric pressure, the inclusion of air bubbles was observed in various places of the end portion in which the copper alloy foil or stainless steel foil had been patterned.

The samples were inspected for whether or not the patterned stainless steel foil (thickness 20 μm) or copper alloy foil (thickness 18 μm) was exposed from the surface of the dry film resist. As a result, when the thickness of the metal layer was identical to or smaller than the thickness of the dry film resist, the metal partially breaks through the dry film resist and was exposed. The results of evaluation are shown in Table E4 below.

TABLE E4

| Sample | Thickness, μm | Embossing | Pressing method | atm | Inclusion of air bubbles | Exposure of metal layer SUS side | Exposure of metal layer Copper side | Overall evaluation |
|---|---|---|---|---|---|---|---|---|
| AQ-1558 | 15 | Not done | Flat pressing | Atmospheric pressure | x | x | x | x |
| | | | Flat pressing | Reduced pressure | x | x | x | x |
| | | | Roll pressing | Atmospheric pressure | x | x | x | x |
| | | | Roll pressing | Reduced pressure | o | x | x | x |
| AQ-2058 | 20 | Not done | Flat pressing | Atmospheric pressure | x | x | o | x |
| | | | Flat pressing | Reduced pressure | x | x | o | x |
| | | | Roll pressing | Atmospheric pressure | x | x | o | x |
| | | | Roll pressing | Reduced pressure | o | x | o | x |
| AQ-2538 | 25 | Not done | Flat pressing | Atmospheric pressure | x | o | o | x |
| | | | Flat pressing | Reduced pressure | x | o | o | x |
| | | | Roll pressing | Atmospheric pressure | x | o | o | x |
| | | | Roll pressing | Reduced pressure | o | o | o | o |
| AQ-3038 | 30 | Not done | Flat pressing | Atmospheric pressure | x | o | o | x |
| | | | Flat pressing | Reduced pressure | x | o | o | x |
| | | | Roll pressing | Atmospheric pressure | x | o | o | x |
| | | | Roll pressing | Reduced pressure | o | o | o | o |
| AQ-4038 | 40 | Not done | Flat pressing | Atmospheric pressure | x | o | o | x |
| | | | Flat pressing | Reduced pressure | x | o | o | x |
| | | | Roll pressing | Atmospheric pressure | x | o | o | x |
| | | | Roll pressing | Reduced pressure | o | o | o | o |
| AQ-5038 | 50 | Not done | Flat pressing | Atmospheric pressure | x | o | o | x |
| | | | Flat pressing | Reduced pressure | x | o | o | x |
| | | | Roll pressing | Atmospheric pressure | x | o | o | x |
| | | | Roll pressing | Reduced pressure | o | o | o | o |
| NPE 538 | 38 | Done | Flat pressing | Atmospheric pressure | x | o | o | x |
| | | | Flat pressing | Reduced pressure | x | o | o | o |
| | | | Roll pressing | Atmospheric pressure | x | o | o | x |
| | | | Roll pressing | Reduced pressure | o | o | o | o |
| NPE-342 | 42 | Done | Flat pressing | Atmospheric pressure | x | o | o | x |
| | | | Flat pressing | Reduced pressure | o | o | o | o |
| | | | Roll pressing | Atmospheric pressure | x | o | o | x |
| | | | Roll pressing | Reduced pressure | o | o | o | o |

Air bubbles = o: not included, x: included; Exposure of metal layer = o: not exposed, x: exposed As is apparent from the results, when the flat pressing is used, the dry film having on its surface concaves and convexes is effective in the inclusion of air bubbles. For roll pressing, when evacuation was adopted, the inclusion of air bubbles was not observed even in the case of a dry film having a flat surface. When the thickness of SUS was 20 μm and the thickness of the copper foil was 18 μm, the use of a dry film having a thickness of not less than 1.1 times the thickness of the metal could realize good lamination without exposure of the metal.

[Selection of Dry Film Resist]

The laminate A with the exposed insulating layer prepared in the above step was treated as follows. The laminate A with a mask provided on the SUS side was immersed in a ferric chloride solution to etch the copper foil. The aqueous alkali solution development-type dry film resist was laminated by means of a hot roll laminator under conditions of speed 0.5 m/min, roll surface temperature 105° C., and line pressure 2 to 4 kg/cm onto the exposed adhesive layer surface, and the laminate was then allowed to stand at room temperature for 15 min. Thereafter, a stripe mask having a line & space pattern of 500 μm/500 μm and 80 μm/80 μm was brought into intimate contact with the sample, and one side of the laminate was exposed by means of a parallel light intimate contact exposure system manufactured by OCR at an exposure of 30 to 200 ml which is a recommended exposure range for the dry film. Thereafter, the sample was turned over, the same mask was brought into intimate contact with the other side of the laminate, followed by exposure. After standing at room temperature for 15 min, the dry film resist was developed with a 1 wt % aqueous $Na_2CO_3$ solution under conditions of temperature 30° C. and spray pressure 2 kg/cm² for 60 sec. Thereafter, the laminate was dried and was then immersed in an etching liquid TPE-3000 (tradename; manufactured by Toray Engineering Co., Ltd.) which had been stirred at 70° C. with a magnetic stirrer to such an extent that a whirlpool had been formed. For the samples which had been immersed for varied immersion times, the dry film resist was separated with a 3 wt % aqueous NaOH solution of 50° C. at a spray pressure of 1 kg/cm². In this way, the insulating layer was wet etched into a desired shape. SUNFORT AQ-1558 (tradename), SUNFORT AQ-2058 (tradename), SUNFORT AQ-2538 (tradename), SUNFORT AQ-3038 (tradename), SUNFORT AQ-4038 (tradename), and SUNFORT AQ-5038 (tradename), manufactured by Asahi Kasei Kogyo K.K.; NPE 538 (tradename) and NPE 342 (tradename), manufactured by Nichigo-Morton Co., Ltd.; and SFP-00G1-25-AR (tradename), manufactured by Nippon Steel Chemical Co., Ltd. were used as the dry film resist. In this case, for the development of SFP-00G1-25-AR (tradename), a designated aqueous lactic acid solution was used.

For each sample, the dimension of the upper part of the stripe pattern of the sample after immersion in the etching liquid for a given period of time was measured, and the point, at which the dimension was changed by not less than 20% of the pattern dimension, was regarded, for convenience, as the dry film resist pattern separation or dissolution time, and the time length up to this time was regarded as the pattern shape retention time of the dry film resist.

For each sample, the pattern retention time is shown in Table E5 below.

TABLE E5

| Sample | Pattern shape retention time |
| --- | --- |
| AQ-1558 | 1 min |
| AQ-2058 | 2 min |
| AQ-2538 | 5 min |
| AQ-3038 | 6 min |
| AQ-4038 | 8 min |
| AQ-5038 | 10 min |
| NPE 538 | 6 min |
| NPE 342 | 8 min |
| SFP-00GI-25AR | 4 min |

As is apparent from Table E5, SUNFORT AQ-5038 (tradename), manufactured by Asahi Kasei Kogyo K.K. and NPE 342 (tradename), manufactured by Nichigo-Morton Co., Ltd. had relatively excellent resistance to etching liquid. SUNFORT AQ-2538 to SUNFORT AQ-5038 (tradename), manufactured by Asahi Kasei Kogyo K.K. were dry film resists which were identical to one another in composition and were different from one another only in thickness wherein the thickness of the dry film resist increased with increasing the sample number. As is apparent from Table E5, the pattern shape retention time increased with increasing the thickness, indicating that the resistance to etching liquid also improved with increasing the thickness.

Pattern Reinforcement Treatment

After patterning the dry film resist, the following post treatment was carried out to impart further resistance of the dry film resist to etching liquid. The laminate A, from which the whole copper alloy foil had been removed in the above step, was used as the sample, and SUNFORT AQ-5038 (tradename), manufactured by Asahi Kasei Kogyo K.K. was used after patterning into a stripe pattern of L/S=500 μm/500 μm and 80 μm/80 μm. The evaluation was carried out in the same manner as used in the selection of the dry film resist.

[Heat Treatment]

An aluminum foil was placed on a hot plate heated at 120° C., and the sample A was left to stand on the aluminum foil to determine the pattern shape retention time. In this case, the time was changed as shown in the following table. The relationship between the treatment time and the pattern shape retention is shown in Table E6 below.

TABLE E6

| Treatment time | Pattern shape retention |
| --- | --- |
| 10 sec | 10.5 min |
| 30 sec | 12 min |
| 60 sec | 14 min |
| 300 sec | Not less than 20 min |

[Post Exposure Treatment]

Since the negative-working dry film resist was used, after the development, the resist pattern should be further reinforced. To this end, post exposure was carried out under the following conditions to determine the pattern shape retention. The relationship between the exposure and the pattern retention is shown in Table E7 below.

TABLE E7

| Exposure (in terms of i-ray) | Pattern shape retention |
| --- | --- |
| 10 mJ | 10.1 min |
| 50 mJ | 10.3 min |
| 100 mJ | 11 min |

As is apparent from Tables E6 and E7, heating provided better pattern reinforcement. The post exposure, however, was also effective, although the effect was inferior to that attained by the heat treatment. The reinforcement method may be properly selected according to the electronic component required and the process. Further, in a combination of these methods, the contribution of the heat treatment effect was large, and the effect attained by the post exposure was not significant.

[Exposure and Development]

For the laminate A, on which the dry film resist had been laminated, prepared in the above step, a mask pattern was put thereon, followed by exposure to g-ray at an exposure of 30 to 150 mJ/cm². Development was then carried out by spray development with 1 wt % $Na_2CO_3$ at 30° C. Thus, an insulating layer processing resist pattern was formed so as to overlap with the stainless steel layer and the copper alloy foil layer patterned on the insulating layer.

If the insulating layer processing pattern is formed only on the region with the insulating layer being left, that is, is formed so as not to overlap the stainless steel layer and the copper alloy foil layer, the resist pattern would also be etched by wet etching. In this case, a space is formed between the pattern and the stainless steel layer or the copper alloy layer, and etching is carried out in that portion, possibly resulting in etching in the insulating layer in its portion not to be etched. In order to prevent this unfavorable phenomenon, the insulating layer processing resist pattern was formed so as to overlap with the patterned stainless steel layer or the copper alloy layer on the insulating layer. In particular, when the line width of the stainless steel layer or the copper alloy layer is small, the formation of the insulating layer processing resist pattern on the conductive layer with a small line width is also advantageous in this point.

In this case, the warped sample could not be brought into intimate contact with the mask at the time of exposure and was forcibly brought into intimate contact with the mask by suction. As a result, the alignment accuracy was inferior to other samples by about three to five times depending upon the warpage level.

[Wet Etching]

The samples prepared by the above step was wet etched under the following conditions. In this case, the treatment of the dry film resist for improving the resistance to etching liquid was not carried out. Regarding conditions for wet etching, as pretreatment, the samples were immersed in a 0.5% aqueous solution of Surfynol 104 E (tradename) manufactured by Nissin Chemical Industry Co., Ltd. as a nonionic surfactant for 30 sec and were then placed in a submerged spray-type horizontal transfer-type etching apparatus. An etching liquid TPE-3000 manufactured by Toray Engineering Co., Ltd. was used as the etching liquid, and the treatment temperature was 80° C. For the samples, the time necessary for etching was about 70 to 90 sec although the time depends, for example, upon the etching rate of the polyimide layer to the etching liquid and the etching temperature.

In this case, for the samples in which the inclusion of air bubbles in the resist pattern was observed and the samples in which the stainless steel layer and the copper alloy foil layer had been exposed, etching into a desired shape could not be achieved in many sites. This failure is attributable to the fact that, since, in wet etching, the etching rate is very high, etching occurs even upon slight touch with the etching liquid. Therefore, when the etching pattern of the copper alloy foil layer is not completely covered by the dry film resist, the failure is likely to occur.

An electron microphotograph of the sample for which etching could be successfully carried out is shown in FIG. 2, and an electron microphotograph of the sample for which etching failure occurred is shown in FIG. 3. As is apparent from FIG. 3, the insulating layer of the polyimide in its portion around the base of the etching pattern of the copper alloy foil has been attacked. In FIG. 1(*g*), when the thickness of the dry film resist 5 is less than 1.1 times than the thickness of the conductive inorganic material layer 3 or 2, this failure occurs in the base of the conductive inorganic material layer 3 or 2 in its portion around the insulating layer 1.

[Separation]

A high-temperature alkali solution having a sodium hydroxide concentration of 3% by weight sprayed at 50° C. against the dry film resist used in the patterning of the insulating layer to separate the dry film resist from the laminate. When the insulating layer was formed of a polyimide or the like having poor alkali resistance, the use of an organic alkali, such as ethanolamine, is preferred.

For the samples thus prepared, various properties were evaluated. As a result, for the samples in which there was warpage in such a state that the dry film resist was laminated, the alignment accuracy was poor, and, for the samples in which the inclusion of air bubbles was observed and the samples in which the patterned stainless steel foil or the copper alloy foil was exposed from the dry film resist, there was etching shape failure. The results are shown in Table E8 below.

TABLE E8

| Sample | Thickness, μm | Embossing | Pressing method | Atm | Shape after wet etching |
|---|---|---|---|---|---|
| AQ-1558 | 15 | Not done | Flat pressing | Atmospheric pressure | x |
| | | | Flat pressing | Reduced pressure | x |
| | | | Roll pressing | Atmospheric pressure | x |
| | | | Roll pressing | Reduced pressure | x |
| AQ-2058 | 20 | Not done | Flat pressing | Atmospheric pressure | x |
| | | | Flat pressing | Reduced pressure | x |
| | | | Roll pressing | Atmospheric pressure | x |
| | | | Roll pressing | Reduced pressure | o |
| AQ-2538 | 25 | Not done | Flat pressing | Atmospheric pressure | x |
| | | | Flat pressing | Reduced pressure | x |
| | | | Roll pressing | Atmospheric pressure | x |
| | | | Roll pressing | Reduced pressure | o |
| AQ-3038 | 30 | Not done | Flat pressing | Atmospheric pressure | x |
| | | | Flat pressing | Reduced pressure | x |
| | | | Roll pressing | Atmospheric pressure | x |
| | | | Roll pressing | Reduced pressure | o |
| AQ-4038 | 40 | Not done | Flat pressing | Atmospheric pressure | x |
| | | | Flat pressing | Reduced pressure | x |
| | | | Roll pressing | Atmospheric pressure | x |
| | | | Roll pressing | Reduced pressure | o |
| AQ-5038 | 50 | Not done | Flat pressing | Atmospheric pressure | x |
| | | | Flat pressing | Reduced pressure | x |
| | | | Roll pressing | Atmospheric pressure | x |
| | | | Roll pressing | Reduced pressure | o |
| NPE 538 | 38 | Done | Flat pressing | Atmospheric pressure | x |
| | | | Flat pressing | Reduced pressure | o |
| | | | Roll pressing | Atmospheric pressure | x |
| | | | Roll pressing | Reduced pressure | o |
| NPE 342 | 42 | Done | Flat pressing | Atmospheric pressure | x |
| | | | Flat pressing | Reduced pressure | o |
| | | | Roll pressing | Atmospheric pressure | x |

TABLE E8-continued

| Sample | Thickness, μm | Embossing | Pressing method | Atm | Shape after wet etching |
|---|---|---|---|---|---|
| | | | Roll pressing | Reduced pressure | ○ |

In the production process of an electronic component using a dry film resist according to the present invention, in the case of immersion in an etching liquid kept at 70° C., since the retention time of the dry film resist pattern is not less than 1 min, when the time necessary for wet etching of the insulating layer is 10 sec to 30 min, preferably 10 sec to 10 min, more preferably 10 sec to 5 min, even etching with a strongly alkaline etching liquid does not cause the separation of the dry film resist during etching, and wet etching with high accuracy can be realized.

In the production process of an electronic component using a dry film resist according to the present invention, since the thickness of the dry film resist is not less than 1.1 times that of the inorganic material layer as one layer in the laminate applied, there is no possibility that, after the lamination of the dry film resist, the convex of the laminate breaks through the dry film resist and is exposed. As a result, a good etching pattern shape of the insulating layer can be formed.

Since the dry film resist used in the present invention has on its surface fine concaves and convexes, when an electronic component is produced using the dry film resist, the fine concaves and convexes function as the place for escape of air bubbles and, when the dry film resist is laminated, the inclusion of air bubbles can be prevented and the penetration of the etching liquid can be prevented, contributing to improved resistance of the laminate to etching.

Since the dry film resist used in the present invention could have realized wet etching of the insulating layer in the laminate, according to the production process of an electronic component using a dry film resist according to the present invention, as compared with the conventional dry etching, short-time etching can be realized and the productivity is better. In particular, in products, such as suspensions for a hard disk drive, wherein the area of the insulating layer to be removed by etching is large and, at the same time, a fine pattern is necessary, a great effect can be attained by the application of wet etching. Therefore, a production process can be realized wherein the workability is better and the reject ratio is lower.

Further, high accuracy patterning is required of electronic components such as suspensions for a hard disk drive. However, for a non-rigid substrate for preparing a suspension for a hard disk drive or the like, it is difficult to coat the liquid resist to bring the resist film to an even thickness with high accuracy, and very close control is necessary in the step of coating and drying, and, thus, the non-rigid substrate is unsuitable for fine etching. Since, however, in the dry film resist according to the present invention, the insulating layer is patterned by wet etching, the use of a dry film having an originally constant film thickness is advantageous in that the process control is easy for the formation of the resist and the resist film is suitable for fine etching.

In the dry film resist used in the present invention, the dry film resist laminated on the resist can be developed with an aqueous alkali solution, and the separation of the dry film resist with an aqueous alkali solution can be carried out. Therefore, the necessity of using of an organic solvent, which poses a problem of waste, can be eliminated.

The invention claimed is:

1. A process for producing an electronic component, comprising the steps of:
   providing (A) a laminate of a conductive inorganic material later, an insulating layer, and a conductive inorganic material layer, or (B) a laminate of a conductive inorganic material later and an insulating layer;
   wet etching the conductive inorganic material layer in the laminate thereby patterning the conductive inorganic material layer;
   laminating a dry film resist onto said laminate in which the conductive inorganic material layer has been patterned;
   patterning the dry film resist, the dry film resist being developable with an aqueous solution and being able to be separated by the aqueous solution;
   treating the thus patterned dry film resist with ultraviolet light irradiation and/or heat thereby improving the resistance of the dry film resist to the etchant for the insulating layer; and
   wet etching the insulating layer through the patterned dry film resist by an aqueous basic solution.

2. The process for producing an electronic component according to claim 1, wherein the surface of the dry film resist has fine concaves and convexes.

3. The process for producing an electronic component according to claim 1, wherein the insulating layer is patterned by the wet etching in such a manner that a dry film resist is laminated under reduced pressure onto the laminate in which the conductive inorganic material layer has been patterned, followed by wet etching of the laminate of the dry film resist.

4. The process for producing an electronic component according to claim 1, wherein the laminate of the dry film resist is wet etched by a method wherein, after the laminate of the dry film resist is exposed and developed to perform patterning, in order to improve the resistance of the dry film resist to the etchant for the insulating layer, treatment selected from ultraviolet light irradiation, heat treatment, and a combination of ultraviolet light irradiation with heat treatment is carried out.

5. The process for producing an electronic component according to claim 1, wherein the insulating layer in the laminate as the starting material has a thickness of 3 to 500 μm.

6. The process for producing an electronic component according to claim 1, wherein the thickness of the dry film resist is 1.1 to 5 times that of one conductive inorganic material layer in the laminate as the starting material.

7. The process for producing an electronic component according to claim 1, wherein the time necessary for wet etching of the insulating layer is not less than 10 sec and not more than 30 min.

8. The process for producing an electronic component according to claim 1, wherein the temperature in the wet etching of the insulating layer is not less than 10° C. and not more than 120° C.

9. The process for producing an electronic component according to claim 1, wherein the single-layer structure or all the two or more insulation unit layers in the insulating layer are formed of an organic material.

10. The process for producing an electronic component according to claim 1, wherein the single-layer structure or at least one layer in the two or more insulation unit layers in the insulating layer is formed of a polyimide resin.

11. The process for producing an electronic component according to claim 1, wherein the single-layer structure or at least one layer in the two or more insulation unit layers in the insulating layer is formed of an inorganic material.

12. The process for producing an electronic component according to claim 1, wherein the single-layer structure or at least one layer in the two or more insulation unit layers in the insulating layer is formed of a composite composed of an organic material and an inorganic material.

13. The process for producing an electronic component according to claim 1, wherein the single-layer structure or all the two or more insulation unit layers in the insulating layer are formed of a polyimide resin.

14. The process for producing an electronic component according to claim 1, wherein the single-layer structure or at least one layer in the two or more insulation unit layers in the insulating layer is formed of a low-expansion polyimide having a coefficient of linear thermal expansion of not more than 30 ppm.

15. The process for producing an electronic component according to claim 1, wherein the etching liquid used for etching the insulating layer has a pH value of more than 9.

16. The process for producing an electronic component according to claim 1, wherein the single conductive inorganic material layer or both the two conductive inorganic material layers in the laminate are formed of copper or surface treated copper.

17. The process for producing an electronic component according to claim 1, wherein the single conductive inorganic material layer or both the two conductive inorganic material layers in the laminate are formed of copper alloy or surface treated copper alloy.

18. The process for producing an electronic component according to claim 1, wherein the single conductive inorganic material layer or both the two conductive inorganic material layers in the laminate are formed of stainless steel or surface treated stainless steel.

19. The process for producing an electronic component according to claim 1, wherein one of the two conductive inorganic material layers in the laminate is formed of stainless steel or surface treated stainless steel and the other is formed of copper alloy or surface treated copper alloy.

20. The process for producing an electronic component according to claim 1, wherein one of the two conductive inorganic material layers in the laminate is formed of stainless steel or surface treated stainless steel and the other is formed of copper or surface treated copper.

21. An electronic component produced by the process for producing an electronic component according to claim 1.

22. A suspension for a hard disk drive, produced by the process for producing an electronic component according to claim 1.

23. The process for producing an electronic component according to claim 2, wherein the fine concaves and convexes are provided by embossing.

24. The process for producing an electronic component according to claim 14, wherein the insulating layer has a layer construction of adhesive polyimide—low-expansion polyimide—adhesive polyimide.

25. The process for producing an electronic component according to claim 24, wherein, in the insulating layer having a layer construction of adhesive polyimide—low-expansion polyimide—adhesive polyimide, the two adhesive polyimides are different from each other in composition.

26. A process for producing an electronic component, comprising the steps of:

providing (A) a laminate of a laminate of a conductive inorganic material layer, an insulating layer, and a conductive inorganic material layer, or (B) a laminate of a conductive inorganic material layer and an insulating layer;

wet etching the conductive inorganic material layer in the laminate, thereby patterning the conductive inorganic material layer;

laminating a dry film resist onto said laminate in which the conductive inorganic material layer has been patterned;

patterning the dry film resist, the dry film resist being developable with an aqueous solution and being able to be separated by the aqueous solution;

treating the thus patterned dry film resist with ultraviolet light irradiation and/or heat thereby improving the resistance of the dry film resist to the etchant for the insulating layer; and wet etching the insulating layer through the patterned dry film resist by an aqueous basic solution, wherein a thickness of the dry film resist is not less than 1.1 times that of one conductive inorganic material layer in the laminate, and when the material to be etched is dipped in an etching liquid held at 70° C., a holding time of the dry film resist pattern is not less than one min.

27. The process for producing an electronic component according to claim 26, wherein at least one side of the dry film resist has fine concaves and convexes.

28. The process for producing an electronic component according to claim 26, wherein the insulating layer in the laminate is wet etched at a temperature of 10 to 120° C.

29. The process for producing an electronic component according to claim 26, wherein the etching liquid used for wet etching the insulating layer in the laminate has a pH value of more than 8.

30. The process for producing an electronic component according to claim 26, wherein the lamination of the dry film onto the laminate followed by wet etching is carried out by a method wherein, after the laminate of the dry film is exposed and developed to perform patterning, in order to improve the resistance of the dry film resist to the etchant for the insulating layer, treatment selected from ultraviolet light irradiation, heat treatment, and a combination of ultraviolet light irradiation with heat treatment is carried out.

31. The process for producing an electronic component according to claim 26, wherein the whole of one or more layers constituting the insulating layer in the laminate is formed of an organic material.

32. The process for producing an electronic component according to claim 26, wherein at least one layer constituting the insulating layer in the laminate is formed of a composite composed of an organic material and an inorganic material.

33. The process for producing an electronic component according to claim 26, wherein at least one layer constituting the insulating layer in the laminate is formed of a polyimide resin.

34. The process for producing an electronic component according to claim 26, wherein the whole of one or more layers constituting the insulating layer in the laminate is formed of a polyimide resin.

35. The process for producing an electronic component according to claim 26, wherein at least one layer constituting the insulating layer in the laminate is a low-expansion polyimide having a coefficient of linear expansion of not more than 30 ppm.

36. The process for producing an electronic component according to claim 26, wherein the insulating layer in the laminate has a layer construction of adhesive polyimide—low-expansion polyimide—adhesive polyimide.

37. The process for producing an electronic component according to claim 26, wherein the whole of one or two conductive inorganic material layers in the laminate is formed of copper or surface treated copper.

38. The process for producing an electronic component according to claim 26, wherein the whole of one or two conductive inorganic material layers in the laminate is formed of copper alloy or surface treated copper alloy.

39. The process for producing an electronic component according to claim 26, wherein the whole of one or two conductive inorganic material layers in the laminate is formed of stainless steel or surface treated stainless steel.

40. The process for producing an electronic component according to claim 26, wherein one of the two conductive inorganic material layers in the laminate is formed of stainless steel or surface treated stainless steel and the other is formed of copper alloy or surface treated copper alloy.

41. The process for producing an electronic component according to claim 26, wherein one of the two conductive inorganic material layers in the laminate is formed of stainless steel or surface treated stainless steel and the other is formed of copper or surface treated copper.

42. An electronic component produced by the process for producing an electronic component according to claim 26.

43. A suspension for a hard disk drive, produced by the process for producing an electronic component according to claim 26.

44. The process for producing an electronic component according to claim 27, wherein the fine concaves and convexes are formed by embossing.

45. The process for producing an electronic component according to claim 34, wherein, in the insulating layer having a layer construction of adhesive polyimide—low-expansion polyimide—adhesive polyimide, the two adhesive polyimides are different from each other in composition.

* * * * *